US008852696B2

(12) United States Patent
He et al.

(10) Patent No.: US 8,852,696 B2
(45) Date of Patent: Oct. 7, 2014

(54) METHOD FOR VAPOR DEPOSITION

(75) Inventors: Gang He, Cupertino, CA (US); Gregg Higashi, San Jose, CA (US); Khurshed Sorabji, San Jose, CA (US); Roger Hamamjy, San Jose, CA (US); Andreas Hegedus, Burlingame, CA (US)

(73) Assignee: Alta Devices, Inc., Sunnyvale, CA (US)

( * ) Notice: Subject to any disclaimer, the term of this patent is extended or adjusted under 35 U.S.C. 154(b) by 1093 days.

(21) Appl. No.: 12/725,296

(22) Filed: Mar. 16, 2010

(65) Prior Publication Data
US 2010/0209620 A1    Aug. 19, 2010

Related U.S. Application Data

(63) Continuation-in-part of application No. 12/475,131, filed on May 29, 2009, and a continuation-in-part of application No. 12/475,169, filed on May 29, 2009.

(60) Provisional application No. 61/160,690, filed on Mar. 16, 2009, provisional application No. 61/160,694, filed on Mar. 16, 2009, provisional application No. 61/160,696, filed on Mar. 16, 2009, provisional application No. 61/160,699, filed on Mar. 16, 2009, provisional application No. 61/160,700, filed on Mar. 16, 2009, provisional application No. 61/160,701, filed on Mar. 16, 2009, provisional application No. 61/160,703, filed on Mar. 16, 2009, provisional application No. 61/057,788, filed on May 30, 2008, provisional application No. 61/104,284, filed on Oct. 10, 2008, provisional application No. 61/122,591, filed on Dec. 15, 2008.

(51) Int. Cl.
| C23C 16/00 | (2006.01) |
| C30B 25/12 | (2006.01) |
| H01L 21/677 | (2006.01) |
| C30B 29/40 | (2006.01) |
| C23C 16/54 | (2006.01) |
| C30B 29/42 | (2006.01) |
| C30B 25/02 | (2006.01) |
| H01L 21/67 | (2006.01) |
| C23C 16/48 | (2006.01) |
| C23C 16/455 | (2006.01) |
| C23C 16/458 | (2006.01) |
| C23C 16/44 | (2006.01) |

(52) U.S. Cl.
CPC ............ C23C 16/4583 (2013.01); C30B 25/12 (2013.01); H01L 21/67784 (2013.01); C30B 29/40 (2013.01); C23C 16/54 (2013.01); C30B 29/42 (2013.01); C30B 25/025 (2013.01); H01L 21/67115 (2013.01); C23C 16/481 (2013.01); C23C 16/45519 (2013.01); C23C 16/45565 (2013.01); C23C 16/4412 (2013.01)
USPC .................... 427/557; 427/248.1; 427/255.23

(58) Field of Classification Search
USPC ................................. 427/557, 248.1, 255.23
See application file for complete search history.

(56) References Cited

U.S. PATENT DOCUMENTS

| 4,316,430 A | 2/1982 | Jolly et al. |
| 4,993,358 A | 2/1991 | Mahawili |
| 5,059,770 A | 10/1991 | Mahawili |
| 5,122,391 A | 6/1992 | Mayer |
| 5,138,973 A * | 8/1992 | Davis et al. ............ 118/723 MP |
| 5,304,398 A | 4/1994 | Krusell et al. |
| 5,626,677 A | 5/1997 | Shirahata |
| 5,792,272 A | 8/1998 | van Os et al. |
| 6,001,267 A | 12/1999 | Os et al. |
| 6,143,080 A | 11/2000 | Bartholomew et al. |
| 8,008,174 B2 | 8/2011 | He et al. |
| 2003/0101938 A1* | 6/2003 | Ronsse et al. .................. 118/726 |
| 2004/0011281 A1* | 1/2004 | Nakamura ..................... 117/101 |
| 2004/0244686 A1 | 12/2004 | Cho et al. |
| 2005/0109275 A1* | 5/2005 | Wood ............................. 118/715 |
| 2005/0178336 A1* | 8/2005 | Liu ................................ 118/728 |
| 2006/0249077 A1 | 11/2006 | Kim et al. |
| 2007/0092732 A1 | 4/2007 | Rose et al. |
| 2009/0110805 A1* | 4/2009 | Kaeppeler et al. ................. 427/8 |
| 2009/0324379 A1 | 12/2009 | He et al. |
| 2009/0325367 A1 | 12/2009 | He et al. |
| 2010/0092668 A1 | 4/2010 | Hegedus |
| 2010/0206229 A1 | 8/2010 | He et al. |

(Continued)

FOREIGN PATENT DOCUMENTS

| JP | 2004055595 A | 2/2004 |
| JP | 2007-231361 | 9/2007 |

(Continued)

OTHER PUBLICATIONS

PCT International Search Report and Written Opinion dated May 20, 2010 for International Application No. PCT/US2009/060260, no page numbers.

(Continued)

Primary Examiner — Bret Chen
(74) Attorney, Agent, or Firm — Thomas Schneck; Gina McCarthy

(57) ABSTRACT

Chemical vapor deposition (CVD) processes include, in one embodiment, a method for processing a wafer within a vapor deposition reactor comprising heating at least one wafer disposed on a wafer carrier by exposing a lower surface of the wafer carrier to radiation emitted from a lamp assembly and flowing a liquid through a passageway extending throughout the reactor to maintain the reactor lid assembly at a predetermined temperature, such as within a range from about 275° C. to about 325° C. The method further includes traversing the wafer carrier along a wafer carrier track through at least a chamber containing a showerhead assembly and an isolator assembly and another chamber containing a showerhead assembly and an exhaust assembly, and removing gases from the reactor through the exhaust assembly.

20 Claims, 38 Drawing Sheets

(56) References Cited

U.S. PATENT DOCUMENTS

| | | |
|---|---|---|
| 2010/0206235 A1 | 8/2010 | He et al. |
| 2010/0209082 A1 | 8/2010 | He et al. |
| 2010/0209620 A1 | 8/2010 | He et al. |
| 2010/0209626 A1 | 8/2010 | He et al. |
| 2010/0212591 A1 | 8/2010 | He et al. |
| 2010/0229793 A1 | 9/2010 | He et al. |
| 2011/0268880 A1 | 11/2011 | Bour |

FOREIGN PATENT DOCUMENTS

| | | |
|---|---|---|
| JP | 2007231361 A | 9/2007 |
| KR | 100220444 B1 | 9/1999 |
| WO | WO 2007/122147 * | 11/2007 |
| WO | WO2010107835 A2 | 9/2010 |
| WO | WO2010107837 A2 | 9/2010 |
| WO | WO2010107843 A2 | 9/2010 |
| WO | WO2010108839 A2 | 9/2010 |

OTHER PUBLICATIONS

PCT Int'l Search Report and Written Opinion for Int'l Application No. PCT/US2009/045709 dated Jan. 12, 2010, no page numbers.

PCT In'tl Search Report and Written Opinion for Int'l Application No. PCT/US2009/060260, no page numbers.

* cited by examiner

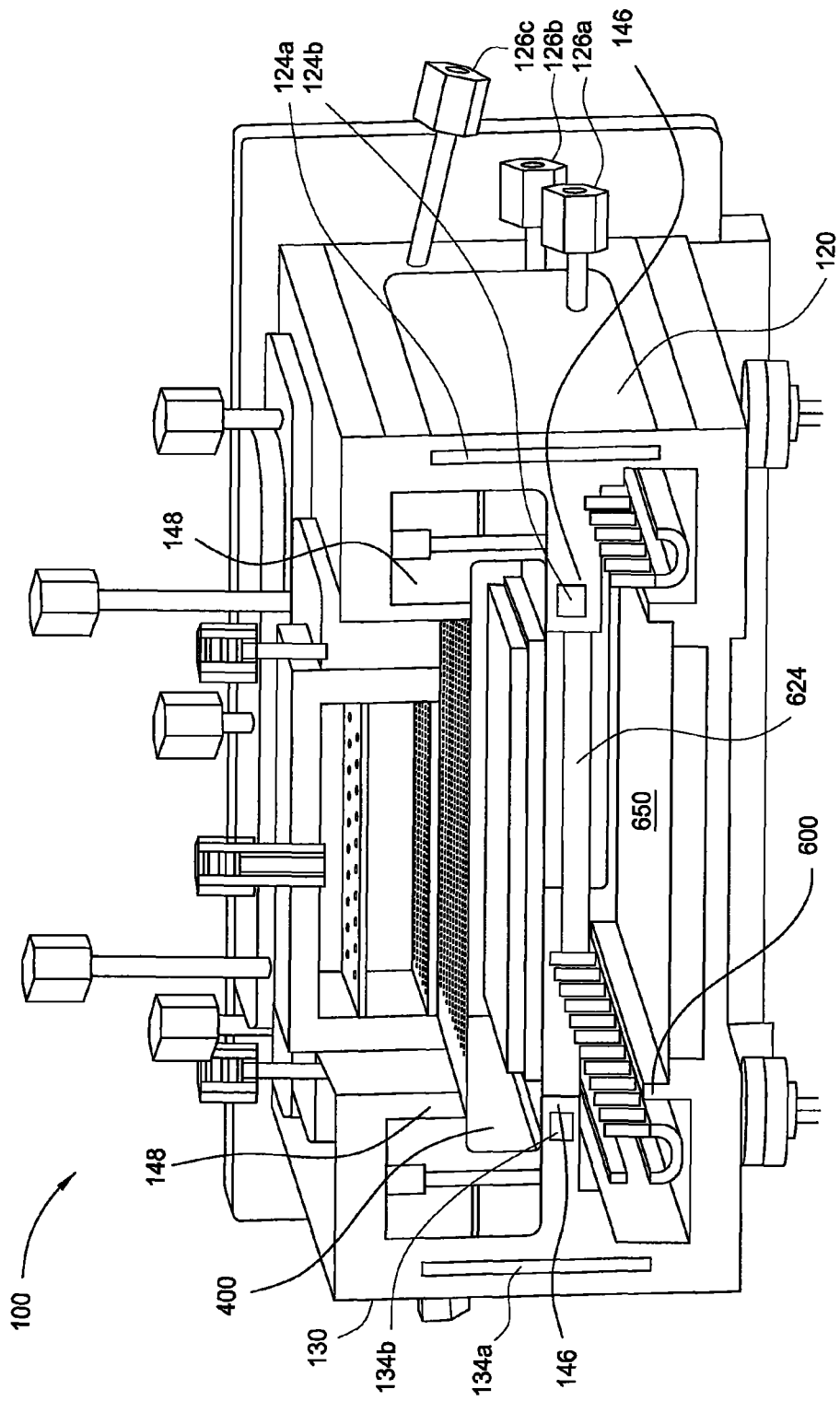

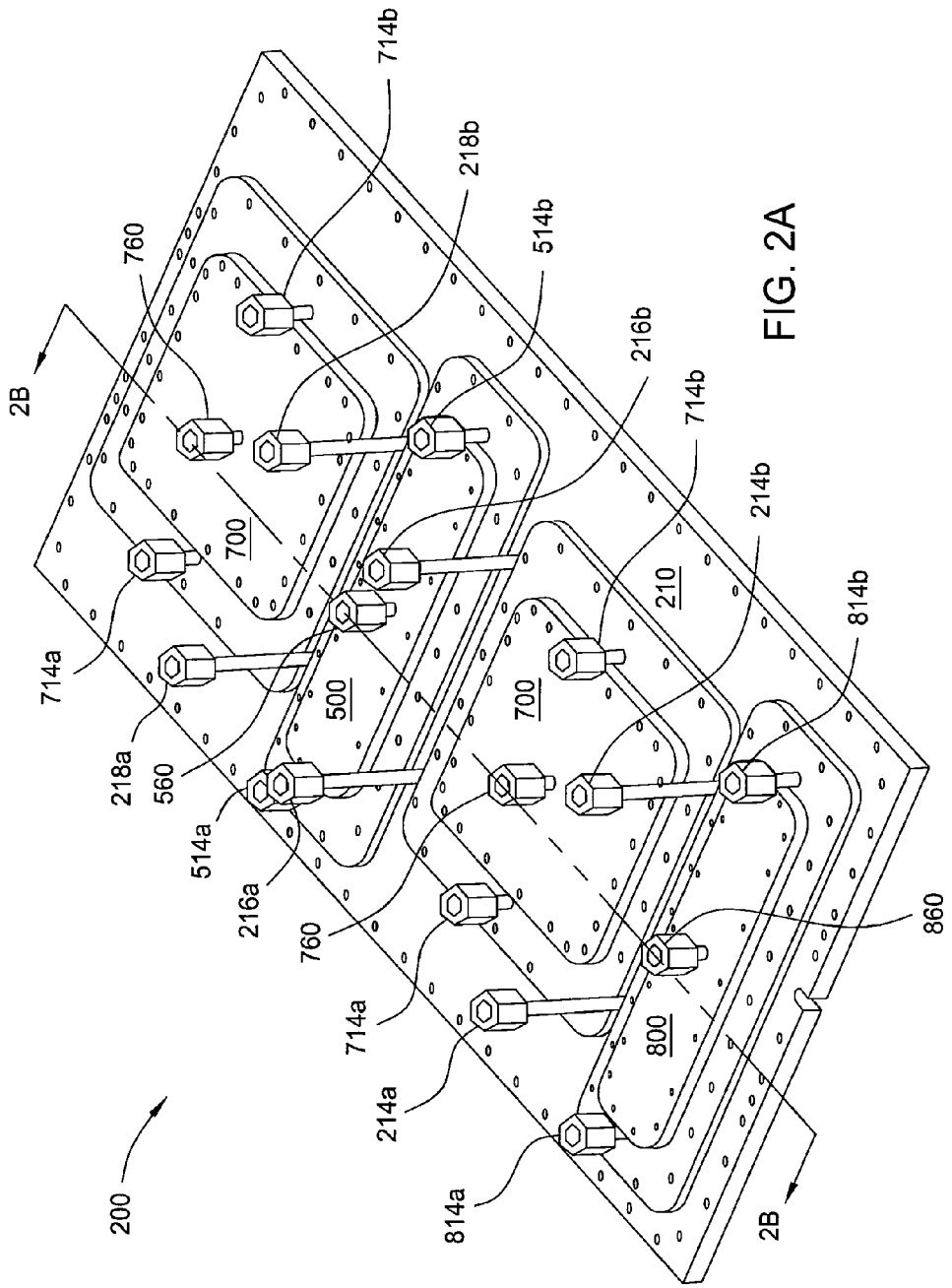

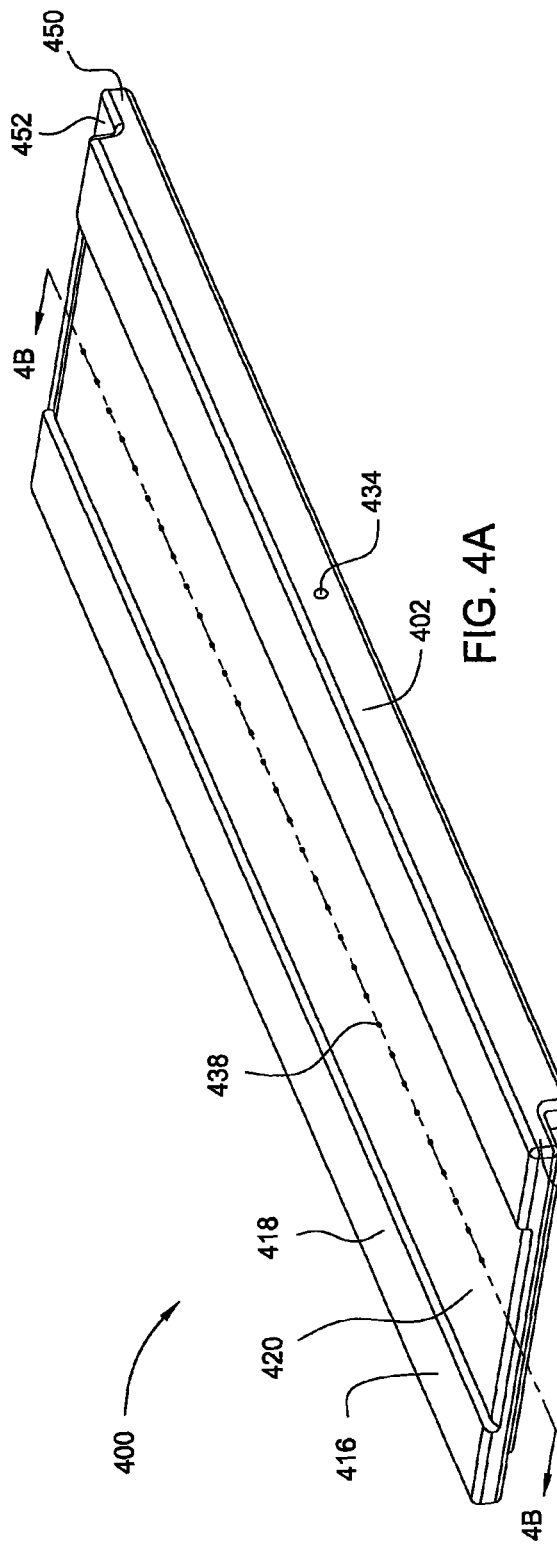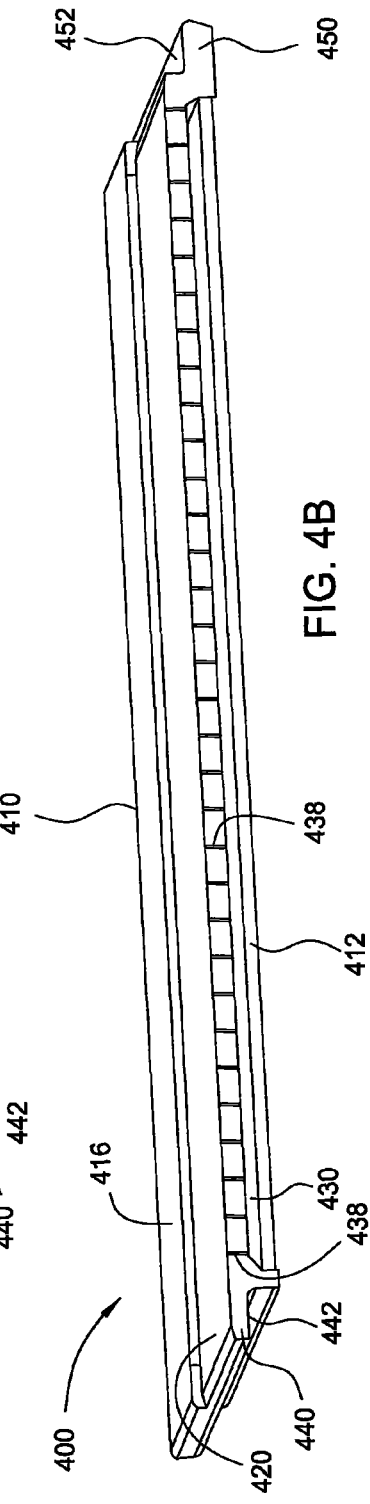
FIG. 4A
FIG. 4B

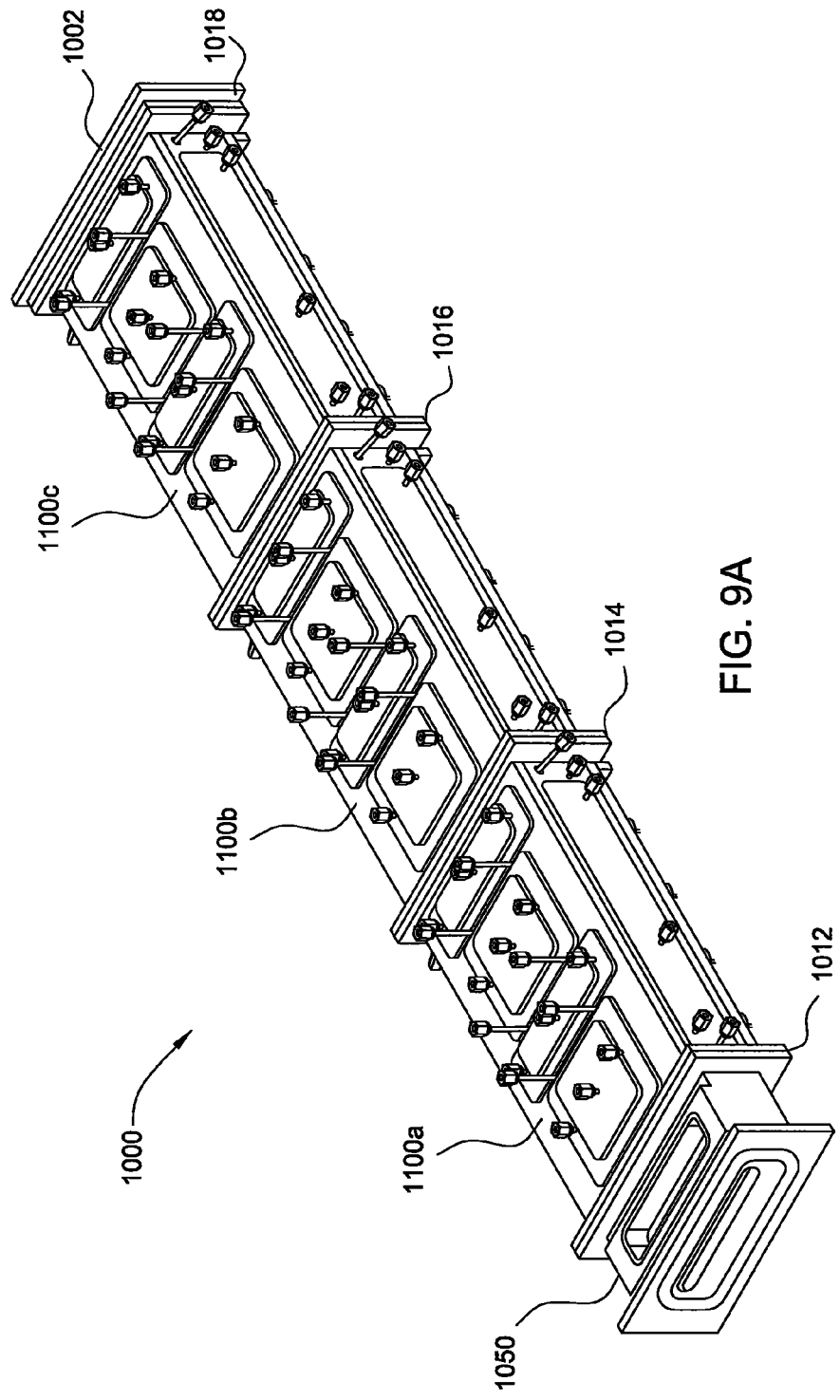

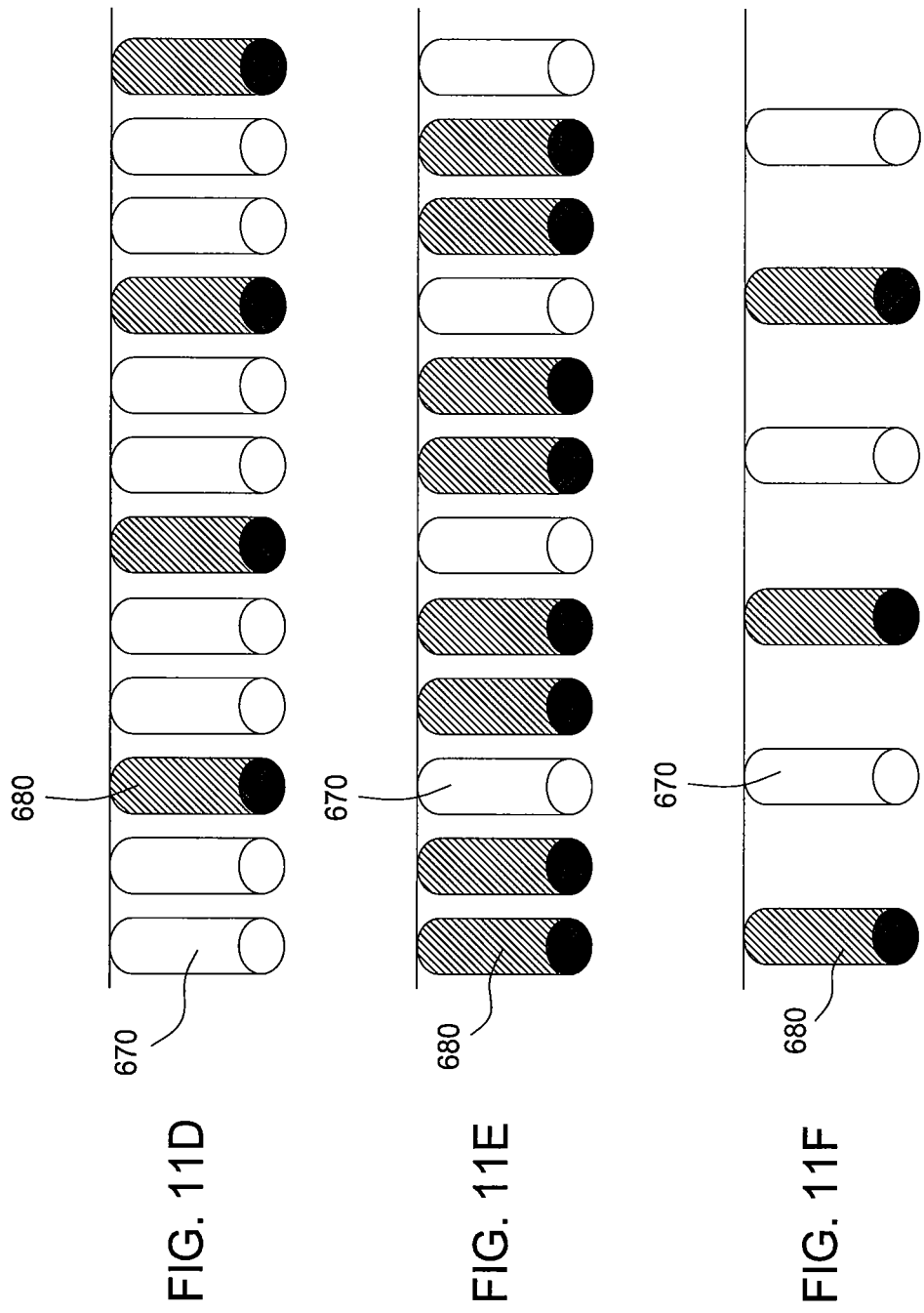

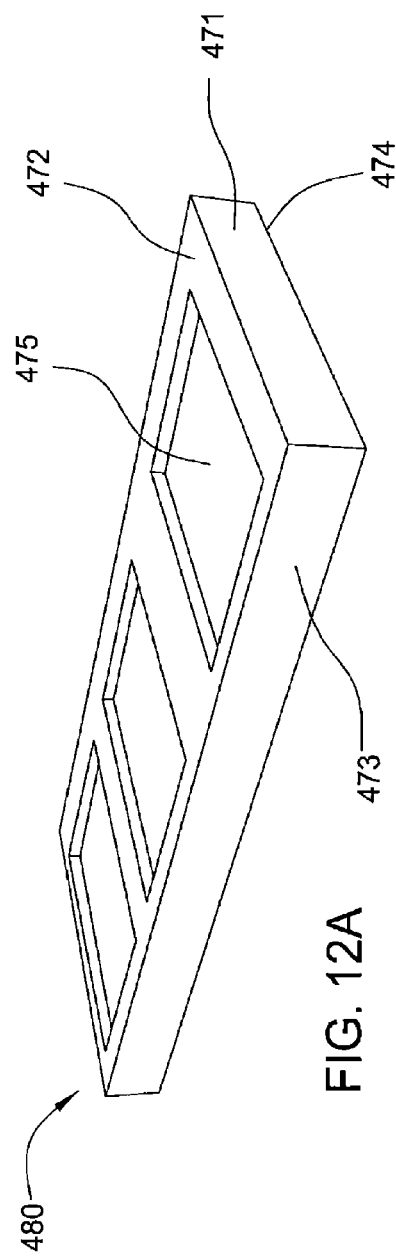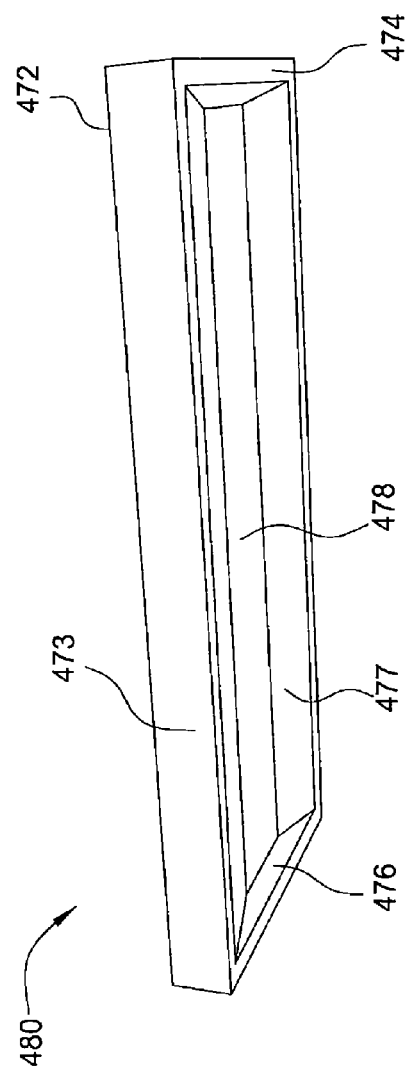
FIG. 12A
FIG. 12B

METHOD FOR VAPOR DEPOSITION

CROSS-REFERENCE TO RELATED APPLICATIONS

This application claims benefit of U.S. Provisional Application Nos. 61/160,690, 61/160,694, 61/160,696, 61/160,699, 61/160,700, 61/160,701, and 61/160,703, all of which were filed Mar. 16, 2009, and all of which are hereby incorporated by reference in their entirety.

This application is also a continuation-in-part of U.S. application Ser. Nos. 12/475,131, and 12/475,169, both filed May 29, 2009, and both claim benefit of U.S. Provisional Application No. 61/057,788, filed May 30, 2008, U.S. Provisional Application No. 61/104,284, filed Oct. 10, 2008, and U.S. Provisional Application No. 61/122,591, filed Dec. 15, 2008, and all of which are hereby incorporated by reference in their entirety.

BACKGROUND OF THE INVENTION

1. Field of the Invention

Embodiments of the invention generally relate to apparatuses and methods for vapor deposition, and more particularly, to chemical vapor deposition systems, reactors, and processes thereof.

2. Description of the Related Art

Photovoltaic or solar devices, semiconductor devices, or other electronic devices are usually manufactured by utilizing a variety of fabrication processes to manipulate the surface of a substrate. These fabrication processes may include deposition, annealing, etching, doping, oxidation, nitridation, and many other processes. Epitaxial lift off (ELO) is a less common technique for fabricating thin film devices and materials in which layers of materials are deposited to and then removed from a growth substrate. An epitaxial layer, film, or material is grown or deposited on a sacrificial layer which is disposed on the growth substrate, such as a gallium arsenide wafer, by a chemical vapor deposition (CVD) process or a metallic-organic CVD (MOCVD) process. Subsequently, the sacrificial layer is selectively etched away in a wet acid bath, while the epitaxial material is separated from the growth substrate during the ELO etch process. The isolated epitaxial material may be a thin layer or film which is usually referred to as the ELO film or the epitaxial film. Each epitaxial film generally contains numerous layers of varying compositions relative to the specific device, such as photovoltaic or solar devices, semiconductor devices, or other electronic devices.

The CVD process includes growing or depositing the epitaxial film by the reaction of vapor phase chemical precursors. During a MOCVD process, at least one of the chemical precursors is a metallic-organic compound—that is—a compound having a metal atom and at least one ligand containing an organic fragment.

There are numerous types of CVD reactors for very different applications. For example, CVD reactors include single or bulk wafer reactors, atmospheric and low pressure reactors, ambient temperature and high temperature reactors, as well as plasma enhanced reactors. These distinct designs address a variety of challenges that are encountered during a CVD process, such as depletion effects, contamination issues, reactor maintenance, throughput, and production costs.

Therefore, there is a need for CVD systems, reactors, and processes to grow epitaxial films and materials on substrates more effectively with less contamination, higher throughput, and less expensive than by currently known CVD equipment and processes.

SUMMARY OF THE INVENTION

Embodiments of the invention generally relate to apparatuses and methods for chemical vapor deposition (CVD) processes. In one embodiment, a method for processing a wafer within a vapor deposition reactor is provided which includes heating at least one wafer disposed on a wafer carrier to a predetermined temperature by exposing a lower surface of a wafer carrier track to radiation emitted from a lamp assembly, wherein the wafer carrier is disposed on the wafer carrier track within a vapor deposition reactor. The method further includes traversing the wafer carrier along the wafer carrier track through a first chamber having a first showerhead assembly and an isolator assembly, exposing the wafer to a first mixture of gaseous precursors flowing from the first showerhead while depositing a first material, exposing the wafer to a process gas (e.g., arsine gas) flowing from the isolator assembly, traversing the wafer carrier along the wafer carrier track through a second chamber having a second showerhead assembly and an exhaust assembly, exposing the wafer to a second mixture of gaseous precursors flowing from the second showerhead while depositing a second material, and removing gases from the vapor deposition reactor through the exhaust assembly. In some examples, the predetermined temperature is within a range from about 250° C. to about 350° C., preferably, from about 275° C. to about 325° C., preferably, from about 290° C. to about 310° C., such as about 300° C.

In another example, a method for processing a wafer within a vapor deposition reactor is provided which includes flowing a levitating gas into a cavity within a wafer carrier track and out from a plurality of holes disposed on an upper surface of the wafer carrier track within a vapor deposition reactor and levitating a wafer carrier from the wafer carrier track by exposing a lower surface of the wafer carrier to the levitating gas flowing from the holes, wherein an upper surface of the wafer carrier has at least one wafer, preferably, a plurality of wafers. The method further includes heating the wafer and the wafer carrier to a predetermined temperature by exposing a lower surface of the wafer carrier track to radiation emitted from a lamp assembly, and traversing the wafer carrier along the wafer carrier track through at least two chambers, wherein a first chamber contains a first showerhead assembly and an isolator assembly and a second chamber contains a second showerhead assembly and an exhaust assembly.

In another embodiment, a method for processing a wafer within a vapor deposition reactor is provided which includes levitating a wafer carrier from a wafer carrier track by exposing a lower surface of the wafer carrier to a levitating gas flowing from a plurality of holes disposed on an upper surface of the wafer carrier track within a vapor deposition reactor, wherein an upper surface of the wafer carrier has at least one wafer, and heating the wafer and the wafer carrier to a predetermined temperature by exposing a lower surface of the wafer carrier track to radiation emitted from a lamp assembly. The method further includes traversing the wafer carrier along the wafer carrier track through a first chamber having a first showerhead assembly and an isolator assembly, exposing the wafer to a first precursor (e.g., gallium precursor or other Group III precursor) and a second precursor (e.g., arsenic precursor or other Group V precursor) flowing from the first showerhead, exposing the wafer to a process gas (e.g., arsine gas) flowing from the isolator assembly, traversing the wafer carrier along the wafer carrier track through a second chamber having a second showerhead assembly and an exhaust assembly, exposing the wafer to a mixture of gaseous precursors flowing from the second showerhead, and removing gases from the vapor deposition reactor through the exhaust assembly.

The process gas may contain arsine, argon, helium, nitrogen, hydrogen, or mixtures thereof. In one example, the process gas contains an arsenic precursor, such as arsine. In other embodiments, the first precursor may contain an aluminum precursor, a gallium precursor, an indium precursor, or combinations thereof, and the second precursor may contain a nitrogen precursor, a phosphorus precursor, an arsenic precursor, an antimony precursor, or mixtures thereof.

In another example, a method for processing a wafer within a vapor deposition reactor is provided which includes heating at least one wafer disposed on a wafer carrier by exposing a lower surface of a wafer carrier track to radiation emitted from a lamp assembly, wherein the wafer carrier is disposed on the wafer carrier track within a vapor deposition reactor, and flowing a liquid through a passageway extending throughout a reactor lid assembly of the vapor deposition reactor to maintain the reactor lid assembly at a predetermined temperature, wherein the liquid and the passageway are in fluid communication with a temperature regulation system.

In another embodiment, a method for processing a wafer within a vapor deposition reactor is provided which includes heating at least one wafer disposed on a wafer carrier by exposing a lower surface of a wafer carrier track to radiation emitted from a lamp assembly, wherein the wafer carrier is disposed on the wafer carrier track within a vapor deposition reactor, flowing a liquid through a passageway extending throughout a reactor lid assembly of the vapor deposition reactor to maintain the reactor lid assembly at a predetermined temperature, wherein the liquid and the passageway are in fluid communication with a temperature regulation system, traversing the wafer carrier along the wafer carrier track through at least two chambers, wherein a first chamber contains a first showerhead assembly and an isolator assembly and a second chamber contains a second showerhead assembly and an exhaust assembly, and removing gases from the vapor deposition reactor through the exhaust assembly.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A-1E depict a CVD reactor according to embodiments described herein;

FIGS. 2A-2C depict a reactor lid assembly according to embodiments described herein;

FIGS. 4A-4E depict a wafer carrier track according to embodiments described herein;

FIGS. 9A-9F depict a CVD system containing multiple CVD reactors according to embodiments described herein;

FIGS. 11A-11F depict a plurality of lamps according to other embodiments described herein;

FIGS. 12A-12B depict a levitating substrate carrier according to another embodiment described herein.

DETAILED DESCRIPTION

Embodiments of the invention generally relate to an apparatus and methods of chemical vapor deposition (CVD), such as metallic-organic CVD (MOCVD) processes. As set forth herein, embodiments of the invention are described as they relate to an atmospheric pressure CVD reactor and metal-organic precursor gases. It is to be noted, however, that aspects of the invention are not limited to use with an atmospheric pressure CVD reactor or metal-organic precursor gases, but are applicable to other types of reactor systems and precursor gases. To better understand the novelty of the apparatuses of the invention and the methods of use thereof, reference is hereafter made to the accompanying drawings.

According to one embodiment of the invention, an atmospheric pressure CVD reactor is provided. The CVD reactor may be used to provide multiple epitaxial layers on a substrate, such as a gallium arsenide substrate. These epitaxial layers may include aluminum gallium arsenide, gallium arsenide, and phosphorous gallium arsenide. These epitaxial layers may be grown on the gallium arsenide substrate for later removal so that the substrate may be reused to generate additional materials. In one embodiment, the CVD reactor may be used to provide solar cells. These solar cells may further include single junction, hetero-junction, or other configurations. In one embodiment, the CVD reactor may be configured to develop a 2.5 watt wafer on a 10 centimeter by 10 centimeter substrate. In one embodiment, the CVD reactor may provide a throughput range of about 1 substrate per minute to about 10 substrates per minute.

FIGS. 1A-1E depict reactor 100, a CVD reactor or chamber, as described in an embodiment described herein. Reactor 100 contains reactor lid assembly 200 disposed on reactor body assembly 102. Reactor lid assembly 200 and components thereof are further illustrated in FIGS. 2A-2D and reactor body assembly 102 is further illustrated in FIG. 3.

Figure 1A:
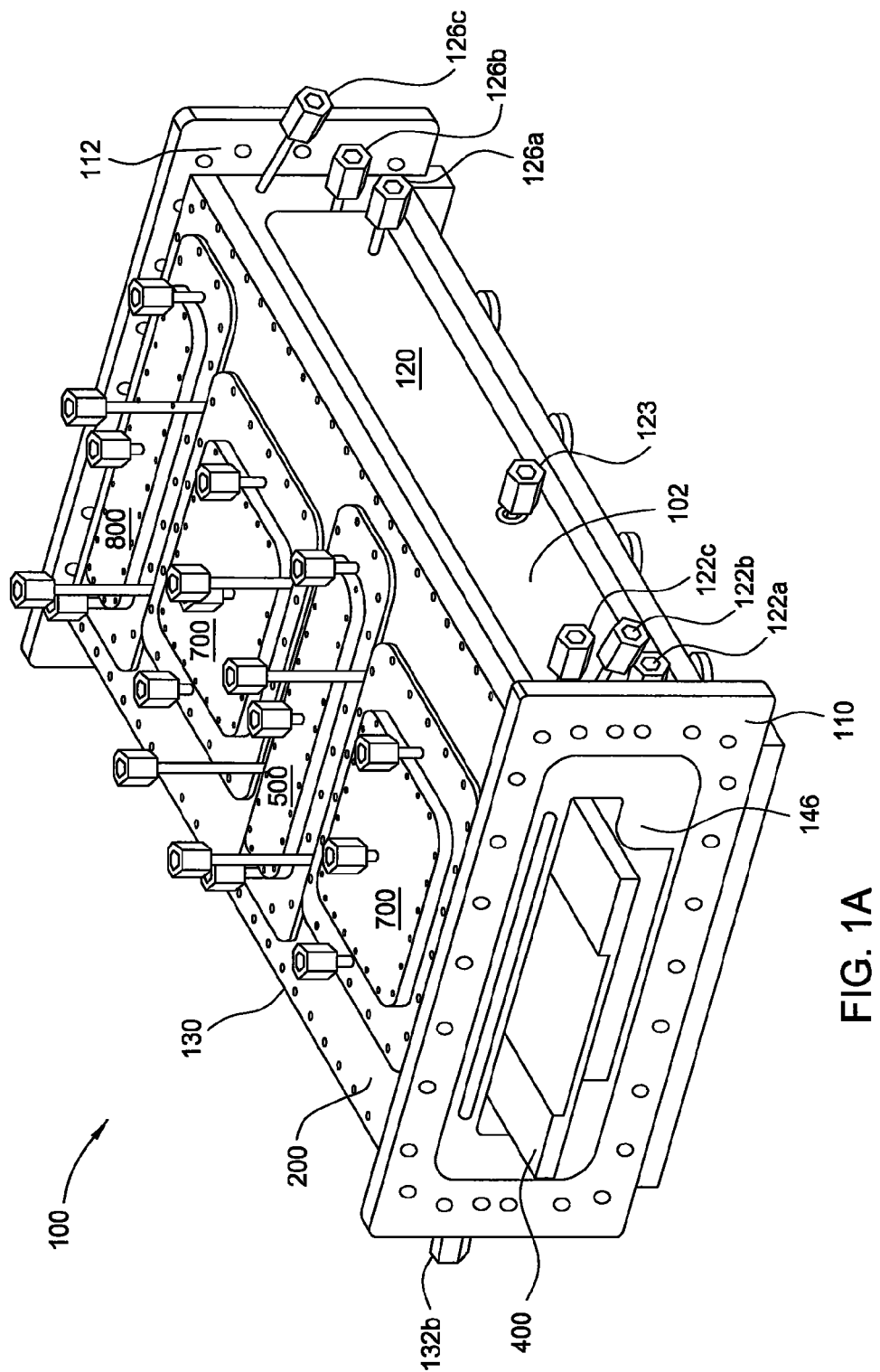
Figure 1B:
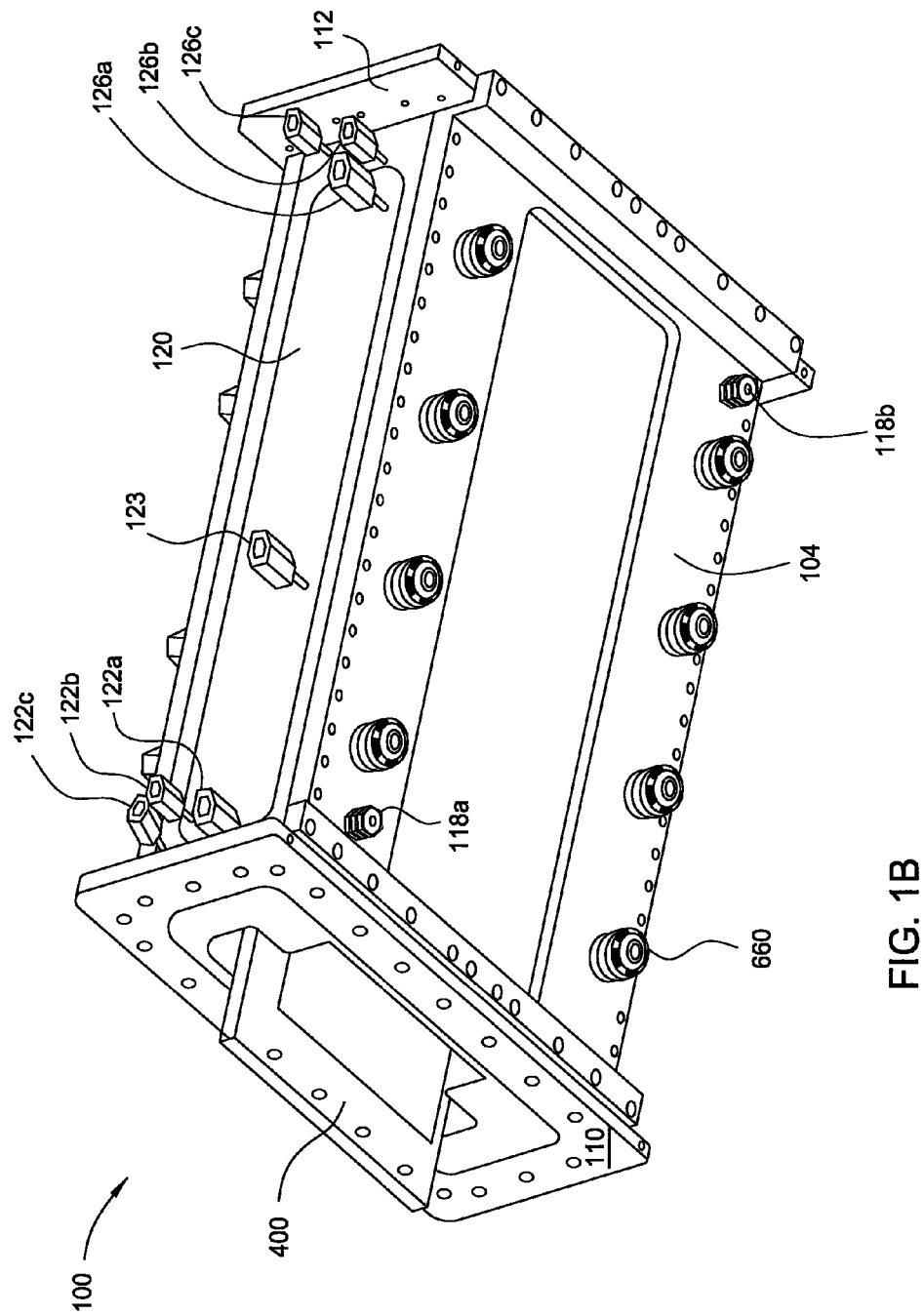
Figure 1C:
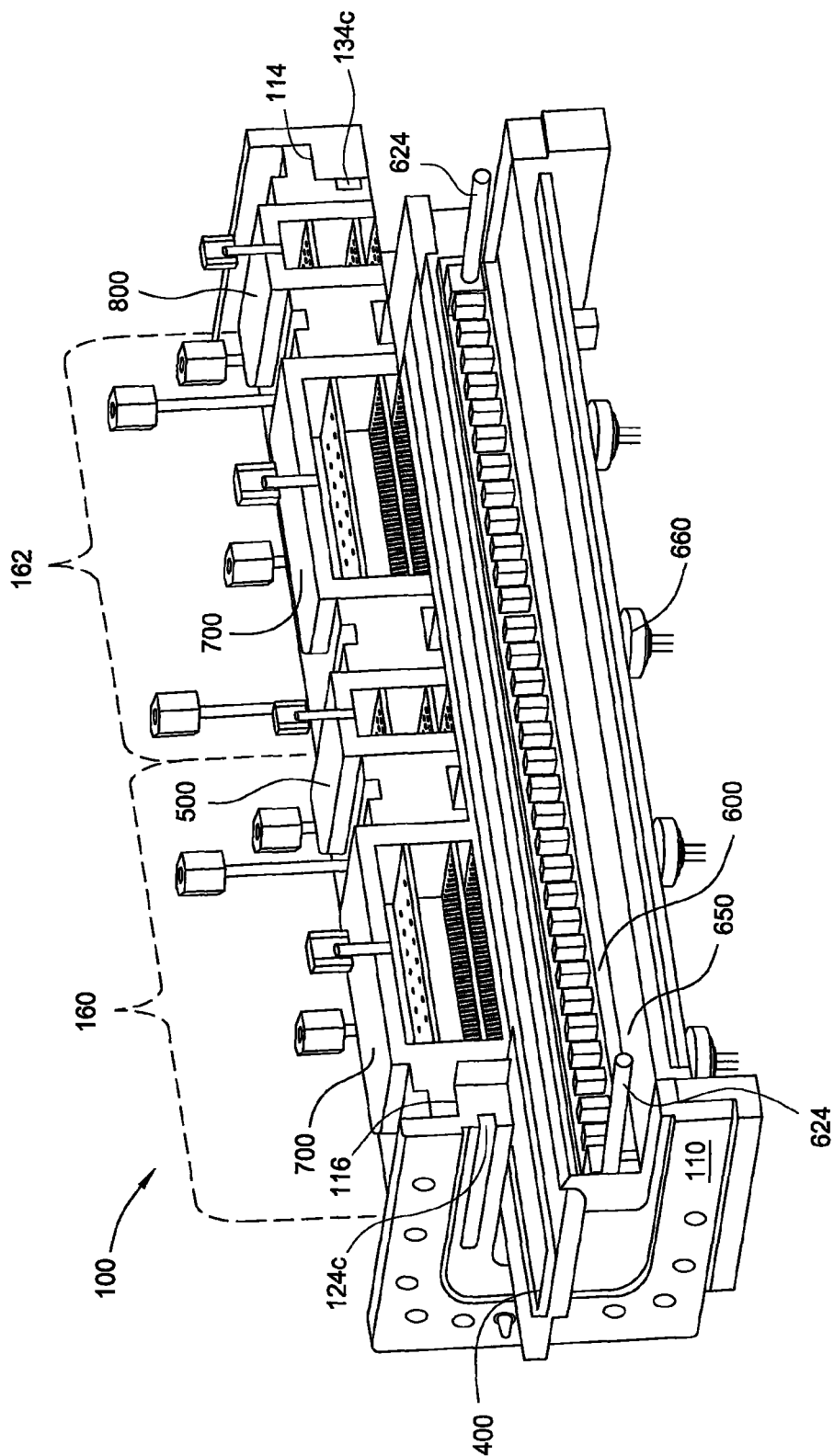
Figure 1E:
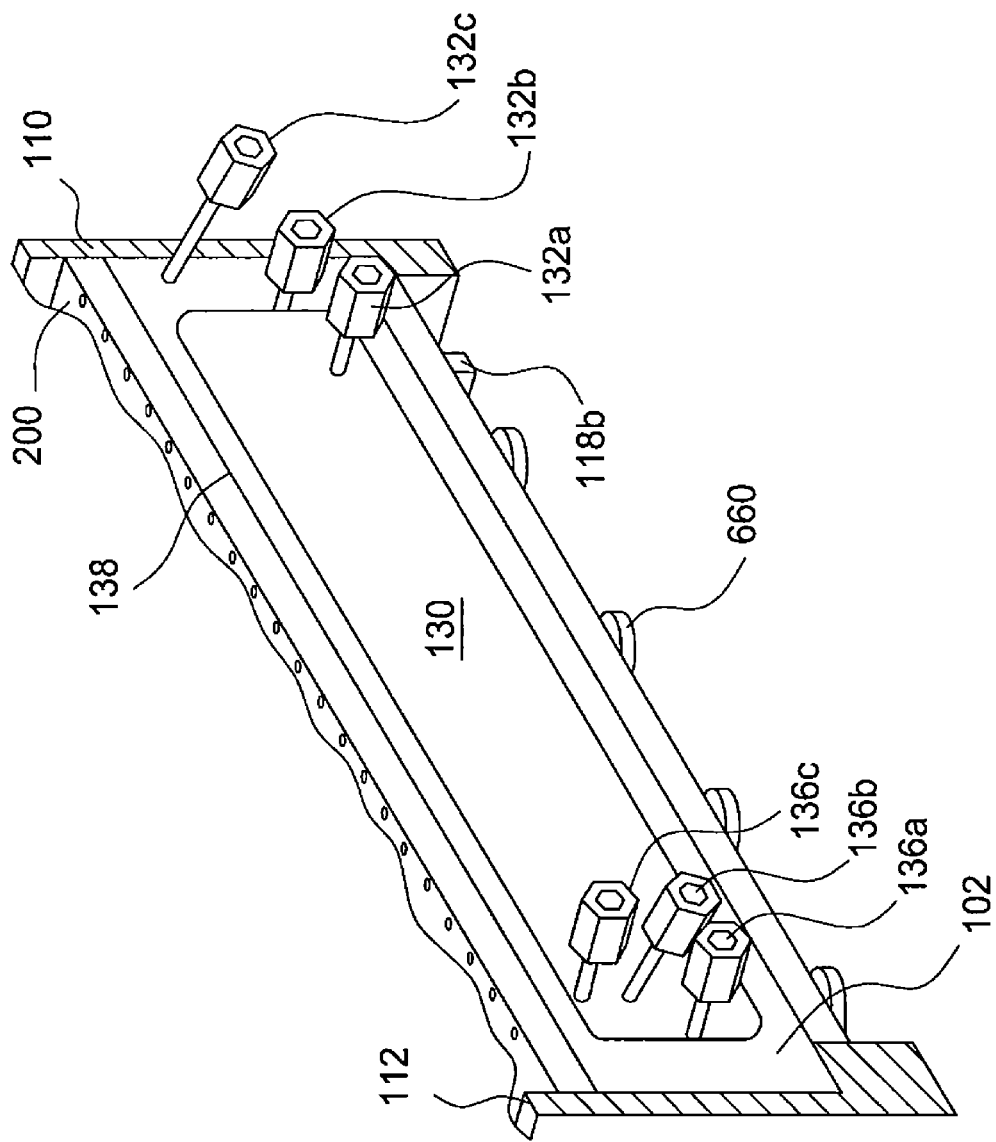

Reactor lid assembly 200 contains an injector or isolator, isolator assembly 500, disposed between two showerheads, showerhead assemblies 700. Reactor lid assembly 200 also contains exhaust assembly 800. FIG. 1C depicts reactor 100 containing two deposition stations, such as chamber stations 160, 162. Chamber station 160 contains showerhead assembly 700 and isolator assembly 500 while chamber station 162 contains showerhead assembly 700 and exhaust assembly 800. In one embodiment, isolator assembly 500 may be used to flow gas to separate both showerhead assemblies 700 from each other, while exhaust assembly 800 may be used to isolate the internal environment of reactor 100 from another reactor connected to faceplate 112.

In many embodiments described herein, each of the showerhead assemblies 700 may be a modular showerhead assembly, each of the isolator assemblies 500 may be a modular isolator assembly, and each of the exhaust assemblies 800 may be a modular exhaust assembly. Any of the showerhead assemblies 700, the isolator assemblies 500, and/or the exhaust assemblies 800 may be removed from reactor lid assembly 200, and replaced with the same or a different assembly as desired for the particular process conditions. The modular assemblies of the showerhead assemblies 700, the isolator assemblies 500, and/or the exhaust assemblies 800 may independently be configured for positioning within a CVD reactor system.

In alternative embodiments described herein, other configurations of reactor 100 are provided, but not illustrated in the drawings. In one embodiment, reactor lid assembly 200 of reactor 100 contains three exhaust assemblies 800 separated by two showerhead assemblies 700 so that reactor lid assembly 200 sequentially contain a first exhaust assembly, a first showerhead assembly, a second exhaust assembly, a second showerhead assembly, and a third exhaust assembly. In another embodiment, reactor lid assembly 200 of reactor 100 contains three isolator assemblies 500 separated by two showerhead assemblies 700 so that reactor lid assembly 200 sequentially contain a first isolator assembly, a first showerhead assembly, a second isolator assembly, a second showerhead assembly, and a third isolator assembly.

In another embodiment, reactor lid assembly 200 of reactor 100 contains two isolator assemblies 500 and one exhaust assembly 800 separated by two showerhead assemblies 700 so that reactor lid assembly 200 sequentially contains a first isolator assembly, a first showerhead assembly, a second isolator assembly, a second showerhead assembly, and a first exhaust assembly. In another example, reactor lid assembly 200 may sequentially contain a first isolator assembly, a first showerhead assembly, a first exhaust assembly, a second showerhead assembly, and a second isolator assembly. In another example, reactor lid assembly 200 may sequentially contain a first exhaust assembly, a first showerhead assembly, a first isolator assembly, a second showerhead assembly, and a second isolator assembly.

In another embodiment, reactor lid assembly 200 of reactor 100 contains two exhaust assemblies 800 and one isolator assembly 500 separated by two showerhead assemblies 700 so that reactor lid assembly 200 sequentially contains a first exhaust assembly, a first showerhead assembly, a second exhaust assembly, a second showerhead assembly, and a first isolator assembly. In another example, reactor lid assembly 200 may sequentially contain a first exhaust assembly, a first showerhead assembly, a first isolator assembly, a second showerhead assembly, and a second exhaust assembly. In another example, reactor lid assembly 200 may sequentially contain a first isolator assembly, a first showerhead assembly, a first exhaust assembly, a second showerhead assembly, and a second exhaust assembly.

Reactor body assembly 102 contains faceplate 110 on one end and faceplate 112 on the opposite end. Faceplates 110 and 112 may each independently be utilized to couple together additional reactors, similar or different than reactor 100, or to couple an end cap, an end plate, a wafer/substrate handler, or another device. In one example, faceplate 110 of reactor 100 may be coupled to faceplate 112 of another reactor (not shown). Similar, faceplate 112 of reactor 100 may be coupled to faceplate 110 of another reactor (not shown). A seal, spacer, or O-ring may be disposed between two joining faceplates. In one embodiment, the seal may contain a metal, such as nickel or a nickel alloy. In one example, the seal is a knife edge metal seal. In another embodiment, the seal contains a polymer or an elastomer, such as a KALREZ® elastomer seal, available from DuPont Performance Elastomers L.L.C. In another embodiment, the seal may be a helix seal or an H-seal. The seal or O-ring should form a gas tight seal to prevent, or greatly reduce ambient gas from entering reactor 100. Reactor 100 may be maintained with little or no oxygen, water, or carbon dioxide during use or production. In one embodiment, reactor 100 may be maintained with an oxygen concentration, a water concentration, and/or a carbon dioxide concentration independently of about 100 ppb (parts per billion) or less, preferably, about 10 ppb or less, more preferably, about 1 ppb or less, and more preferably, about 100 ppt (parts per trillion) or less.

Sides 120 and 130 extend along the length of reactor body assembly 102. Side 120 has upper surface 128 and side 130 has upper surface 138. Upper surfaces 114 and 116 of reactor body assembly 102 extend between upper surfaces 128 and 138. Upper surface 114 is on reactor body assembly 102 just inside and parallel to faceplate 110 and upper surface 116 is on reactor body assembly 102 just inside and parallel to faceplate 112. Gas inlet 123 is coupled to and extends from side 120. The levitation gas or carrier gas may be administered into reactor 100 through gas inlet 123. The levitation gas or carrier gas may contain nitrogen, helium, argon, hydrogen, or mixtures thereof.

Figure 1F:
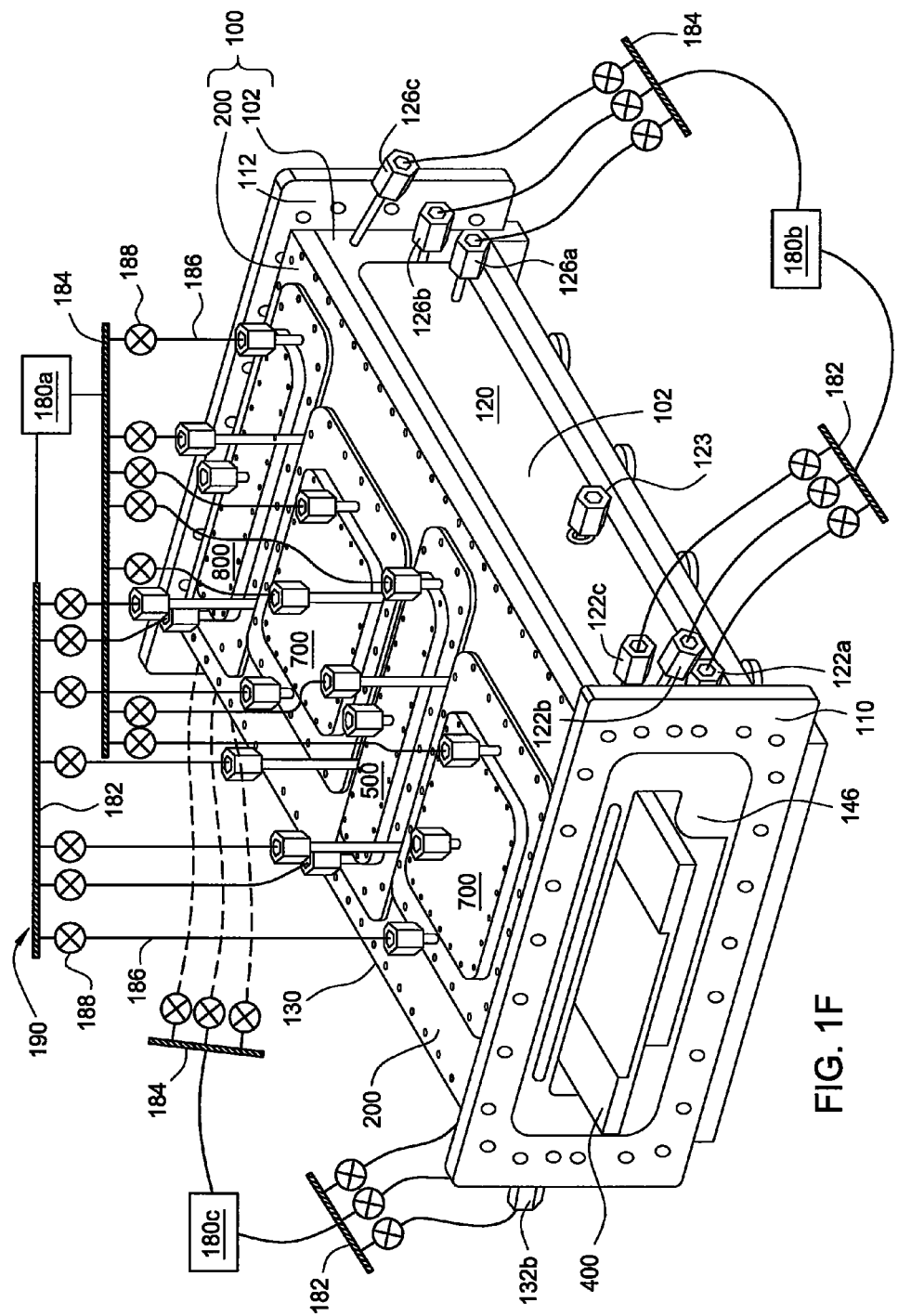
FIG. 1F depicts a CVD reactor coupled to a temperature regulation system according to another embodiment described herein.

FIG. 1F depicts reactor 100, including reactor body assembly 102 and reactor lid assembly 200, coupled to temperature regulation system 190, according to one embodiment described herein. Temperature regulation system 190 is illustrated in FIG. 1F as having three heat exchangers 180a, 180b, and 180c. However, temperature regulation system 190 may have 1, 2, 3, 4, 5, or more heat exchangers coupled to and in fluid communication with the various portions of reactor 100. Each of the heat exchangers 180a, 180b, or 180c may contain at least one liquid supply 182 and at least one liquid return 184. Each liquid supply 182 may be coupled to and in fluid communication with inlets on reactor 100 by conduit 186 while each liquid return 184 may be coupled to and in fluid communication with outlets on reactor 100 by conduit 186. Conduits 186 may include pipes, tubing, hoses, other hollow lines, or combinations thereof. Valve 188 may be used on each conduit 186 between liquid supply 182 and an inlet or between liquid return 184 and an outlet.

Reactor body assembly 102 is coupled to and in fluid communication with at least one heat exchanger as part of the heat regulation system. In some embodiments, reactor body assembly 102 may be coupled to and in fluid communication with two, three, or more heat exchangers. FIG. 1B depicts inlet 118a and outlet 118b coupled to and in fluid communication with lower portion 104 of reactor 100 and with the heat regulation system.

In one embodiment, inlets 122a, 122b, and 122c, and outlets 126a, 126b, and 126c are coupled to and extend from side 120. At least one heat exchanger is coupled to and in fluid communication with inlets 122a, 122b, and 122c, and outlets 126a, 126b, and 126c. Inlets 122a, 122b, and 122c may receive a liquid from the heat exchangers while outlets 126a, 126b, and 126c send the liquid back to the heat exchanger. In one embodiment, each inlet 122a, 122b, or 122c is positioned in a lower position than each respective outlet 126a, 126b, or 126c, so that flowing liquid from each inlet 122a, 122b, or 122c upwardly flows through each connecting passageway to each respective outlet 126a, 126b, or 126c.

In another embodiment, inlets 132*a*, 132*b*, and 132*c*, and outlets 136*a*, 136*b*, and 136*c* are coupled to and extend from side 130. At least one heat exchanger is coupled to and in fluid communication with inlets 132*a*, 132*b*, and 132*c*, and outlets 136*a*, 136*b*, and 136*c*. Inlets 132*a*, 132*b*, and 132*c* may receive a liquid from the heat exchanger while outlets 136*a*, 136*b*, and 136*c* send the liquid back to the heat exchanger.

FIGS. 1C-1D illustrate reactor body assembly 102 containing fluid passageways 124*a*, 124*b*, 124*c*, 134*a*, 134*b*, and 134*c*. In one example, fluid passageway 124*a* extends within side 120 and along a partial length of reactor body assembly 102. Fluid passageway 124*a* is coupled to and in fluid communication with inlet 122*a* and outlet 126*a*. Also, fluid passageway 134*a* extends within side 130 and along a partial length of reactor body assembly 102. Fluid passageway 134*a* is coupled to and in fluid communication with inlet 132*a* and outlet 136*a*.

In another example, fluid passageway 124*b* extends within the shelf or bracket arm 146 within reactor body assembly 102 and along a partial length of reactor body assembly 102. Fluid passageway 124*b* is coupled to and in fluid communication with inlet 122*b* and outlet 126*b*. Also, fluid passageway 134*b* extends within the shelf or bracket arm 146 within reactor body assembly 102 and along a partial length of reactor body assembly 102. Fluid passageway 134*b* is coupled to and in fluid communication with inlet 132*b* and outlet 136*b*.

In another example, fluid passageway 124*c* extends from side 120, through the width of reactor body assembly 102, and to side 130. Fluid passageway 124*c* is coupled to and in fluid communication with inlet 122*c* and outlet 132*c*. Also, fluid passageway 124*c* extends from side 130, through the width of reactor body assembly 102, and to side 130. Fluid passageway 124*c* is coupled to and in fluid communication with inlet 126*c* and outlet 136*c*.

In another embodiment, reactor body assembly 102 contains wafer carrier track 400 and heating lamp assembly 600 disposed therein. Heating lamp system may be used to heat wafer carrier track 400, wafer carriers, and wafers 90 disposed above and within reactor 100. Wafer carrier track 400 may be on a shelf, such as bracket arm 146. Generally, wafer carrier track 400 may be disposed between bracket arm 146 and clamp arm 148. Bracket arm 146 may contains fluid passageways 124*b* and 134*b* traversing therethrough.

In one embodiment, a spacer, such as a gasket or an O-ring may be disposed between the lower surface of wafer carrier track 400 and the upper surface of bracket arm 146. Also, another spacer, such as a gasket or an O-ring may be disposed between the upper surface of wafer carrier track 400 and the lower surface of clamp arm 148. The spacers may be used to form space or a gap around wafer carrier track 400, which aids in the thermal management of wafer carrier track 400. In one example, the upper surface of bracket arm 146 may have a groove for containing a spacer. Similarly, the lower surface of clamp arm 148 may have a groove for containing a spacer.

Figure 2B:
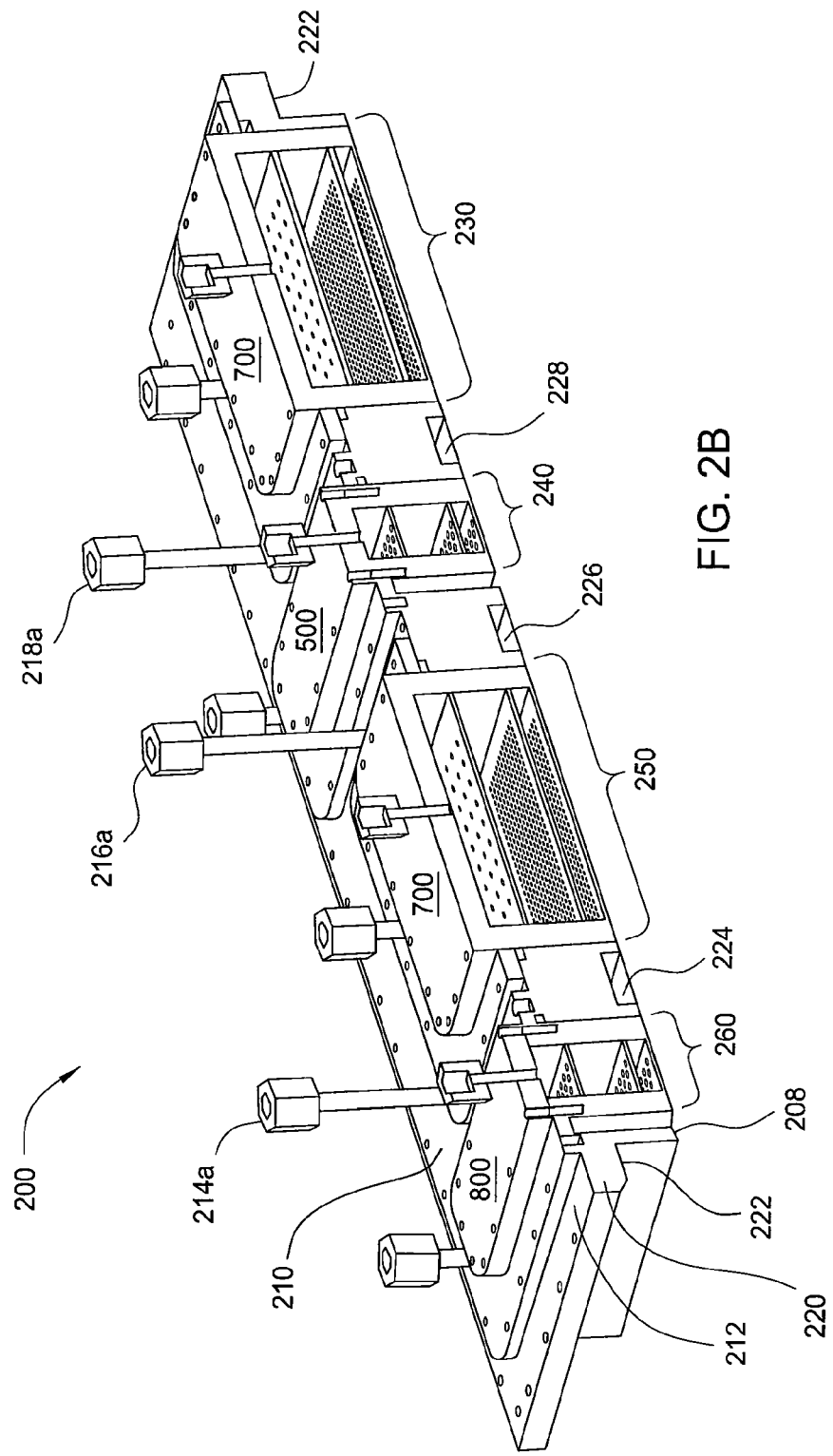
Figure 2C:
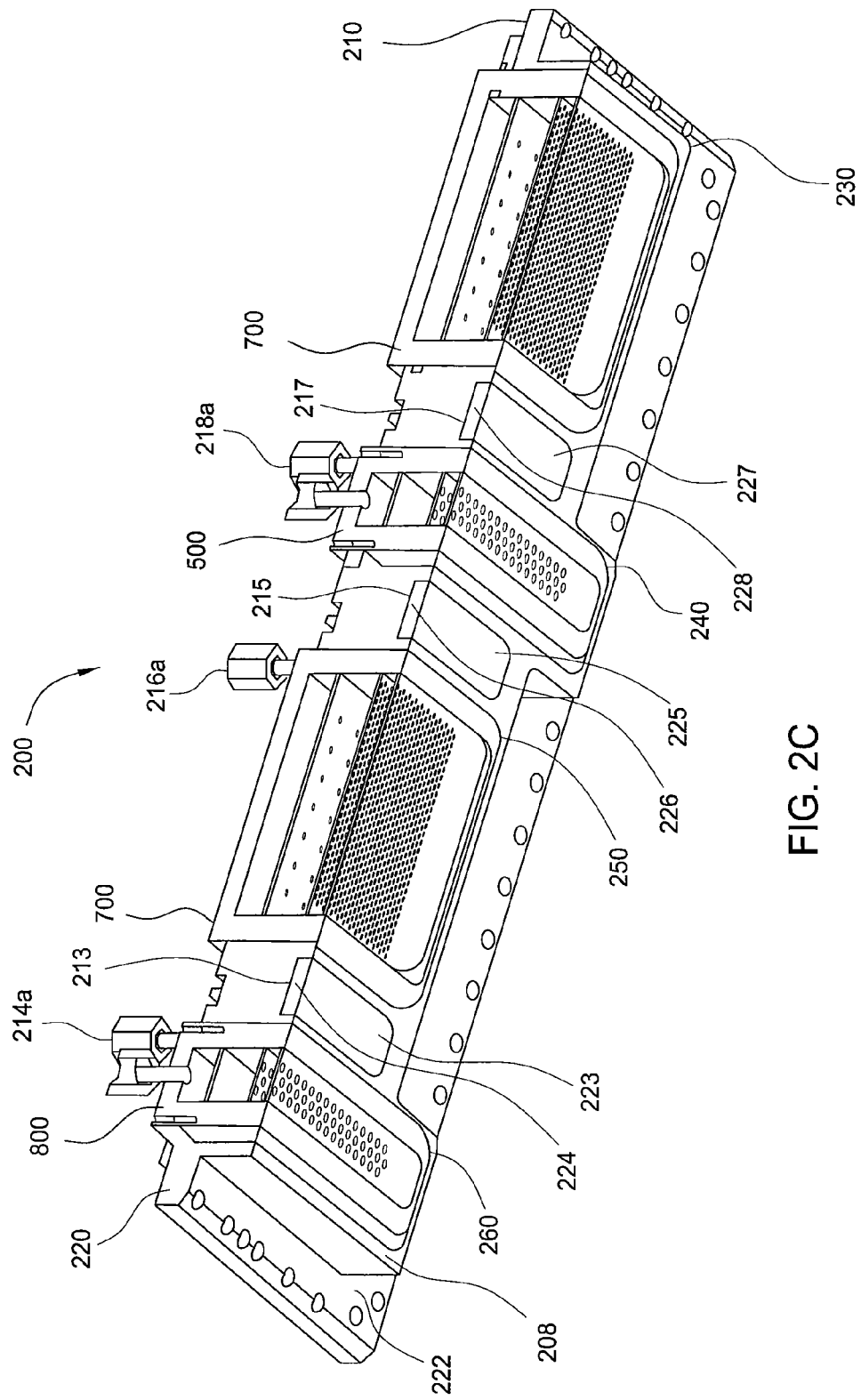
Figure 2D:
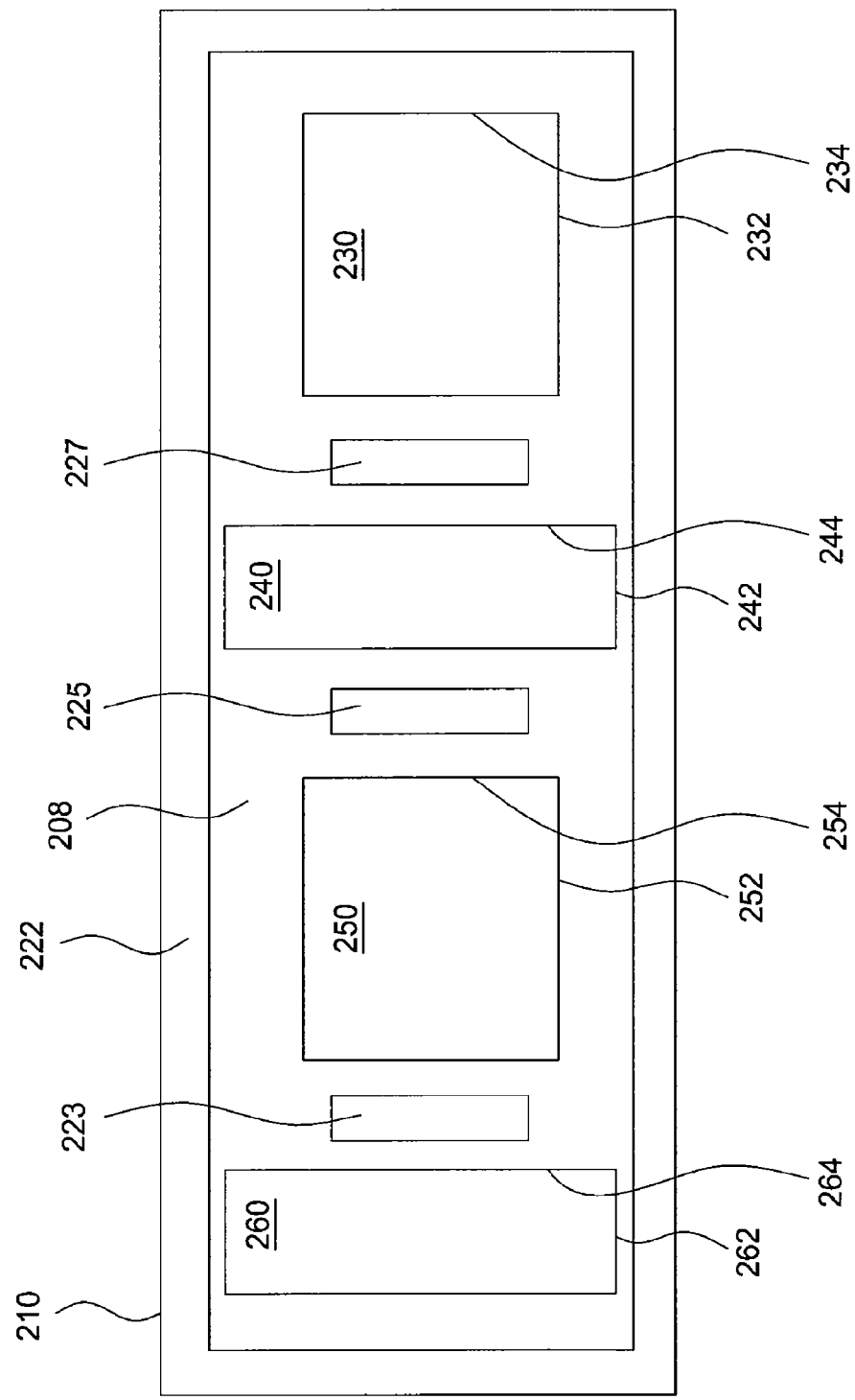
FIG. 2D depicts a reactor lid support according to an embodiment described herein.
Figure 3:
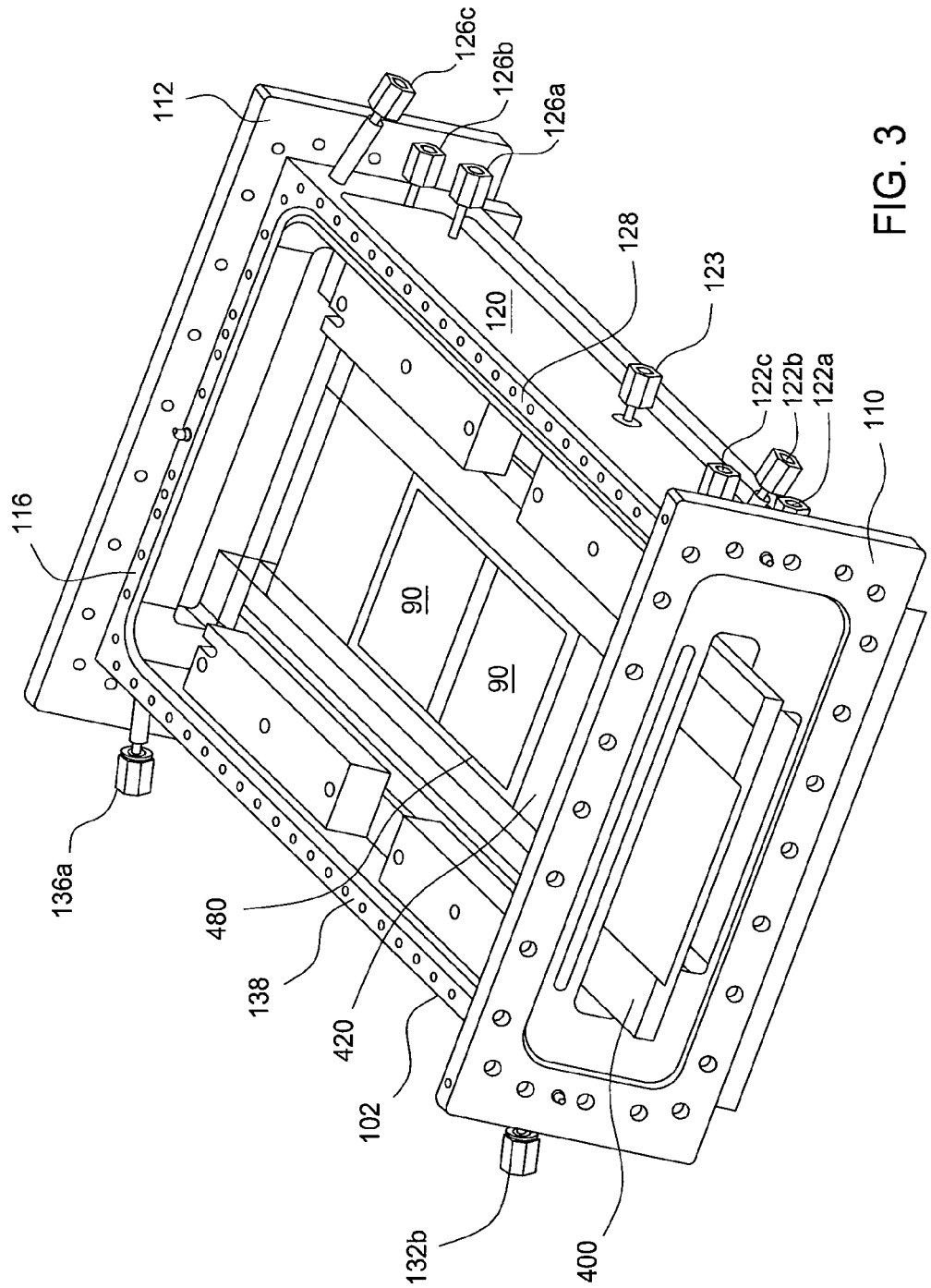
FIG. 3 depicts a reactor body assembly according to embodiments described herein.

FIGS. 2A-2C depict reactor lid assembly 200 according to another embodiment described herein. Reactor lid assembly 200 contains showerhead assembly 700 and isolator assembly 500 (chamber station 160) and showerhead assembly 700 and exhaust assembly 800 (chamber station 162) disposed on lid support 210. FIG. 2D depicts lid support 210 contained within reactor lid assembly 200, as described in one embodiment. Lid support 210 has lower surface 208 and upper surface 212. Flange 220 extends outwardly from lid support 210 and has lower surface 222. Flange 220 helps support reactor lid assembly 200 when disposed on reactor body assembly 102. Lower surface 222 of flange 220 may be in physical contact with upper surfaces 114, 116, 128, and 138 of reactor body assembly 102.

In one embodiment, showerhead assemblies 700 may be disposed within showerhead ports 230 and 250 of lid support 210, isolator assembly 500 may be disposed within isolator port 240 of lid support 210, and exhaust assembly 800 may be disposed within exhaust port 260 of lid support 210. The geometry of the gas or exhaust assembly generally matches the geometry of the respective port. Each showerhead assembly 700 and showerhead ports 230 and 250 may independently have a rectangular or square geometry. A process path—such as the path in which levitating wafer carrier 480 travels forward along wafer carrier track 400 during fabrication processes—extends along the length of lid support 210 as well as wafer carrier track 400.

Showerhead port 230 has length 232 and width 234 and showerhead port 250 has length 252 and width 254. Isolator assembly 500 and isolator port 240 may independently have a rectangular or square geometry. Isolator port 240 has length 242 and width 244. Exhaust assembly 800 and exhaust port 260 may independently have a rectangular or square geometry. Exhaust port 260 has length 262 and width 264.

The process path extends along length 232 of showerhead port 230 and a first showerhead assembly therein, extends along length 242 of isolator port 240 and an isolator assembly therein, extends along length 252 of showerhead port 250 and a second showerhead assembly therein, and extends along length 262 of exhaust port 260 and an exhaust assembly therein. Also, the process path extends perpendicular or substantially perpendicular to width 234 of showerhead port 230 and a first showerhead assembly therein, to width 244 of isolator port 240 and an isolator assembly therein, to width 254 of showerhead port 250 and a second showerhead assembly therein, and to width 264 of exhaust port 260 and an exhaust assembly therein.

In some examples, the first showerhead assembly 700, the isolator assembly 500, the second showerhead assembly 700, and the exhaust assembly 800 are consecutively disposed next to each and along a process path which extends along the length of lid support. The isolator assembly 500, as well as the exhaust assembly 800 may each have a width which is substantially the same or greater than the width of the process path. Also, the isolator assembly 500 or the exhaust assembly 800 may independently have a width which is substantially the same or greater than the width of the first and second showerhead assemblies 700.

In one embodiment, showerhead assemblies 700 independently have a square geometry and isolator assembly 500 and exhaust assembly 800 have a square geometry. In one example, width 244 of isolator port 240 and the width of isolator assembly 500 may extend across the width of the interior of the chamber. In another example, width 264 of exhaust port 260 and the width of exhaust assembly 800 may extend across the width of the interior of the chamber.

In some embodiments, width 234 of showerhead port 230, width 254 of showerhead port 250, and the width of each showerhead assembly 700 may independently be within a range from about 3 inch to about 9 inches, preferably, from about 5 inches to about 7 inches, for example, about 6 inches. Also, length 232 of showerhead port 230, length 252 of showerhead port 250 and the length of each showerhead assembly 700 may independently be within a range from about 3 inch to about 9 inches, preferably, from about 5 inches to about 7 inches, for example, about 6 inches.

In other embodiments, width 244 of isolator port 240 and the width of isolator assembly 500 may independently be within a range from about 3 inches to about 12 inches, preferably, from about 4 inches to about 8 inches, and more preferably, from about 5 inches to about 6 inches. Also, length 242 of isolator port 240 and the length of the isolator assembly 500 may independently be within a range from about 0.5 inches to about 5 inches, preferably, from about 1 inch to about 4 inches, from about 1.5 inches to about 2 inches.

In other embodiments, width 264 of exhaust port 260 and the width of exhaust assembly 800 may independently be within a range from about 3 inches to about 12 inches, preferably, from about 4 inches to about 8 inches, and more preferably, from about 5 inches to about 6 inches. Also, length 262 of exhaust port 260 and the length of the exhaust assembly 800 may independently be within a range from about 0.5 inches to about 5 inches, preferably, from about 1 inch to about 4 inches, from about 1.5 inches to about 2 inches.

Reactor lid assembly 200 may be coupled to and in fluid communication with at least one heat exchanger as part of the heat regulation system. In some embodiments, reactor lid assembly 200 may be coupled to and in fluid communication with two, three, or more heat exchanger.

The heat regulation system 190 (FIG. 1F) of reactor lid assembly 200 contains inlets 214a, 216a, and 218a and outlets 214b, 216b, and 218b, as depicted in FIG. 2A. Each pair of the inlet and outlet is coupled to and in fluid communication with a passageway extending throughout reactor lid assembly 200. Inlets 214a, 216a, and 218a may receive a liquid from the heat exchanger while outlets 214b, 216b, and 218b send the liquid back to the heat exchanger, such as heat exchangers 180a-180c. In some embodiments, the temperature regulation system 190 utilizes heat exchangers 180a-180c to independently maintain reactor body assembly 102 and/or reactor lid assembly 200 at a temperature within a range from about 250° C. to about 350° C., preferably, from about 275° C. to about 325° C., more preferably, from about 290° C. to about 310° C., such as about 300° C.

FIGS. 2B-2C illustrate fluid passageways 224, 226, and 228. Fluid passageway 224 is disposed between inlet 214a and outlet 214b, which may be coupled to and in fluid communication to a heat exchanger. Fluid passageway 224 is disposed between showerhead assembly 700 and exhaust assembly 800. Also, fluid passageway 226 is disposed between inlet 216a and outlet 216b, and fluid passageway 228 is disposed between inlet 218a and outlet 218b, which both may independently be coupled to and in fluid communication to a heat exchanger. Fluid passageway 226 is disposed between showerhead assembly 700 and isolator assembly 500, and fluid passageway 228 is disposed between showerhead assembly 700 and isolator assembly 500.

Fluid passageway 224 is partially formed between groove 213 and plate 223. Similarly, fluid passageway 226 is partially formed between groove 215 and plate 225, and fluid passageway 228 is partially formed between groove 217 and plate 227. Grooves 213, 215, and 217 may be formed within lower surface 208 of lid support 210. FIG. 2D depicts plates 223, 225, and 227 respectively covering grooves 213, 215, and 217.

In one embodiment, a reactor lid assembly 200 for vapor deposition is provided which includes a first showerhead assembly 700 and an isolator assembly 500 disposed next to each other on a lid support 210, and a second showerhead assembly 700 and an exhaust assembly 800 disposed next to each other on the lid support 210, wherein the isolator assembly 500 is disposed between the first and second showerhead assemblies 700 and the second showerhead assembly 700 is disposed between the isolator assembly 500 and the exhaust assembly 800.

In another embodiment, a reactor lid assembly 200 for vapor deposition is provided which includes a chamber station 160 having a first showerhead assembly 700 and an isolator assembly 500 disposed next to each other on a lid support 210, and a chamber station 162 having a second showerhead assembly 700 and an exhaust assembly 800 disposed next to each other on the lid support 210, wherein the isolator assembly 500 is disposed between the first and second showerhead assemblies 700 and the second showerhead assembly 700 is disposed between the isolator assembly 500 and the exhaust assembly 800.

In another embodiment, a reactor lid assembly 200 for vapor deposition is provided which includes a first showerhead assembly 700, an isolator assembly 500, a second showerhead assembly 700, and an exhaust assembly 800 consecutively and linearly disposed next to each other on a lid support 210, wherein the isolator assembly 500 is disposed between the first and second showerhead assemblies 700 and the second showerhead assembly 700 is disposed between the isolator assembly 500 and the exhaust assembly 800.

In another embodiment, a reactor lid assembly 200 for vapor deposition is provided which includes a first showerhead assembly 700, an isolator assembly 500, a second showerhead assembly 700, and an exhaust assembly 800 consecutively and linearly disposed next to each other on a lid support 210, and a temperature regulation system 190 having at least one liquid or fluid passageway, but often may have two, three, or more liquid or fluid passageways, such as fluid passageways 224, 226, and 228, extending throughout the lid support 210. The temperature regulation system 190 further has at least one inlet, such as inlets 214a, 216a, and 218a, and at least one outlet, such as outlets 214b, 216b, and 218b, coupled to and in fluid communication with the fluid passageways 224, 226, and 228. Each of the inlets 214a, 216a, and 218a and outlets 214b, 216b, and 218b may be independently coupled to and in fluid communication with a liquid reservoir, a heat exchanger, or multiple heat exchangers, such as heat exchangers 180a, 180b, and 180c. In one example, the liquid reservoir may contain or be a source of water, alcohols, glycols, glycol ethers, organic solvents, or mixtures thereof.

In one example, the first showerhead assembly 700 may be disposed between the two independent fluid passageways of the temperature regulation system 190 which extend through the reactor lid assembly 200. In another example, the second showerhead assembly 700 may be disposed between the two independent fluid passageways of the temperature regulation system 190 which extend through the reactor lid assembly 200. In another example, the isolator assembly 500 may be disposed between the two independent fluid passageways of the temperature regulation system 190 which extend through the reactor lid assembly 200. In another example, the exhaust assembly 800 may be disposed between the two independent fluid passageways of the temperature regulation system 190 which extend through the reactor lid assembly 200.

In another embodiment, a reactor lid assembly 200 for vapor deposition is provided which includes a chamber station 160 having a first showerhead assembly 700 and an isolator assembly 500 disposed next to each other on a lid support 210, a chamber station 162 having a second showerhead assembly 700 and an exhaust assembly 800 disposed next to each other on the lid support 210, wherein the isolator assembly 500 is disposed between the first and second showerhead assemblies 700, and the temperature regulation system 190.

In one embodiment, the first showerhead assembly 700, the isolator assembly 500, the second showerhead assembly 700, and the exhaust assembly 800 are consecutively disposed next to each and along the length of lid support 210. In some embodiments, the isolator assembly 500 may have a longer width than the first or second showerhead assembly 700. In other embodiments, the isolator assembly 500 may have a shorter length than the first or second showerhead assembly 700. In some embodiments, the exhaust assembly 800 may have a longer width than the first or second showerhead assembly 700. In other embodiments, the exhaust assembly 800 may have a shorter length than the first or second showerhead assembly 700.

In some examples, the first showerhead assembly 700, the isolator assembly 500, the second showerhead assembly 700, and the exhaust assembly 800 independently have a rectangular geometry. In other examples, the first showerhead assembly 700 and the second showerhead assembly 700 have a square geometry. The lid support 210 may contain or be made from a material such as steel, stainless steel, 300 series stainless steel, iron, nickel, chromium, molybdenum, aluminum, alloys thereof, or combinations thereof.

Embodiments provide that each of the isolator assembly 500 or the first or second showerhead assemblies 700 independently has a body 502 or 702 containing upper portion 506 or 706 disposed on a lower portion 504 or 704, a centralized channel 516 or 716 extending through the upper portion 506 or 706 and the lower portion 504 or 704, between inner surfaces 509 or 709 of the body 502 or 702, and parallel to a central axis 501 or 701 extending through the body 502 or 702 and an optional diffusion plate 530 or 730 having a first plurality of holes 532 or 732 and disposed within the centralized channel 516 or 716. The isolator assembly 500 or the first or second showerhead assemblies 700 independently have an upper tube plate 540 or 740 having a second plurality of holes 542 or 742 and disposed within the centralized channel 516 or 716 and optionally below the diffusion plate 530 or 730 and a lower tube plate 550 or 750 having a third plurality of holes 552 or 752 and disposed within the centralized channel 516 or 716 below the upper tube plate 540 or 740. Either of the showerhead assemblies 700 or the isolator assembly 500 independently may further have a plurality of gas tubes 580 or 780 extending from the upper tube plate 540 or 740 to the lower tube plate 550 or 750, wherein each of the gas tubes 580 or 780 is coupled to and in fluid communication with an individual hole from the second plurality of holes 542 or 742 and an individual hole from the third plurality of holes 552 or 752.

In another embodiment, an exhaust assembly 800 contains a body 802 having an upper portion 806 disposed on a lower portion 804, a centralized channel 816 extending through the upper portion 806 and the lower portion 804, between inner surfaces 809 of the body 802, and parallel to a central axis 801 extending through the body 802, an exhaust outlet 860 disposed on the upper portion 806 of the body 802, an optional diffusion plate 830 having a first plurality of holes 832 and disposed within the centralized channel 816, an upper tube plate 840 having a second plurality of holes 842 and disposed within the centralized channel 816 and optionally below the diffusion plate 830 (if present), a lower tube plate 850 having a third plurality of holes 852 and disposed within the centralized channel 816 below the upper tube plate 840. The exhaust assembly 800 may further contain a plurality of exhaust tubes 880 extending from the upper tube plate 840 to the lower tube plate 850, wherein each of the exhaust tubes 880 is coupled to and in fluid communication with an individual hole from the second plurality of holes 842 and an individual hole from the third plurality of holes 852.

FIGS. 4A-4E depict wafer carrier track 400 according to one embodiment described herein. In another embodiment, wafer carrier track 400 for levitating and traversing a substrate susceptor, such as levitating wafer carrier 480 within a vapor deposition reactor system, such as reactor 100, is provided which includes an upper segment 410 of wafer carrier track 400 disposed over a lower segment 412 of wafer carrier track 400. Gas cavity 430 is formed between upper segment 410 and lower segment 412 of wafer carrier track 400. Two side surfaces 416 extend along upper segment 410 of wafer carrier track 400 and parallel to each other. Guide path 420 extends between the two side surfaces 416 and along upper surface 418 of upper segment 410. A plurality of gas holes 438 is disposed within guide path 420 and extend from upper surface 418 of upper segment 410, through upper segment 410, and into gas cavity 430.

In another embodiment, upper lap joint 440 is disposed at one end of wafer carrier track 400 and lower lap joint 450 is disposed at the opposite end of wafer carrier track 400, wherein upper lap joint 440 extends along a portion of guide path 420 and side surfaces 416. Upper lap joint 440 has lower surface 442 extending further than lower segment 412. Lower lap joint 450 has upper surface 452 extending further than guide path 420 and side surfaces 416 of wafer carrier track 400.

Generally, upper segment 410 and/or lower segment 412 of wafer carrier track 400 may independently contain quartz. In some examples, lower segment 412 of wafer carrier track 400 may be a quartz plate. Upper segment 410 and lower segment 412 of wafer carrier track 400 may be fused together. In one specific example, upper segment 410 and lower segment 412 both contain quartz and are fused together forming gas cavity therebetween. The quartz contained in upper segment 410 and/or lower segment 412 of wafer carrier track 400 is usually transparent, but in some embodiments, portions of wafer carrier track 400 may contain quartz that is opaque.

In another embodiment, gas port 434 extends from side surface 402 of wafer carrier track 400 and into gas cavity 430. In one example, gas port 434 extends through upper segment 410. The plurality of gas holes 438 may number from about 10 holes to about 50 holes, preferably, from about 20 holes to about 40 holes. Each of the gas holes 438 may have a diameter within a range from about 0.005 inches to about 0.05 inches, preferably, from about 0.01 inches to about 0.03 inches.

Figure 4C:
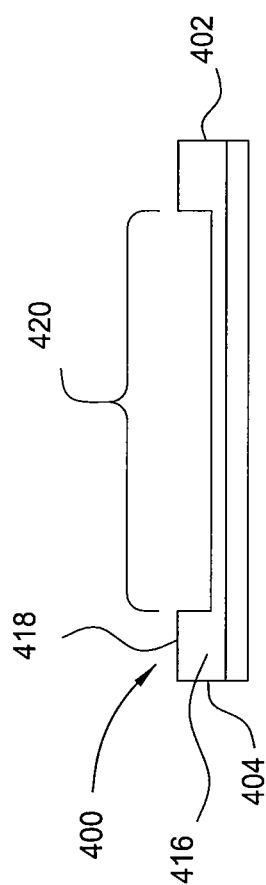
Figure 4D:
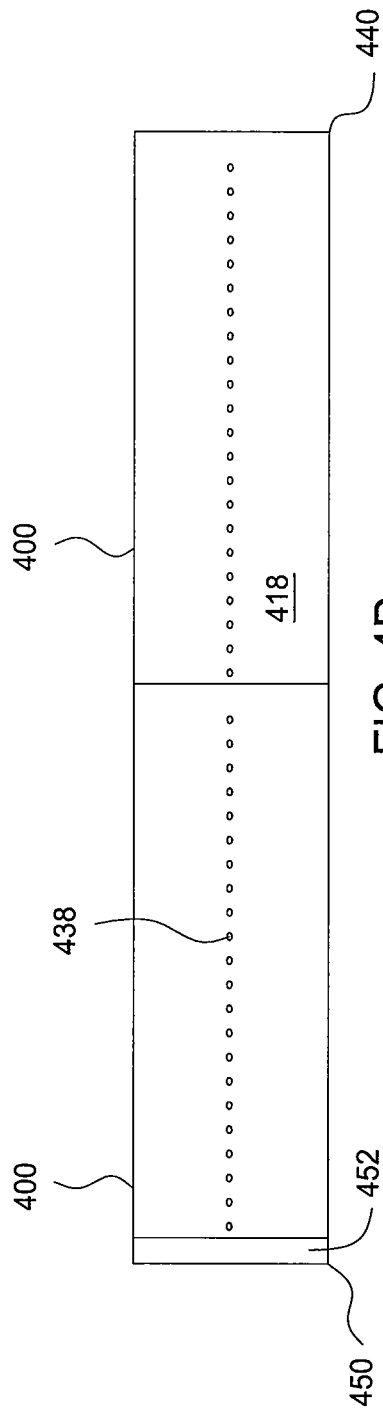
Figure 4E:
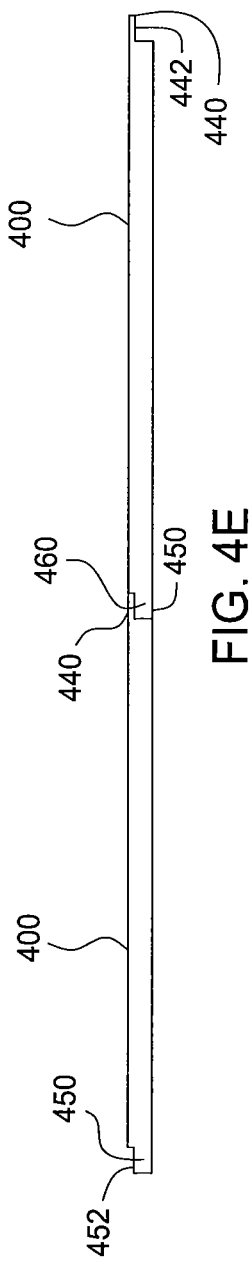
Figure 5A:
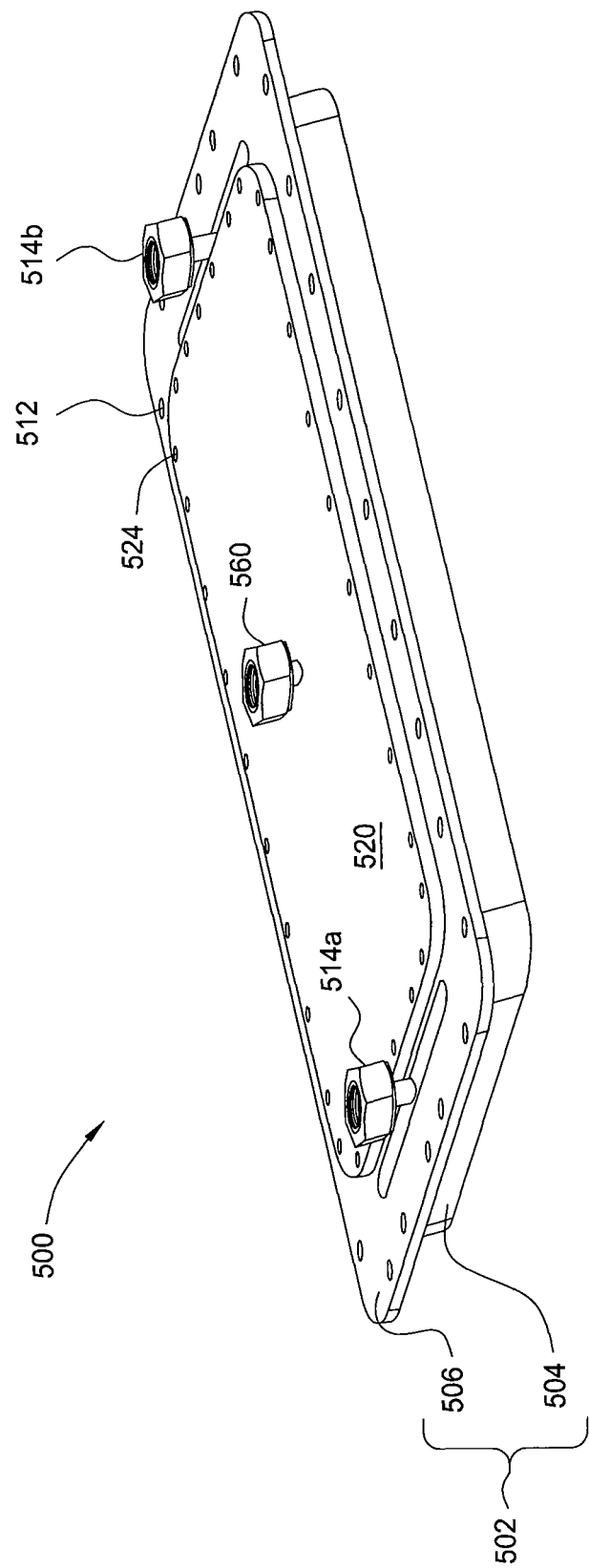
FIGS. 5A-5D depict an isolator assembly according to embodiments described herein.
Figure 5B:
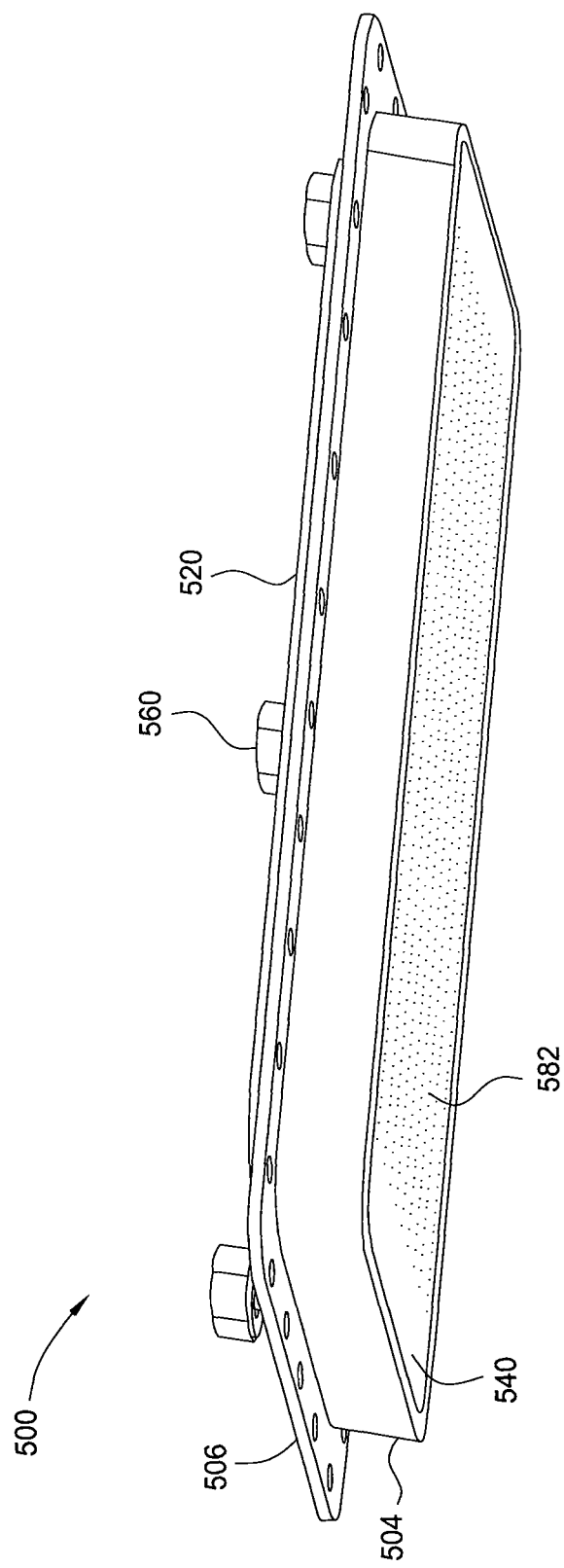
Figure 5C:
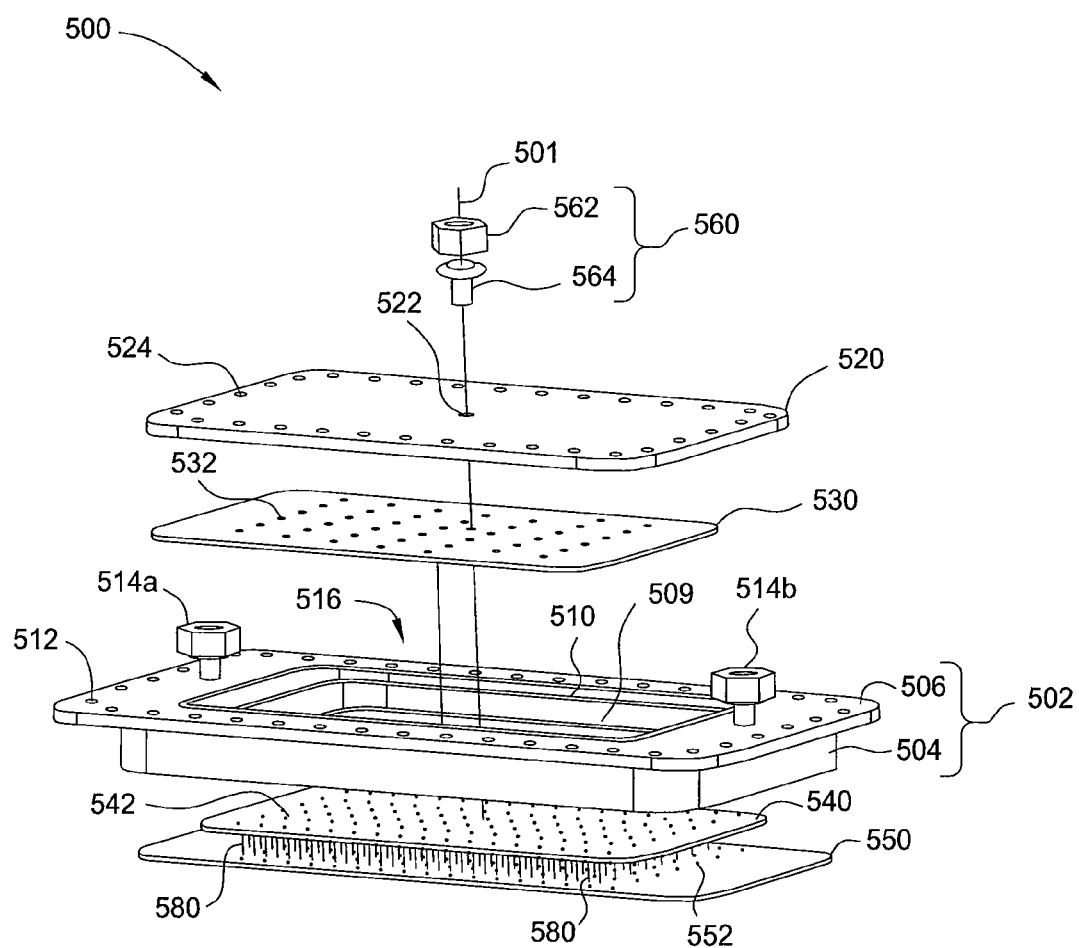
Figure 5D:
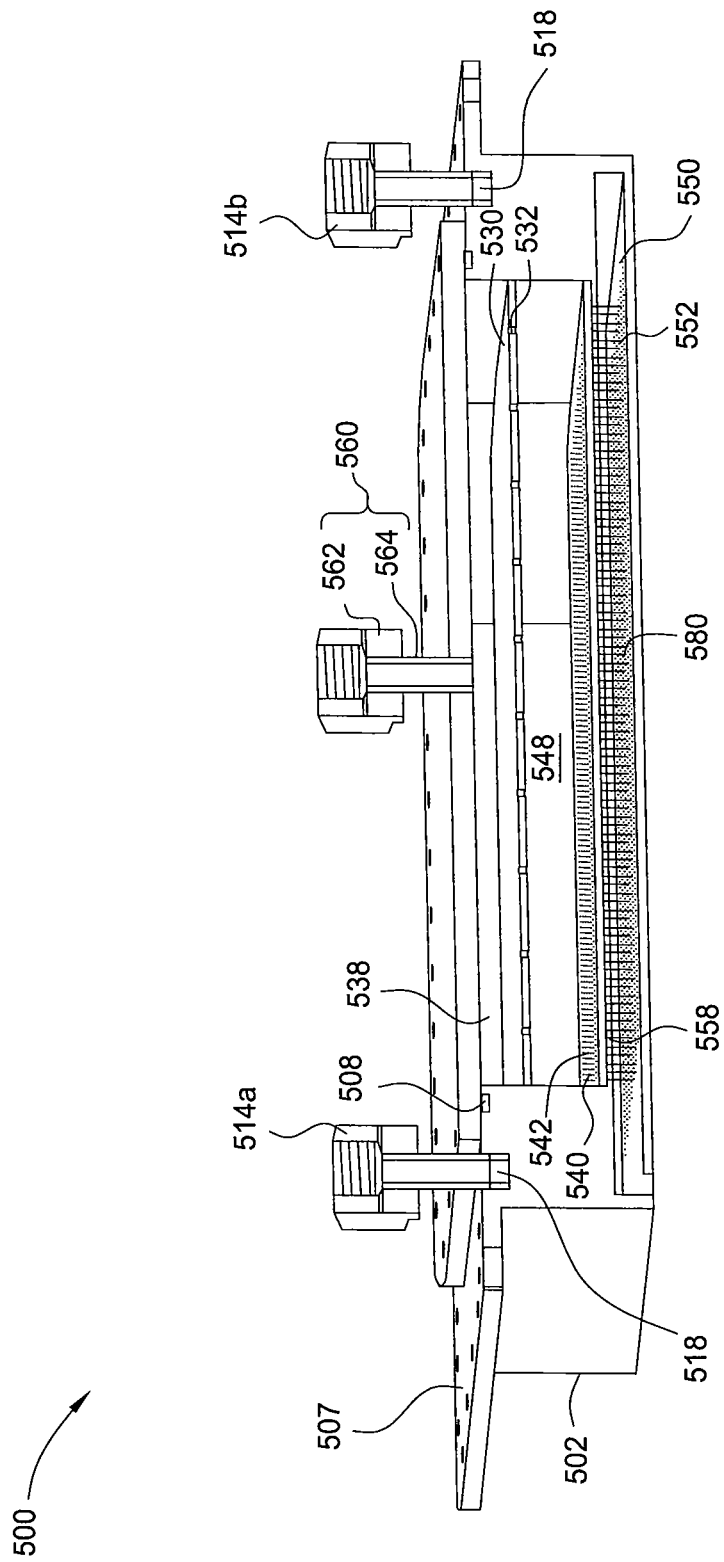

In other embodiments, a wafer carrier track system may contain two or more wafer carrier tracks 400 disposed end to end in series, as depicted in FIGS. 4D-4E. In one embodiment, the wafer carrier track system is provided which includes an upper lap joint 440 of a first wafer carrier track 400 disposed over a lower lap joint 450 of a second wafer carrier track 400, an exhaust port formed between the upper lap joint 440 of the first wafer carrier track 400 and the lower lap joint 450 of the second wafer carrier track 400, and a first guide path on an upper surface of the first wafer carrier track 400 aligned with a second guide path on an upper surface of the second wafer carrier track 400. In some examples, an upper lap joint 440 of the second wafer carrier track 400 may be disposed over a lower lap joint 450 of a third wafer carrier track 400 (not shown).

In another embodiment, wafer carrier track 400 for levitating and traversing levitating wafer carrier 480 within a vapor deposition reactor system, such as reactor 100, is provided which includes wafer carrier track 400 having gas cavity 430 formed within, guide path 420 extending along an upper surface of wafer carrier track 400, a plurality of gas holes 438 within guide path 420 and extending from the upper surface of wafer carrier track 400 and into gas cavity 430, and an upper lap joint 440 disposed at one end of wafer carrier track 400 and a lower lap joint 450 disposed at the opposite end of wafer carrier track 400, wherein the upper lap joint 440 extends a portion of guide path 420 and the lower lap joint 450 has an upper surface extending further than guide path 420 of wafer carrier track 400.

At least one side surface may be disposed on wafer carrier track 400 and extends along and above guide path 420. In some examples, two side surfaces 416 are disposed on wafer carrier track 400 and extend along and above guide path 420. Guide path 420 may extend between the two side surfaces 416. In one embodiment, an upper segment 410 of wafer carrier track 400 may be disposed over a lower segment 412 of wafer carrier track 400. Upper segment 410 of wafer carrier track 400 may have guide path 420 extending along the upper surface. Gas cavity 430 may be formed between upper segment 410 and lower segment 412 of wafer carrier track 400. In some examples, upper segment 410 and lower segment 412 of wafer carrier track 400 may be fused together. In some embodiments, wafer carrier track 400 contains quartz. Upper segment 410 and lower segment 412 of wafer carrier track 400 may independently contain quartz. In one example, lower segment 412 of wafer carrier track 400 is a quartz plate.

In other embodiments, gas port 434 extends from a side surface of wafer carrier track 400 and into gas cavity 430. Gas port 434 may be utilized to flow the levitating gas through the side surface of wafer carrier track 400, into gas cavity 430 and out from the plurality of gas holes 438 on the upper surface of wafer carrier track 400. The plurality of gas holes 438 may number from about 10 holes to about 50 holes, preferably, from about 20 holes to about 40 holes. Each gas hole 438 may have a diameter within a range from about 0.005 inches to about 0.05 inches, preferably, from about 0.01 inches to about 0.03 inches.

In another embodiment, FIGS. 12A-12E depict levitating wafer carrier 480 which may be used to carry a substrate through a variety of processing chambers including the CVD reactors as described herein, as well as other processing chambers used for deposition or etching. Levitating wafer carrier 480 has short sides 471, long sides 473, an upper surface 472, and a lower surface 474. Levitating wafer carrier 480 is illustrated with a rectangular geometry, but may also have a square geometry, a circular geometry, or other geometries. Levitating wafer carrier 480 may contain or be formed from graphite or other materials. Levitating wafer carrier 480 usually travels through the CVD reactor with the short sides 471 facing forward while the long sides 473 face towards the sides of the CVD reactor.

FIGS. 12A-12B depict levitating wafer carrier 480 according to one embodiment described herein. FIG. 12A illustrates a top view of levitating wafer carrier 480 containing 3 indentations 475 on the upper surface 472. Wafers or substrates may be positioned within the indentations 475 while being transferred through the CVD reactor during a process. Although illustrated with 3 indentations 475, the upper surface 472 may have more or less indentations, including no indentations. For example, the upper surface 472 of levitating wafer carrier 480 may contain 0, 1, 2, 3, 4, 5, 6, 7, 8, 9, 10, 12, or more indentations for containing wafers or substrates. In some example, one wafer/substrate or multiple wafers/substrates may be disposed directly on the upper surface 472 which does not have an indentation.

Figure 12C:
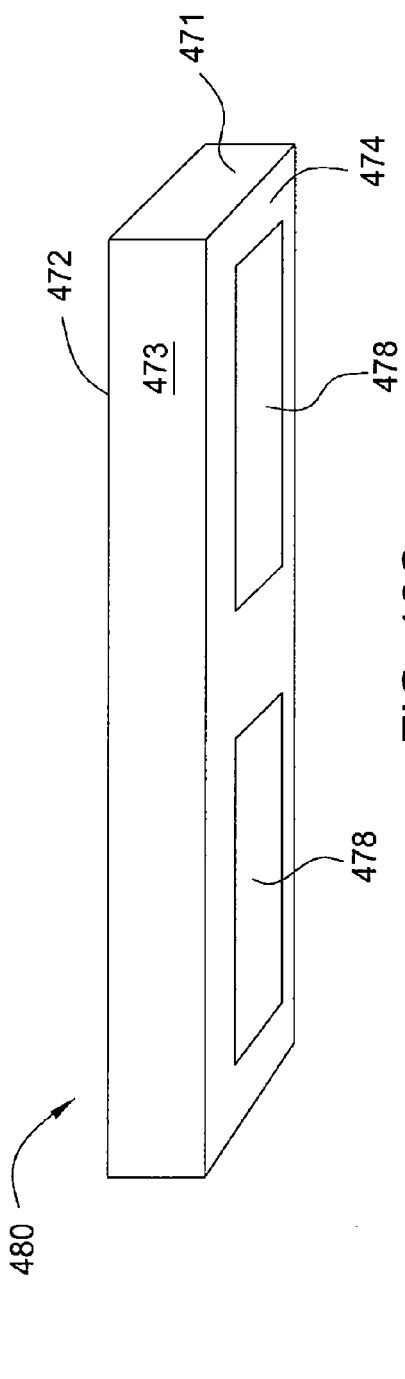
FIGS. 12C-12E depict other levitating substrate carriers according to another embodiment described herein.

FIG. 12B illustrates a bottom view of levitating wafer carrier 480 containing the indentation 478 on the lower surface 474, as described in one embodiment herein. The indentation 478 may be used to help levitate levitating wafer carrier 480 upon the introduction of a gas cushion under levitating wafer carrier 480. A gas flow may be directed at the indentation 478, which accumulates gas to form the gas cushion. The lower surface 474 of levitating wafer carrier 480 may have no indentations, or may have one indentation 478 (FIG. 12B), two indentations 478 (FIGS. 12C-12E), three indentations 478 (not shown) or more. Each of the indentations 478 may have straight or tapered sides. In one example, each indentation 478 has tapered sides such that the sides 476 are steeper or more abrupt than the sides 477 which have more of a gradual change of angle. The sides 477 within the indentation 478 may be tapered to compensate for a thermal gradient across levitating wafer carrier 480. Also, the sides 477 may be tapered or angled to help form a gas pocket and to maintain the gas pocket under levitating wafer carrier 480 while lifting and moving/traversing levitating wafer carrier 480 along wafer carrier track 400. In another example, the indentation 478 has straight or substantially straight sides and tapered sides such that the sides 476 are straight or substantially straight and the sides 477 have a taper/angle or the sides 477 are straight or substantially straight and the sides 476 have a taper/angle. Alternatively, the indentation 478 may have all straight sides such that the sides 476 and 477 are straight or substantially straight.

Figure 12D:
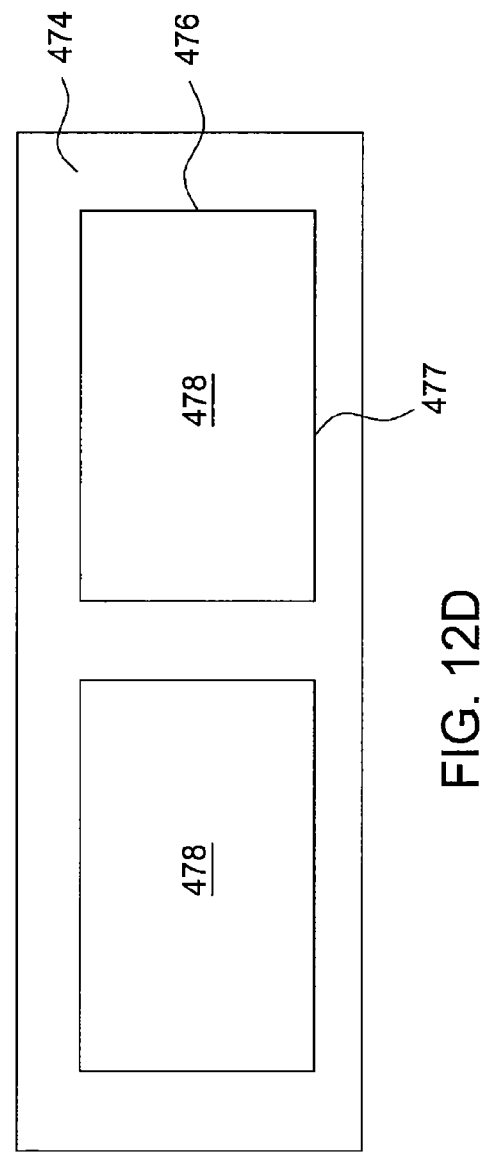
Figure 12E:
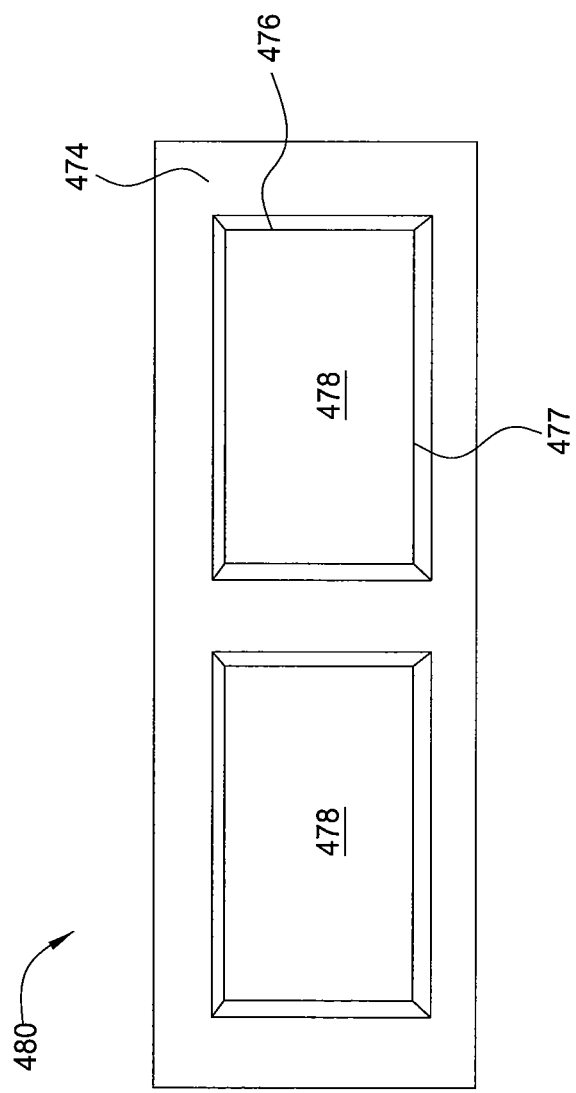

In another embodiment, FIGS. 12C-12E illustrate bottom views of levitating wafer carrier 480 containing two indentations 478 on the lower surface 474. The two indentations 478 help levitate levitating wafer carrier 480 upon the introduction of a gas cushion under levitating wafer carrier 480. A gas flow may be directed at the indentations 478, which accumulates gas to form the gas cushion. The indentations 478 may have straight or tapered sides. In one example, as illustrated in FIG. 10E, the indentations 478 have all straight sides such that the sides 476 and 477 are straight, e.g., perpendicular to the plane of the lower surface 474. In another example, as illustrated in FIG. 10F, the indentations 478 have all tapered sides such that the sides 476 are steeper or more abrupt than the sides 477 which have more of a gradual change of angle. The sides 477 within the indentations 478 may be tapered to compensate for a thermal gradient across levitating wafer carrier 480. Alternatively, the indentations 478 may have a combination of straight sides and tapered sides such that the sides 476 are straight and the sides 477 have a taper or the sides 477 are straight and the sides 476 have a taper.

Levitating wafer carrier 480 contains a heat flux which extends from the lower surface 474 to the upper surface 472 and to any substrates disposed thereon. The heat flux may be controlled by both the internal pressure and length of the processing system. The profile of levitating wafer carrier 480 may be tapered to compensate the heat loses from other sources. During a process, heat is lost through the edges of levitating wafer carrier 480, such as the short sides 471 and the long sides 473. However, the heat lost may be compensated by allowing more heat flux into the edges of levitating wafer carrier 480 by reducing the gap of the channel in the levitation.

In another embodiment, wafer carrier track 400 contains levitating wafer carrier 480 disposed on guide path 420. In some examples, levitating wafer carrier 480 has at least one indentation pocket disposed within a lower surface. In other examples, levitating wafer carrier 480 has at least two indentation pockets disposed within a lower surface.

FIGS. 5A-5D depict isolator assembly 500 for a vapor deposition chamber, such as reactor 100, according embodiments described herein. In one embodiment, isolator assembly 500 includes body 502 having upper portion 506 and lower portion 504, and centralized channel 516 extending through upper portion 506 and lower portion 504 of body 502. Upper portion 506 contains upper surface 507. Centralized channel 516 extends between inner surfaces 509 of body 502, and parallel to central axis 501 extending through body 502. Diffusion plate 530 contains a plurality of gas holes 532 and is disposed within centralized channel 516. In one example, diffusion plate 530 is disposed on a flange or ledge 510. In another example, isolator assembly 500 does not contain diffusion plate 530 disposed therein.

Isolator assembly 500 further contains upper tube plate 540 having a plurality of gas holes 542 and disposed within centralized channel 516 below diffusion plate 530. Isolator assembly 500 also contains lower tube plate 550 having a plurality of gas holes 552 and disposed within centralized channel 516 below upper tube plate 540. A plurality of gas tubes 580 extend from upper tube plate 540 to lower tube plate 550, wherein each tube is coupled to and in fluid communication with an individual hole from the plurality of gas holes 542 and an individual hole from plurality of gas holes 552. Each of the gas tubes 580 extends parallel or substantially parallel to each other as well as to central axis 501 in many embodiments described herein. In an alternative embodiment, not shown, each of the gas tubes 580 may extend at a predetermined angle relative to central axis 501, such as with in a range from about 1° to about 15° or greater.

Isolator assembly 500 may be used to disperse gases, such as purge gases, precursor gases, and/or carrier gases, by providing a flow path through inlet port 522 and into cavities 538, 548, and 558. Cavity 538 is formed between upper plate 520 and diffusion plate 530 within centralized channel 516. Cavity 548 is formed between diffusion plate 530 and upper tube plate 540 within centralized channel 516. Cavity 558 is formed between upper tube plate 540 and lower tube plate 550 within centralized channel 516.

In another embodiment, isolator assembly 500 includes body 502 containing upper portion 506 and lower portion 504, wherein upper portion 506 contains a flange extending over lower portion 504, centralized channel 516 extending through upper portion 506 and lower portion 504 of body 502, between inner surfaces 509 of body 502, and parallel to central axis 501 extending through body 502, diffusion plate 530 containing a plurality of gas holes 532 and disposed within centralized channel 516, upper tube plate 540 containing a plurality of gas holes 542 and disposed within centralized channel 516 below diffusion plate 530, lower tube plate 550 containing a plurality of gas holes 552 and disposed within centralized channel 516 below upper tube plate 540, and plurality of gas tubes 580 extending from upper tube plate 540 to lower tube plate 550, wherein each tube is coupled to and in fluid communication with an individual hole from plurality of gas holes 542 and an individual hole from plurality of gas holes 552.

In another embodiment, isolator assembly 500 includes body 502 containing upper portion 506 and lower portion 504, wherein upper portion 506 adjacently extends from central axis 501 of body 502 further than lower portion 504 and lower portion 504 extends parallel to central axis 501 further than upper portion 506, centralized channel 516 extending through upper portion 506 and lower portion 504 of body 502, between inner surfaces 509 of body 502, and parallel to central axis 501, diffusion plate 530 containing a plurality of gas holes 532 and disposed within centralized channel 516, upper tube plate 540 containing a plurality of gas holes 542 and disposed within centralized channel 516 below diffusion plate 530, lower tube plate 550 containing a plurality of gas holes 552 and disposed within centralized channel 516 below upper tube plate 540, and plurality of gas tubes 580 extending from upper tube plate 540 to lower tube plate 550, wherein each tube is coupled to and in fluid communication with an individual hole from plurality of gas holes 542 and an individual hole from plurality of gas holes 552.

In another embodiment, isolator assembly 500 includes body 502 containing upper portion 506 and lower portion 504, centralized channel 516 extending through upper portion 506 and lower portion 504 of body 502, between inner surfaces 509 of body 502, and parallel to central axis 501 extending through body 502, diffusion plate 530 containing a plurality of gas holes 532 and disposed within centralized channel 516, upper tube plate 540 containing a plurality of gas holes 542 and disposed within centralized channel 516 below diffusion plate 530, and lower tube plate 550 containing a plurality of gas holes 552 and disposed within centralized channel 516 below upper tube plate 540.

In another embodiment, isolator assembly 500 includes body 502 containing upper portion 506 and lower portion 504, centralized channel 516 extending through upper portion 506 and lower portion 504 of body 502, between inner surfaces 509 of body 502, and parallel to central axis 501 extending through body 502, upper tube plate 540 containing a plurality of gas holes 532 and disposed within centralized channel 516 below diffusion plate 530, lower tube plate 550 containing a plurality of gas holes 542 and disposed within centralized channel 516 below upper tube plate 540, and plurality of gas tubes 580 extending from upper tube plate 540 to lower tube plate 550, wherein each tube is coupled to and in fluid communication with an individual hole from plurality of gas holes 532 and an individual hole from plurality of gas holes 542.

In some embodiments, isolator assembly 500 is a modular showerhead assembly. Upper portion 506 and lower portion 504 of body 502 may independently contain a material such as steel, stainless steel, 300 series stainless steel, iron, nickel, chromium, molybdenum, aluminum, alloys thereof, or combinations thereof. In one example, upper portion 506 and lower portion 504 of body 502 each independently contains stainless steel or alloys thereof.

In one embodiment, isolator assembly 500 contains gaseous inlet 560 disposed on upper portion 506 of body 502. Upper plate 520 may be disposed on an upper surface of upper portion 506 of body 502 and gaseous inlet 560 may be disposed on the plate. The plate may contain a material such as steel, stainless steel, 300 series stainless steel, iron, nickel, chromium, molybdenum, aluminum, alloys thereof, or combinations thereof. In some examples, the plate has inlet port 522 extending therethrough. Gaseous inlet 560 has inlet tube 564 extending through inlet port 522. Inlet nozzle 562 may be coupled to one end of inlet tube 564 and disposed above the plate. In another example, the upper surface of upper portion 506 of the showerhead body has groove 508 which encompasses centralized channel 516. An O-ring may be disposed within groove 508. Diffusion plate 530 may be disposed on a ledge or a flange protruding from side surfaces of body 502 within centralized channel 516.

In one embodiment, plurality of gas tubes 580 may have tubes numbering within a range from about 500 tubes to about 1,500 tubes, preferably, from about 700 tubes to about 1,200 tubes, and more preferably, from about 800 tubes to about 1,000 tubes, for example, about 900 tubes. In some examples, each tube may have a length within a range from about 0.5 cm to about 2 cm, preferably, from about 0.8 cm to about 1.2 cm, for example, about 1 cm. In other examples, each tube may have a diameter within a range from about 0.005 inches to about 0.05 inches, preferably, from about 0.01 inches to about 0.03 inches. In some examples, the tubes are hypodermic needles. The tubes may contain or be made from a material such as steel, stainless steel, 300 series stainless steel, iron, nickel, chromium, molybdenum, aluminum, alloys thereof, or combinations thereof.

In one embodiment, each hole of plurality of gas holes 532 on diffusion plate 530 has a larger diameter than each hole of plurality of gas holes 542 on upper tube plate 540. Further, each hole of plurality of gas holes 532 on diffusion plate 530 has a larger diameter than each hole of plurality of gas holes 552 on the lower diffusion plate. Also, each hole of plurality of gas holes 542 on upper tube plate 540 has the same diameter or substantially the same diameter as each hole of plurality of gas holes 552 on lower tube plate 550.

In one embodiment, diffusion plate 530 may contain or be made from a material such as steel, stainless steel, 300 series stainless steel, iron, nickel, chromium, molybdenum, aluminum, alloys thereof, or combinations thereof. Diffusion plate 530 may contain holes numbering within a range from about 20 holes to about 200 holes, preferably, from about 25 holes to about 55 holes, and more preferably, from about 40 holes to about 60 holes. Each hole of diffusion plate 530 may have a diameter within a range from about 0.005 inches to about 0.05 inches, preferably, from about 0.01 inches to about 0.03 inches. In another embodiment, upper tube plate 540 and/or lower tube plate 550 may independently contain or be independently made from a material such as steel, stainless steel, 300 series stainless steel, iron, nickel, chromium, molybdenum, aluminum, alloys thereof, or combinations thereof. Upper tube plate 540 and/or lower tube plate 550 may independently have from about 500 holes to about 1,500 holes, preferably, from about 700 holes to about 1,200 holes, and more preferably, from about 800 holes to about 1,000 holes. Each hole of upper tube plate 540 and/or lower tube plate 550 may independently have a diameter within a range from about 0.005 inches to about 0.05 inches, preferably, from about 0.01 inches to about 0.03 inches. In another embodiment, isolator assembly 500 may have a gaseous hole density and/or number of tubes within a range from about 10 holes/in$^2$ (holes per square inch) to about 60 holes/in$^2$, preferably, from about 15 holes/in$^2$ to about 45 holes/in$^2$, and more preferably, from about 20 holes/in$^2$ to about 36 holes/in$^2$.

In one example, the upper surface of upper portion 506 of body 502 of isolator assembly 500 is a metallic plate. In other examples, isolator assembly 500 may have a rectangular geometry or a square geometry. In another embodiment, body 502 of isolator assembly 500 further contains a temperature regulation system. The temperature regulation system, such as temperature regulation system 190, may contain fluid passageway 518 extending within body 502, and may have inlet 514a and outlet 514b coupled to and in fluid communication with fluid passageway 518. Inlet 514a and outlet 514b may be independently coupled to and in fluid communication with a liquid reservoir or at least one heat exchanger, such as heat exchangers 180a, 180b, or 180c within temperature regulation system 190, as depicted in FIG. 1F.

Figure 6:
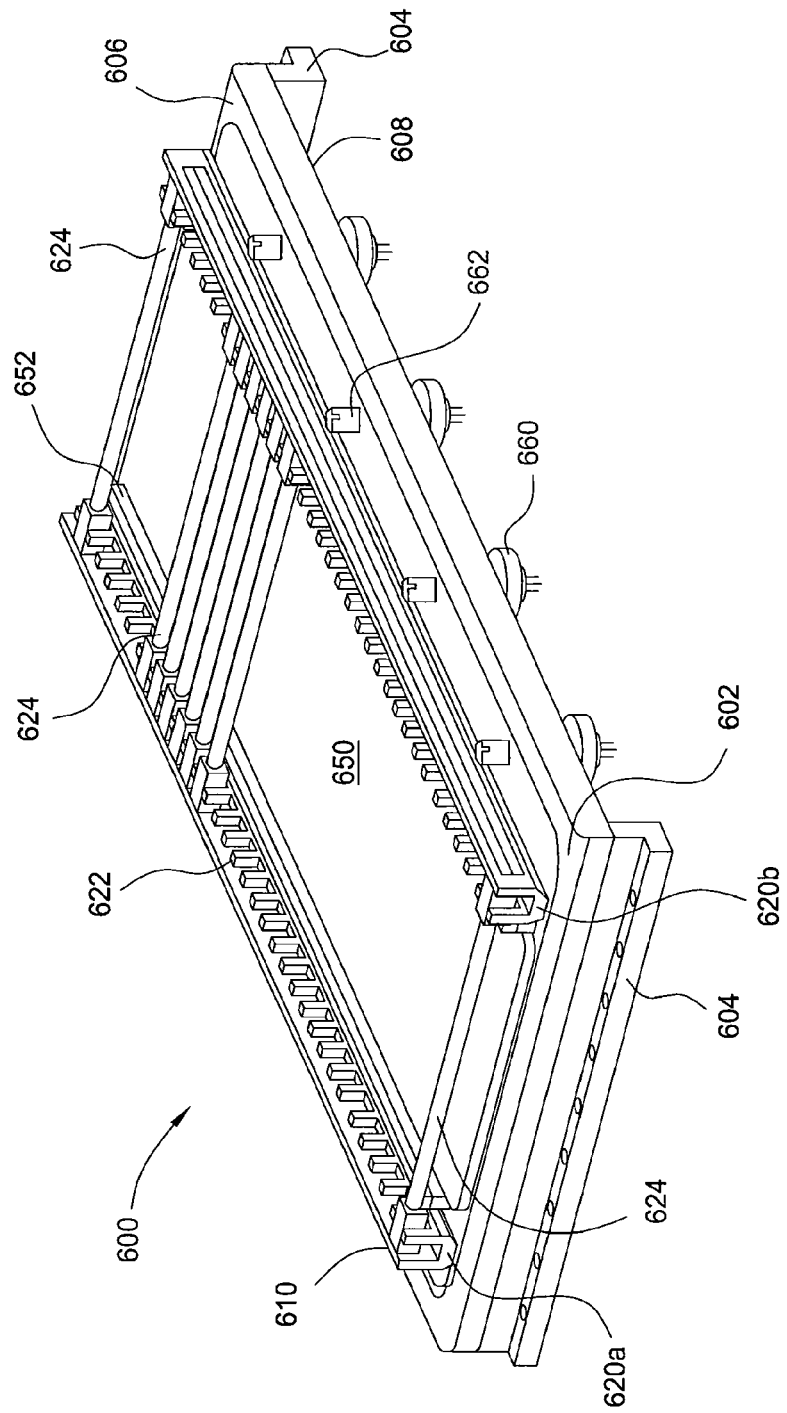
FIG. 6 depicts a heating lamp assembly according to embodiments described herein.
Figure 7A:
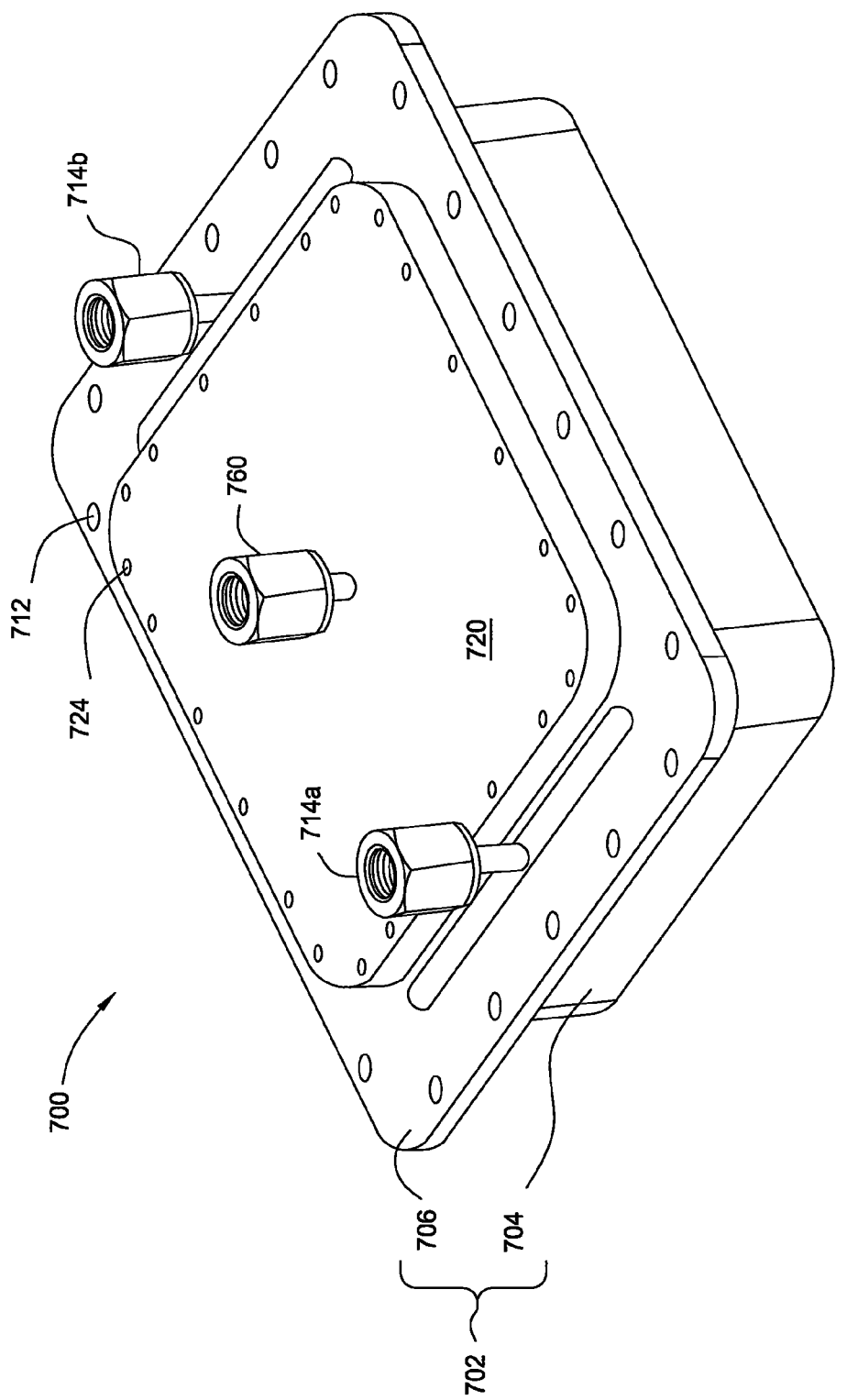
FIGS. 7A-7D depict a showerhead assembly according to embodiments described herein.
Figure 7B:
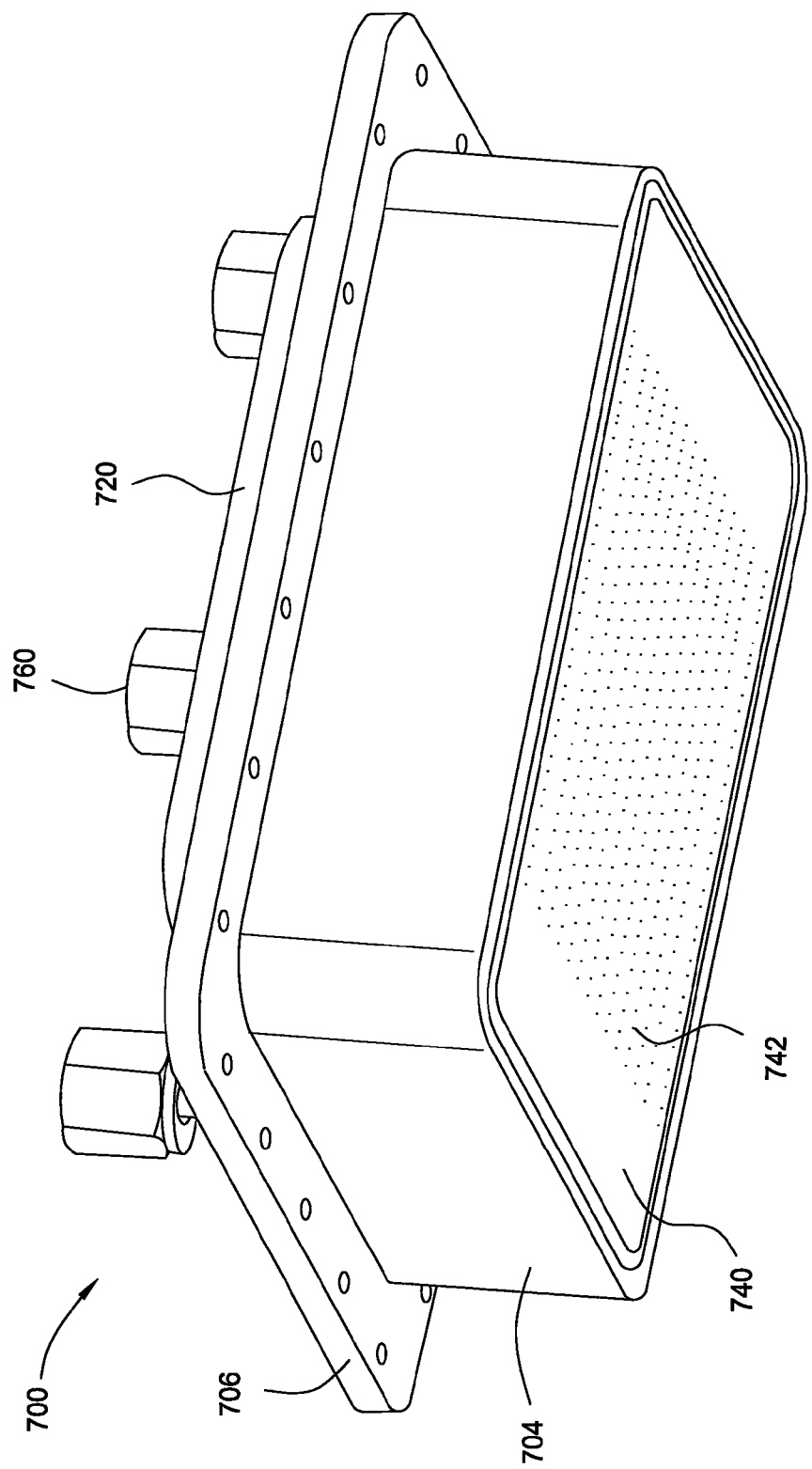
Figure 7C:
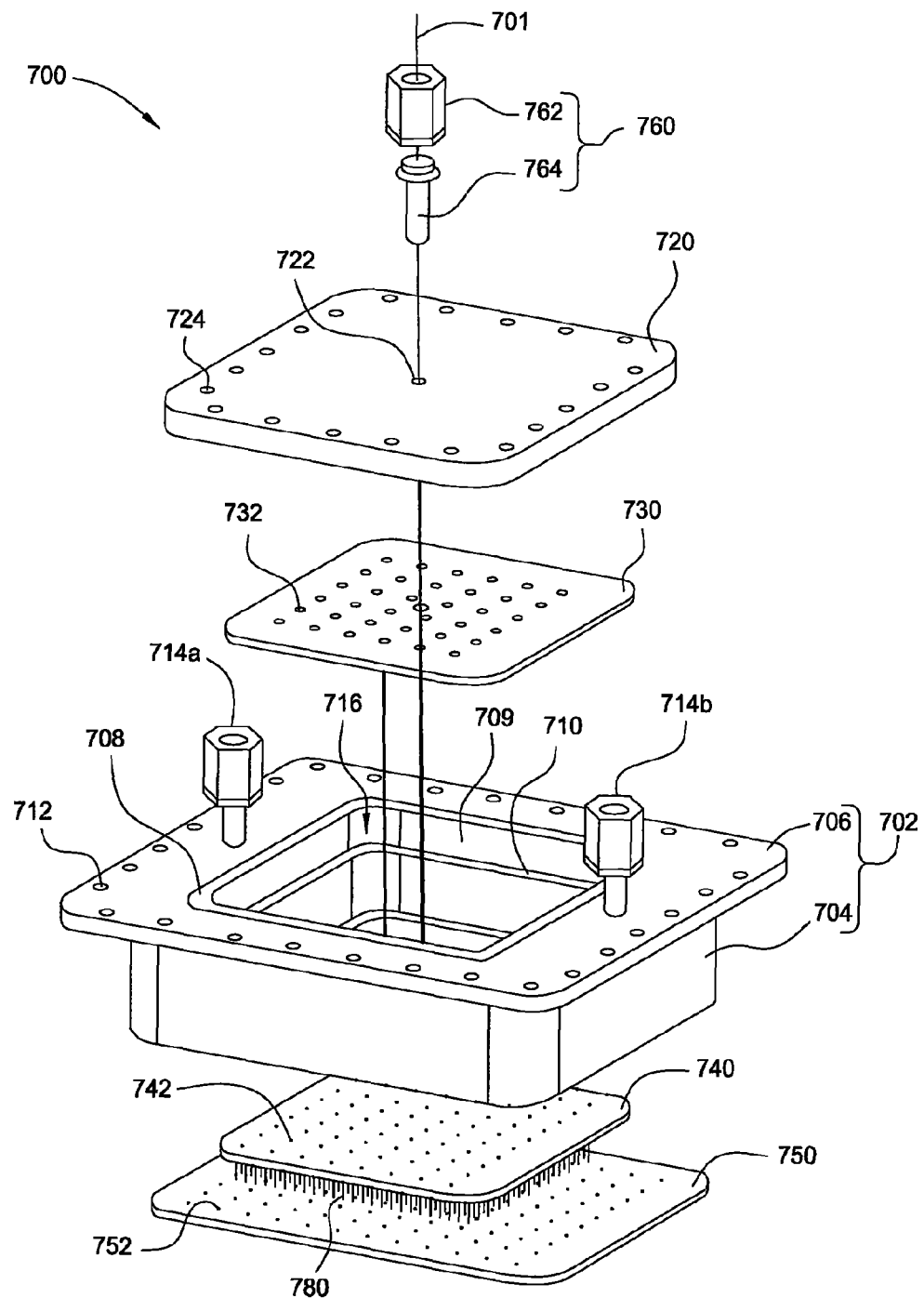
Figure 7D:
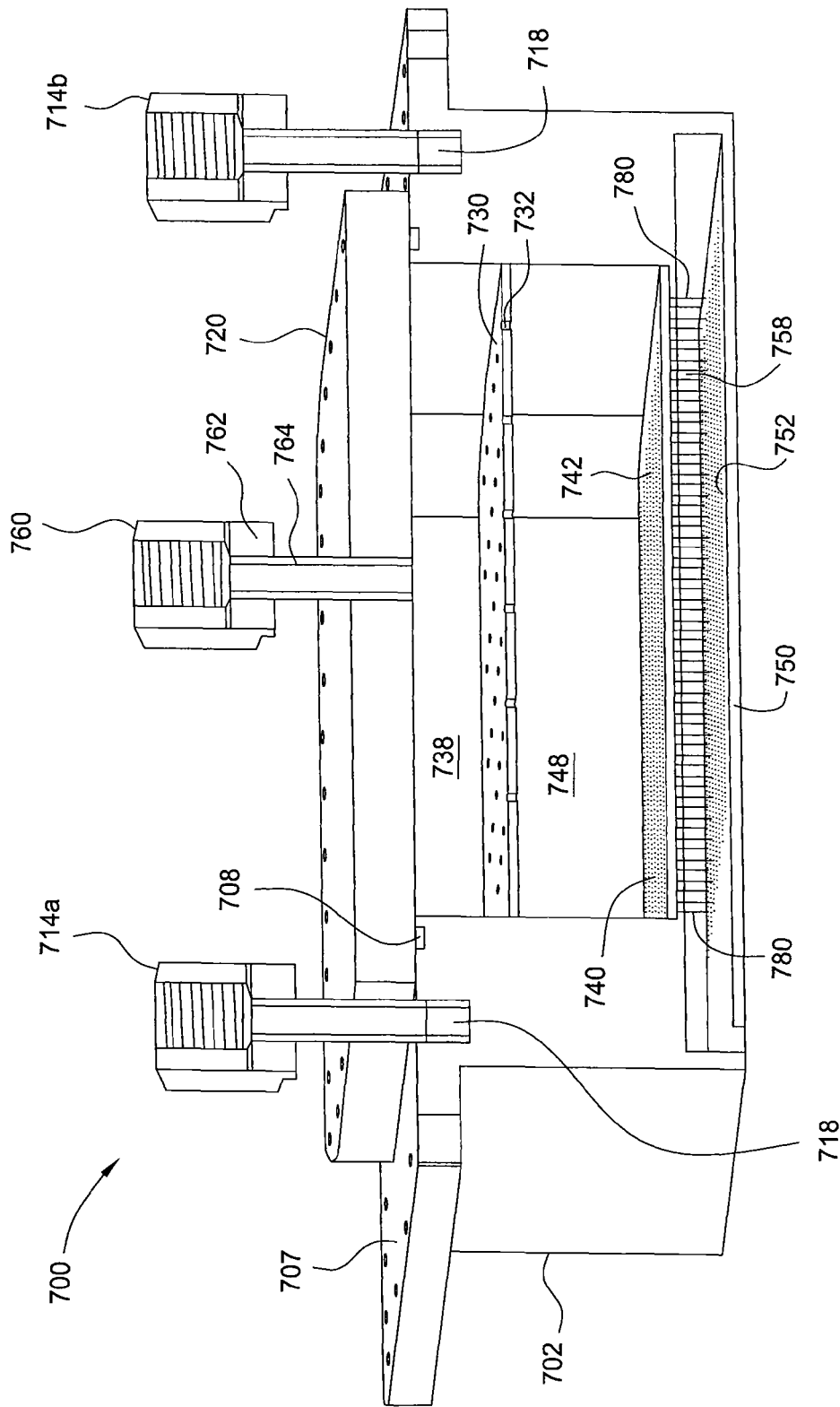
Figure 8A:
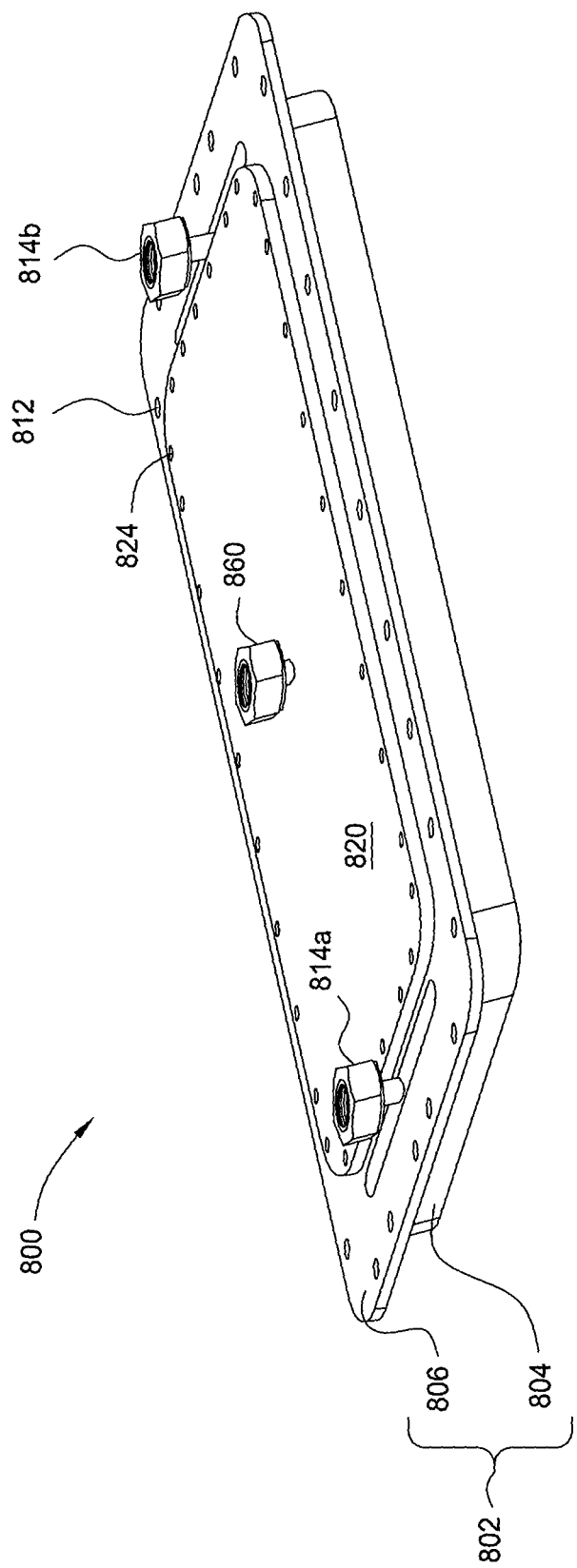
FIGS. 8A-8D depict an exhaust assembly according to embodiments described herein.
Figure 8B:
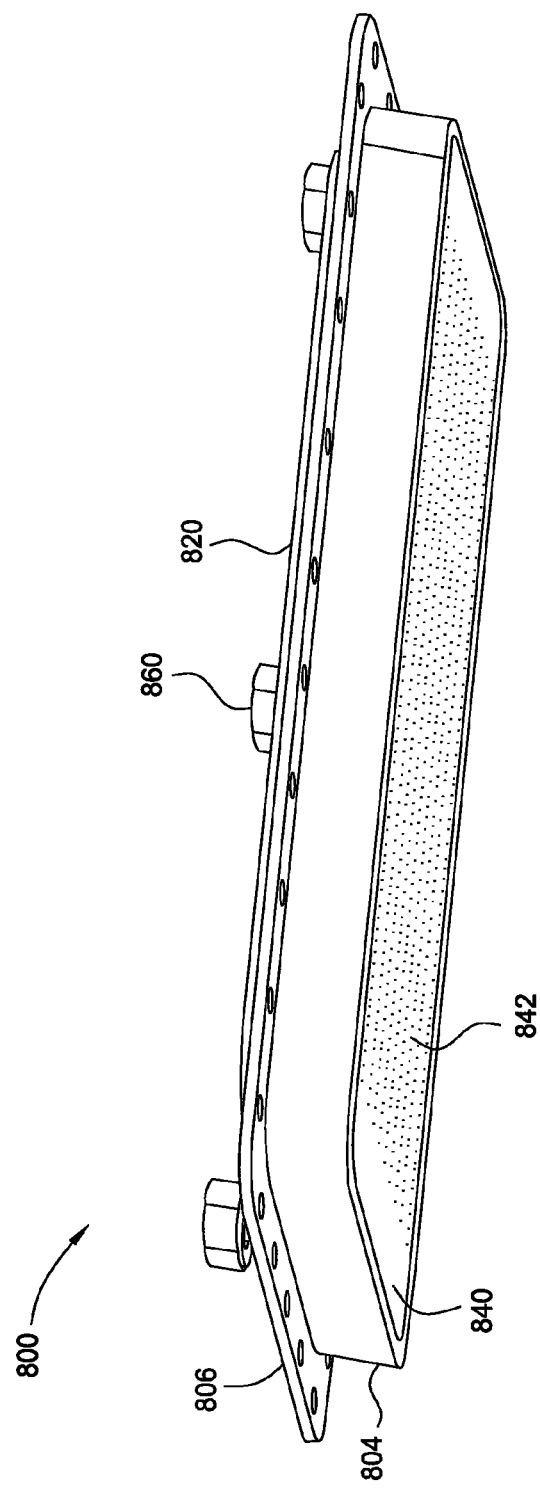
Figure 8C:
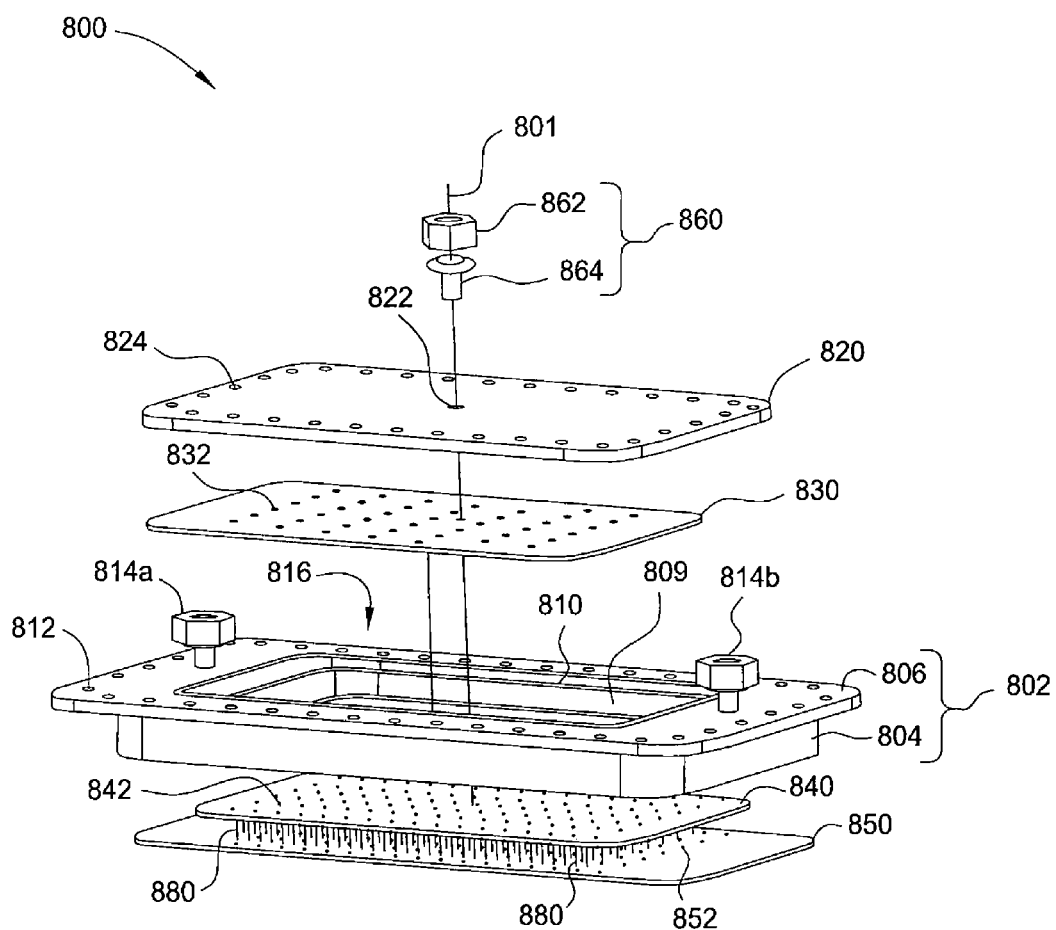
Figure 8D:
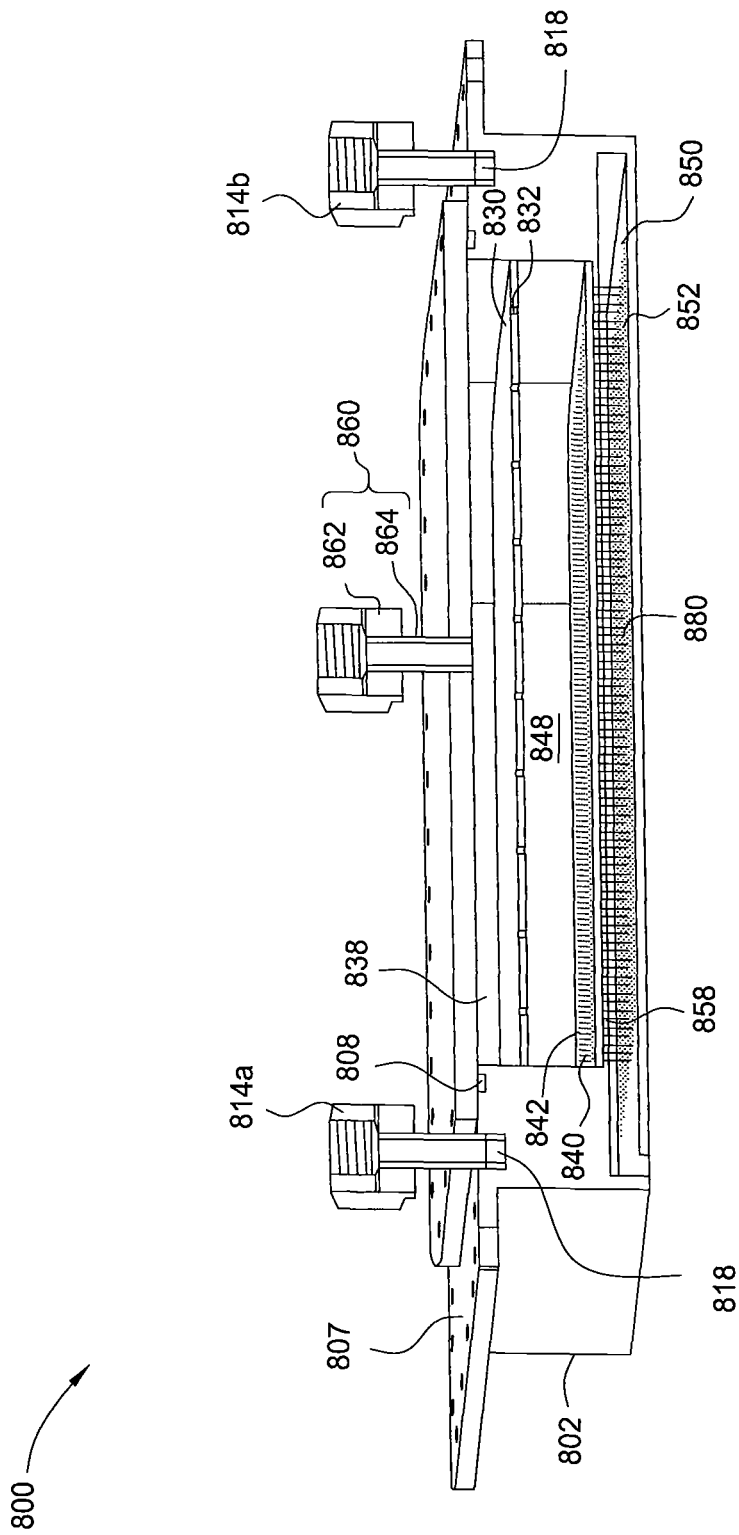

FIG. 6 depicts heating lamp assembly 600, which may be utilized to heat wafers or substrates, as well as wafer carriers or substrate supports within a vapor deposition reactor system, as described in embodiments herein. In one embodiment, heating lamp assembly 600 is provided which includes lamp housing 610 disposed on upper surface 606 of support base 602 and containing first lamp holder 620a and second lamp holder 620b, a plurality of lamps 624 extending from first lamp holder 620a to second lamp holder 620b, wherein each lamp 624 has a split filament or a non-split filament, and reflector 650 disposed on upper surface 606 of support base 602 is disposed between first lamp holder 620a and second lamp holder 620b.

In another embodiment, heating lamp assembly 600 includes lamp housing 610 disposed on upper surface 606 of support base 602 and containing first lamp holder 620a and second lamp holder 620b, a first plurality of lamps 624 extending from first lamp holder 620a to second lamp holder 620b, wherein each lamp of the first plurality has a split filament, a second plurality of lamps 624 extending from first lamp holder 620a to second lamp holder 620b, wherein each lamp of the second plurality has a non-split filament, and reflector 650 disposed on upper surface 606 of support base 602 between first lamp holder 620a and second lamp holder 620b.

In another embodiment, heating lamp assembly 600 includes lamp housing 610 disposed on upper surface 606 of support base 602 and containing first lamp holder 620a and second lamp holder 620b, a first plurality of lamps 624 extending from first lamp holder 620a to second lamp holder 620b, wherein each lamp of the first plurality has a split filament, a second plurality of lamps 624 extending from first lamp holder 620a to second lamp holder 620b, wherein each lamp of the second plurality has a non-split filament, and the first plurality of lamps 624 are sequentially or alternately disposed between the second plurality of lamps 624 while extending between the first and second lamp holders. Also, reflector 650 may be disposed on upper surface 606 of support base 602 between first lamp holder 620a and second lamp holder 620b.

In another embodiment, heating lamp assembly 600 includes lamp housing 610 disposed on upper surface 606 of support base 602 and containing first lamp holder 620a and second lamp holder 620b, a plurality of lamps 624 extending from first lamp holder 620a to second lamp holder 620b, wherein the plurality of lamps 624 contain a first group of lamps and a second group of lamps sequentially or alternately disposed between each other, each lamp of the first group of lamps contains a split filament, and each lamp of the second group of lamps contains a non-split filament, and reflector 650 disposed on upper surface 606 of support base 602 between first lamp holder 620a and second lamp holder 620b.

In another embodiment, heating lamp assembly 600 includes lamp housing 610 disposed on upper surface 606 of support base 602 and containing first lamp holder 620a and second lamp holder 620b, a plurality of posts 622 disposed on first lamp holder 620a and second lamp holder 620b, a plurality of lamps 624 extending from first lamp holder 620a to second lamp holder 620b, wherein each lamp has a split filament or a non-split filament, and reflector 650 disposed on upper surface 606 of support base 602 between first lamp holder 620a and second lamp holder 620b.

In another embodiment, heating lamp assembly 600 includes lamp housing 610 disposed on upper surface 606 of support base 602 and containing first lamp holder 620a and second lamp holder 620b, a plurality of posts 622 disposed on first lamp holder 620a and second lamp holder 620b, a plurality of lamps 624 extending from first lamp holder 620a to second lamp holder 620b, wherein each lamp has a split filament or a non-split filament, and each lamp has a first end disposed between two posts 622 on first lamp holder 620a and a second end disposed between two posts 622 on second lamp holder 620b, and reflector 650 disposed on upper surface 606 of support base 602 between first lamp holder 620a and second lamp holder 620b.

In another embodiment, heating lamp assembly 600 includes lamp housing 610 disposed on upper surface 606 of support base 602 and containing first lamp holder 620a and second lamp holder 620b, a plurality of posts 622 disposed on first lamp holder 620a and second lamp holder 620b, a plurality of lamps 624 extending from first lamp holder 620a to second lamp holder 620b, wherein each lamp has a first end disposed between two posts 622 on first lamp holder 620a and a second end disposed between two posts 622 on second lamp holder 620b, and reflector 650 disposed on upper surface 606 of support base 602 between first lamp holder 620a and second lamp holder 620b.

In another embodiment, heating lamp assembly 600 includes lamp housing 610 disposed on upper surface 606 of support base 602 and containing first lamp holder 620a and second lamp holder 620b, a plurality of posts 622 disposed on first lamp holder 620a and second lamp holder 620b, a plurality of lamps 624 extending from first lamp holder 620a to second lamp holder 620b, and reflector 650 disposed on upper surface 606 of support base 602 between first lamp holder 620a and second lamp holder 620b.

In another embodiment, heating lamp assembly 600 for a vapor deposition reactor system is provided which includes lamp housing 610 disposed on upper surface 606 of support base 602 and containing first lamp holder 620a and second lamp holder 620b, a plurality of lamps 624 extending from first lamp holder 620a to second lamp holder 620b, and reflector 650 disposed on upper surface 606 of support base 602 between first lamp holder 620a and second lamp holder 620b.

In one embodiment, heating lamp assembly 600 contains reflector 650 and/or the upper surface of reflector 650 contains a reflective metal, such as gold, silver, copper, aluminum, nickel, chromium, alloys thereof, or combinations thereof. In many examples, reflector 650 and/or the upper surface of reflector 650 contains gold or a gold alloy. The lower surface of wafer carrier track 400 may be exposed to radiation emitted from lamps 624 within heating lamp assembly 600 and reflected from reflector 650, the upper surface of reflector 650, and/or each mirror 652. The emitted radiation is absorbed by wafer carrier track 400, levitating wafer carrier 460, and wafers 90 within reactor 100. In some embodiments of processes described herein, wafer carrier track 400, levitating wafer carrier 460, and/or wafers 90 may each be independently heated by the emitted radiation to a temperature within a range from about 250° C. to about 350° C., preferably, from about 275° C. to about 325° C., preferably, from about 290° C. to about 310° C., such as about 300° C.

Heating lamp assembly 600 may contain at least one mirror 652 which extends along upper surface 606 of support base 602 and may be perpendicular or substantially perpendicular to upper surface 606 of support base 602. In some examples, mirror 652 may be the inner side surfaces of each lamp holder 620a or 620b having a reflective coating deposited or otherwise disposed thereon. In other examples, mirror 652 may be a prefabricated or modular mirror or reflective material which is attached or adhered to the inner side surfaces of each lamp holder 620a or 620b. The at least one mirror 652 is generally positioned to face towards reflector 650 at an angle of about 90° relative to the plane of surface 606. Preferably, in another embodiment described herein, heating lamp assembly 600 contains two mirrors 652 extending along upper surface 606 of support base 602. Both mirrors may be perpendicular or substantially perpendicular to upper surface 606 of support base 602 and both mirrors 652 may face towards each other with reflector 650 therebetween. Each of the two mirrors 652 faces towards reflector 650 at an angle of about 90° relative to the plane of surface 606. Each mirror and/or the upper surface of each mirror 652 contains a reflective metal, such as gold, silver, copper, aluminum, nickel, chromium, alloys thereof, or combinations thereof. In many examples, each mirror 652 and/or the upper surface of each mirror 652 contains gold or a gold alloy.

In alternative embodiments, not shown, each mirror 652 may be positioned to slightly face away from reflector 650 at an angle of greater than 90° relative to the plane of surface 606, such at an angle within a range from greater than 90° to about 135°. Mirror 652 positioned at an angle of greater than 90° may be utilized to direct energy towards wafer carrier track 400, levitating wafer carrier 460, or other parts or surfaces within reactor 100. In alternative embodiments, heating lamp assembly 600 may contain three or more mirrors 652 along upper surface 606 of support base 602.

The plurality of lamps 624 within heating lamp assembly 600 may number from about 10 lamps to about 100 lamps, preferably, from about 20 lamps to about 50 lamps, and more preferably, from about 30 lamps to about 40 lamps. In one example, heating lamp assembly 600 contains about 34 lamps. Embodiments provide that each lamp may be in electrical contact with a power source, an independent switch, and a controller. The controller may be used to independently control power to each lamp.

In other embodiments, support base 602 and each lamp holder 620a or 620b within heating lamp assembly 600 may independently contain or be made from a material such as steel, stainless steel, 300 series stainless steel, iron, nickel, chromium, molybdenum, aluminum, alloys thereof, or combinations thereof. In some examples, first lamp holder 620a or second lamp holder 620b may independently contain or be made from stainless steel or alloys thereof. First lamp holder 620a or second lamp holder 620b independently may have a cooling coefficient within a range from about 2,000 W/m²-K to about 3,000 W/m²-K, preferably, from about 2,300 W/m²-K to about 2,700 W/m²-K. In one example, the cooling coefficient is about 2,500 W/m²-K. In other embodiments, first lamp holder 620a and second lamp holder 620b each have a thickness within a range from about 0.001 inches to about 0.1 inches.

Figure 10A:
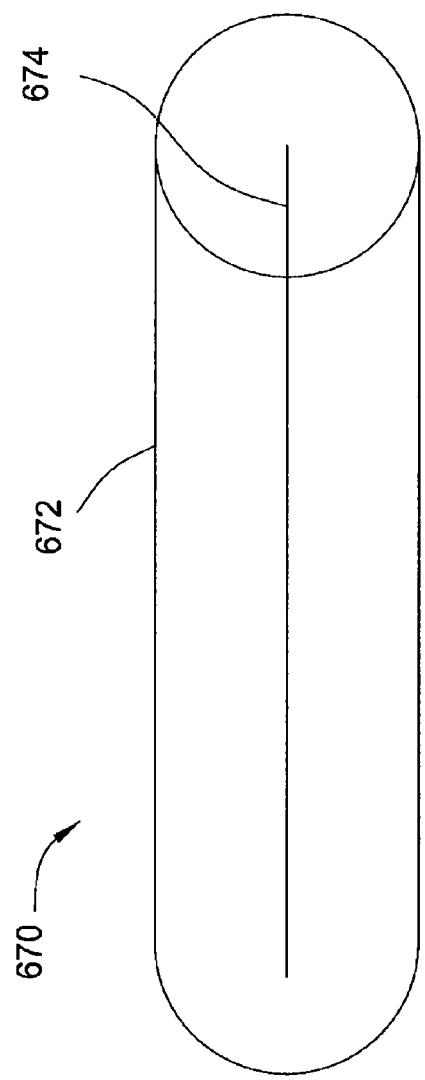
FIGS. 10A-10B depict lamps according to embodiments described herein.
Figure 10B:
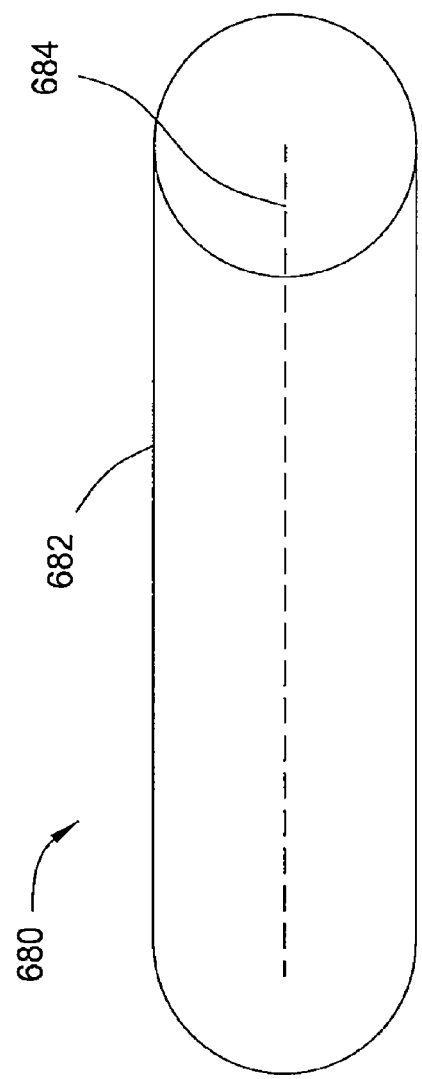

FIG. 10A depicts a non-split filament lamp 670 and FIG. 10B depicts a split filament lamp 680 according to multiple embodiments described herein. Non-split filament lamp 670 contains bulb 672 and non-split filament 674, while split filament lamp 680 contains bulb 682 and non-split filament 684. The plurality of lamps 624, as described throughout embodiments herein, generally contain non-split filament lamps 670, split filament lamps 680, or mixtures of non-split filament lamps 670 and split filament lamps 680.

Figure 11A:
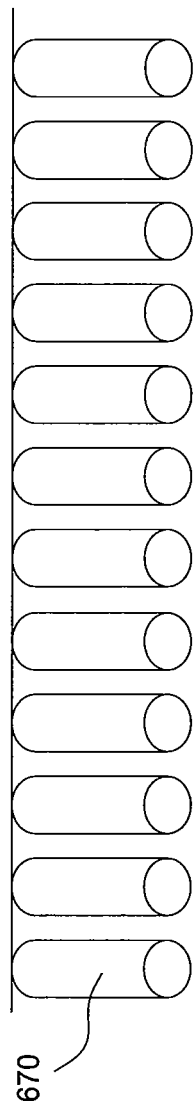
Figure 11B:
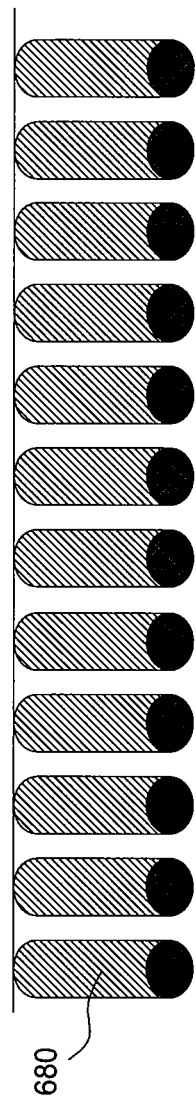
Figure 11C:
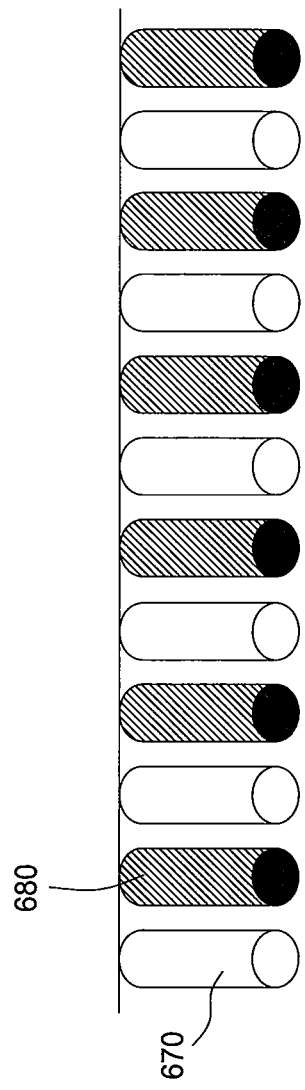

FIGS. 11A-11F depict different pluralities of lamps which may be lamps 624 and utilized to adjust a heat profile on a wafer carrier track, such as wafer carrier track 400, a wafer carrier or substrate support, such as levitating wafer carrier 480, and/or a wafer or a substrate, such as wafers 90, within a vapor deposition reactor, such as reactor 100, as described in embodiments herein. In one embodiment, FIG. 11A illustrates a plurality of lamps containing all non-split filament lamps 670 and FIG. 11B illustrates a plurality of lamps containing all split filament lamps 680. In another embodiment, FIG. 11C illustrates a plurality of lamps sequentially or alternatively containing non-split filament lamps 670 and split filament lamps 680. In other embodiments, FIG. 11D illustrates a plurality of lamps containing a split filament lamp 680 between every two non-split filament lamps 670, while FIG. 11E illustrates a plurality of lamps containing a non-split filament lamp 670 between every two split filament lamps 680. FIG. 11F illustrates a plurality of lamps sequentially or alternatively containing non-split filament lamps 670 and split filament lamps 680, however, each lamp is spaced further apart from each other than the lamps in FIGS. 11A-11E.

In other embodiments, a method for heating a substrate or a substrate susceptor, such as levitating wafer carrier 480, within a vapor deposition reactor system, such as reactor 100, by heating lamp assembly 600 is provided which includes exposing a lower surface of a substrate susceptor to energy emitted from heating lamp assembly 600, and heating the substrate susceptor to a predetermined temperature, wherein heating lamp assembly 600 contains lamp housing 610 disposed on upper surface 606 of support base 602 and containing at least one lamp holder 620a or 620b, a plurality of lamps 624 extending from at least one of the lamp holders, and reflector 650 disposed on upper surface 606 of support base 602, next to the lamp holder, and below the lamps.

Embodiments of the method further provide that heating lamp assembly 600 contains lamps which have split filament lamp 680, a non-split filament, or a mixture of lamps which contain either split or non-split filaments. In one embodiment, each of the lamps has split filament lamp 680. Split filament lamp 680 may have a center between a first end and a second end. The first and second ends of split filament lamps 680 may be maintained warmer than the centers of split filament lamps 680. Therefore, outer edges of the substrate susceptor may be maintained warmer than a center point of the substrate susceptor.

In another embodiment, each of the lamps has non-split filament lamp 670. Non-split filament lamp 670 may have a center between a first end and a second end. The centers of non-split filament lamps 670 may be maintained warmer than the first and second ends of non-split filament lamps 670. Therefore, a center point of the substrate susceptor may be maintained warmer than the outer edges of the substrate susceptor.

In another embodiment, the plurality of lamps 624 have split filament lamps and non-split filament lamps. In one embodiment, split filament lamps 680 and non-split filament lamps 670 are sequentially disposed between each other. Each lamp may independently be in electric contact to a power source and a controller. The method further includes independently adjusting the amount of electricity flowing to each lamp. In one example, split filament lamp 680 may have a center between a first end and a second end. The first and second ends of split filament lamps 680 may be maintained warmer than the centers of split filament lamps 680. Therefore, the outer edges of the substrate susceptor may be maintained warmer than a center point of the substrate susceptor. In another example, non-split filament lamp 670 may have a center between a first end and a second end. The centers of non-split filament lamps 670 may be maintained warmer than the first and second ends of non-split filament lamps 670. Therefore, the center point of the substrate susceptor may be maintained warmer than the outer edges of the substrate susceptor.

In various embodiments, the method provides that the substrate susceptor may be a substrate carrier or a wafer carrier. Lamp housing 610 may have first lamp holder 620a and second lamp holder 620b. First lamp holder 620a and second lamp holder 620b may be parallel or substantially parallel to each other. In one example, reflector 650 may be disposed between first lamp holder 620a and second lamp holder 620b. First lamp holder 620a and second lamp holder 620b each have a thickness within a range from about 0.001 inches to about 0.1 inches. The predetermined thickness of the lamp holders helps maintain a constant temperature of the lamp holders. Therefore, first lamp holder 620a and second lamp holder 620b may each independently be maintained at a temperature within a range from about 275° C. to about 375° C., preferably, from about 300° C. to about 350° C.

FIGS. 7A-7D depict showerhead assembly 700 for a vapor deposition chamber, such as reactor 100, according to embodiments described herein. In one embodiment, showerhead assembly 700 includes body 702 having upper portion 706 and lower portion 704, and centralized channel 716 extending through upper portion 706 and lower portion 704 of body 702. Upper portion 706 contains upper surface 707. Centralized channel 716 extends between inner surfaces 709 of body 702, and parallel to central axis 701 extending through body 702. Diffusion plate 730 contains a plurality of gas holes 732 and is disposed within centralized channel 716. In one example, diffusion plate 730 is disposed on a flange or ledge 710. In another example, showerhead assembly 700 does not contain optional diffusion plate 730 disposed therein.

Showerhead assembly 700 further contains upper tube plate 740 having a plurality of gas holes 742 and disposed within centralized channel 716 below diffusion plate 730. Showerhead assembly 700 also contains lower tube plate 750 having a plurality of gas holes 752 and disposed within centralized channel 716 below upper tube plate 740. A plurality of gas tubes 780 extend from upper tube plate 740 to lower tube plate 750, wherein each tube is coupled to and in fluid communication with an individual hole from the plurality of gas holes 742 and an individual hole from plurality of gas holes 752. Each of the gas tubes 780 extends parallel or substantially parallel to each other as well as to central axis 701 in many embodiments described herein. In an alternative embodiment, not shown, each of the gas tubes 780 may extend at a predetermined angle relative to central axis 701, such as with in a range from about 1° to about 15° or greater.

Showerhead assembly 700 may be used to disperse gases, such as purge gases, precursor gases, and/or carrier gases, by providing a flow path through inlet port 722 and into cavities 738, 748, and 758. Cavity 738 is formed between upper plate 720 and diffusion plate 730 within centralized channel 716. Cavity 748 is formed between diffusion plate 730 and upper tube plate 740 within centralized channel 716. Cavity 758 is formed between upper tube plate 740 and lower tube plate 750 within centralized channel 716.

In another embodiment, showerhead assembly 700 includes body 702 containing upper portion 706 and lower portion 704, wherein upper portion 706 contains a flange extending over lower portion 704, centralized channel 716 extending through upper portion 706 and lower portion 704 of body 702, between inner surfaces 709 of body 702, and parallel to central axis 701 extending through body 702, diffusion plate 730 containing a plurality of gas holes 732 and disposed within centralized channel 716, upper tube plate 740 containing a plurality of gas holes 742 and disposed within centralized channel 716 below diffusion plate 730, lower tube plate 750 containing a plurality of gas holes 752 and disposed within centralized channel 716 below upper tube plate 740, and plurality of gas tubes 780 extending from upper tube plate 740 to lower tube plate 750, wherein each tube is coupled to and in fluid communication with an individual hole from plurality of gas holes 742 and an individual hole from plurality of gas holes 752.

In another embodiment, showerhead assembly 700 includes body 702 containing upper portion 706 and lower portion 704, wherein upper portion 706 adjacently extends from central axis 701 of body 702 further than lower portion 704 and lower portion 704 extends parallel to central axis 701 further than upper portion 706, centralized channel 716 extending through upper portion 706 and lower portion 704 of body 702, between inner surfaces 709 of body 702, and parallel to central axis 701, diffusion plate 730 containing a plurality of gas holes 732 and disposed within centralized channel 716, upper tube plate 740 containing a plurality of gas holes 742 and disposed within centralized channel 716 below diffusion plate 730, lower tube plate 750 containing a plurality of gas holes 752 and disposed within centralized channel 716 below upper tube plate 740, and plurality of gas tubes 780 extending from upper tube plate 740 to lower tube plate 750, wherein each tube is coupled to and in fluid communication with an individual hole from plurality of gas holes 742 and an individual hole from plurality of gas holes 752.

In another embodiment, showerhead assembly 700 includes body 702 containing upper portion 706 and lower portion 704, centralized channel 716 extending through upper portion 706 and lower portion 704 of body 702, between inner surfaces 709 of body 702, and parallel to central axis 701 extending through body 702, diffusion plate 730 containing a plurality of gas holes 732 and disposed within centralized channel 716, upper tube plate 740 containing a plurality of gas holes 742 and disposed within centralized channel 716 below diffusion plate 730, and lower tube plate 750 containing a plurality of gas holes 752 and disposed within centralized channel 716 below upper tube plate 740.

In another embodiment, showerhead assembly 700 includes body 702 containing upper portion 706 and lower portion 704, centralized channel 716 extending through upper portion 706 and lower portion 704 of body 702, between inner surfaces 709 of body 702, and parallel to central axis 701 extending through body 702, upper tube plate 740 containing a plurality of gas holes 732 and disposed within centralized channel 716 below diffusion plate 730, lower tube plate 750 containing a plurality of gas holes 742 and disposed within centralized channel 716 below upper tube plate 740, and plurality of gas tubes 780 extending from upper tube plate 740 to lower tube plate 750, wherein each tube is coupled to and in fluid communication with an individual hole from plurality of gas holes 732 and an individual hole from plurality of gas holes 742.

In some embodiments, showerhead assembly 700 is a modular showerhead assembly. Upper portion 706 and lower portion 704 of body 702 may independently contain a material such as steel, stainless steel, 300 series stainless steel, iron, nickel, chromium, molybdenum, aluminum, alloys thereof, or combinations thereof. In one example, upper portion 706 and lower portion 704 of body 702 each independently contains stainless steel or alloys thereof.

In one embodiment, showerhead assembly 700 contains gaseous inlet 760 disposed on upper portion 706 of body 702. Upper plate 720 may be disposed on an upper surface of upper portion 706 of body 702 and gaseous inlet 760 may be disposed on the plate. The plate may contain a material such as steel, stainless steel, 300 series stainless steel, iron, nickel, chromium, molybdenum, aluminum, alloys thereof, or combinations thereof. In some examples, the plate has inlet port 722 extending therethrough. Gaseous inlet 760 has inlet tube 764 extending through inlet port 722. Inlet nozzle 762 may be coupled to one end of inlet tube 764 and disposed above the plate. In another example, the upper surface of upper portion 706 of the showerhead body has groove 708 which encompasses centralized channel 716. An O-ring may be disposed within groove 708. Diffusion plate 730 may be disposed on a ledge or a flange protruding from side surfaces of body 702 within centralized channel 716.

In one embodiment, plurality of gas tubes 780 may have tubes numbering within a range from about 500 tubes to about 1,500 tubes, preferably, from about 700 tubes to about 1,200 tubes, and more preferably, from about 800 tubes to about 1,000 tubes, for example, about 900 tubes. In some examples, each tube may have a length within a range from about 0.5 cm to about 2 cm, preferably, from about 0.8 cm to about 1.2 cm, for example, about 1 cm. In other examples, each tube may have a diameter within a range from about 0.005 inches to about 0.05 inches, preferably, from about 0.01 inches to about 0.03 inches. In some examples, the tubes are hypodermic needles. The tubes may contain or be made from a material such as steel, stainless steel, 300 series stainless steel, iron, nickel, chromium, molybdenum, aluminum, alloys thereof, or combinations thereof.

In one embodiment, each hole of plurality of gas holes 732 on diffusion plate 730 has a larger diameter than each hole of plurality of gas holes 742 on upper tube plate 740. Further, each hole of plurality of gas holes 732 on diffusion plate 730 has a larger diameter than each hole of plurality of gas holes 752 on the lower diffusion plate. Also, each hole of plurality of gas holes 742 on upper tube plate 740 has the same diameter or substantially the same diameter as each hole of plurality of gas holes 752 on lower tube plate 750.

In one embodiment, diffusion plate 730 may contain or be made from a material such as steel, stainless steel, 300 series stainless steel, iron, nickel, chromium, molybdenum, aluminum, alloys thereof, or combinations thereof. Diffusion plate 730 may contain holes numbering within a range from about 20 holes to about 200 holes, preferably, from about 25 holes to about 75 holes, and more preferably, from about 40 holes to about 60 holes. Each hole of diffusion plate 730 may have a diameter within a range from about 0.005 inches to about 0.05 inches, preferably, from about 0.01 inches to about 0.03 inches. In another embodiment, upper tube plate 740 and/or lower tube plate 750 may independently contain or be independently made from a material such as steel, stainless steel, 300 series stainless steel, iron, nickel, chromium, molybdenum, aluminum, alloys thereof, or combinations thereof. Upper tube plate 740 and/or lower tube plate 750 may independently have from about 500 holes to about 1,500 holes, preferably, from about 700 holes to about 1,200 holes, and more preferably, from about 800 holes to about 1,000 holes. Each hole of upper tube plate 740 and/or lower tube plate 750 may independently have a diameter within a range from about 0.005 inches to about 0.05 inches, preferably, from about 0.01 inches to about 0.03 inches. In another embodiment, showerhead assembly 700 may have a gaseous hole density and/or number of tubes within a range from about 10 holes/in$^2$ (holes per square inch) to about 60 holes/in$^2$, preferably, from about 15 holes/in$^2$ to about 45 holes/in$^2$, and more preferably, from about 20 holes/in$^2$ to about 36 holes/in$^2$.

In one example, the upper surface of upper portion 706 of body 702 of showerhead assembly 700 is a metallic plate. In other examples, showerhead assembly 700 may have a rectangular geometry or a square geometry. In another embodiment, body 702 of showerhead assembly 700 further contains a temperature regulation system. The temperature regulation system, such as temperature regulation system 190, may contain liquid or fluid passageway 718 extending within body 702, and may have inlet 714a and outlet 714b coupled to and in fluid communication with fluid passageway 718. Inlet 714a and outlet 714b may be independently coupled to and in fluid communication with a liquid reservoir or at least one heat exchanger, such as heat exchangers 180a, 180b, or 180c within temperature regulation system 190, as depicted in FIG. 1F.

FIGS. 8A-8D depict exhaust assembly 800 for a vapor deposition chamber, such as reactor 100, according embodiments described herein. In one embodiment, exhaust assembly 800 includes body 802 having upper portion 806 and lower portion 804, and centralized channel 816 extending through upper portion 806 and lower portion 804 of body 802. Upper portion 806 contains upper surface 807. Centralized channel 816 extends between inner surfaces 809 of body 802, and parallel to central axis 801 extending through body 802. Diffusion plate 830 contains a plurality of gas holes 832 and is disposed within centralized channel 816. In one example, diffusion plate 830 is disposed on a flange or ledge 810. In another example, exhaust assembly 800 does not contain optional diffusion plate 830 disposed therein.

Exhaust assembly 800 further contains upper tube plate 840 having a plurality of gas holes 842 and disposed within centralized channel 816 below diffusion plate 830. Exhaust assembly 800 also contains lower tube plate 850 having a plurality of gas holes 854 and disposed within centralized channel 816 below upper tube plate 840. A plurality of exhaust tubes 880 extend from upper tube plate 840 to lower tube plate 850, wherein each tube is coupled to and in fluid communication with an individual hole from the plurality of gas holes 842 and an individual hole from plurality of gas holes 854. Each of the exhaust tubes 880 extends parallel or substantially parallel to each other as well as to central axis 801 in many embodiments described herein. In an alternative embodiment, each of the exhaust tubes 880 may extend at a predetermined angle relative to central axis 801, such as with in a range from about 1° to about 15° or greater.

Exhaust assembly 800 pulls a vacuum or reduces internal pressure though exhaust port 822 and cavities 838, 848, and 858. Cavity 838 is formed between upper plate 820 and diffusion plate 830 within centralized channel 816. Cavity 848 is formed between diffusion plate 830 and upper tube plate 840 within centralized channel 816. Cavity 858 is formed between upper tube plate 840 and lower tube plate 850 within centralized channel 816.

In another embodiment, exhaust assembly 800 includes body 802 containing upper portion 806 and lower portion 804, wherein upper portion 806 contains a flange extending over lower portion 804, centralized channel 816 extending through upper portion 806 and lower portion 804 of body 802, between inner surfaces 809 of body 802, and parallel to central axis 801 extending through body 802, diffusion plate 830 containing a plurality of gas holes 832 and disposed within centralized channel 816, upper tube plate 840 containing a plurality of gas holes 842 and disposed within centralized channel 816 below diffusion plate 830, lower tube plate 850 containing a plurality of gas holes 854 and disposed within centralized channel 816 below upper tube plate 840, and plurality of exhaust tubes 880 extending from upper tube plate 840 to lower tube plate 850, wherein each tube is coupled to and in fluid communication with an individual hole from plurality of gas holes 842 and an individual hole from plurality of gas holes 854.

In another embodiment, exhaust assembly 800 includes body 802 containing upper portion 806 and lower portion 804, wherein upper portion 806 adjacently extends from central axis 801 of body 802 further than lower portion 804 and lower portion 804 extends parallel to central axis 801 further than upper portion 806, centralized channel 816 extending through upper portion 806 and lower portion 804 of body 802, between inner surfaces 809 of body 802, and parallel to central axis 801, diffusion plate 830 containing a plurality of gas holes 832 and disposed within centralized channel 816, upper tube plate 840 containing a plurality of gas holes 842 and disposed within centralized channel 816 below diffusion plate 830, lower tube plate 850 containing a plurality of gas holes 854 and disposed within centralized channel 816 below upper tube plate 840, and plurality of exhaust tubes 880 extending from upper tube plate 840 to lower tube plate 850, wherein each tube is coupled to and in fluid communication with an individual hole from plurality of gas holes 842 and an individual hole from plurality of gas holes 854.

In another embodiment, exhaust assembly 800 includes body 802 containing upper portion 806 and lower portion 804, centralized channel 816 extending through upper portion 806 and lower portion 804 of body 802, between inner surfaces 809 of body 802, and parallel to central axis 801 extending through body 802, diffusion plate 830 containing a plurality of gas holes 832 and disposed within centralized channel 816, upper tube plate 840 containing a plurality of gas holes 842 and disposed within centralized channel 816 below diffusion plate 830, and lower tube plate 850 containing a plurality of gas holes 854 and disposed within centralized channel 816 below upper tube plate 840.

In another embodiment, exhaust assembly 800 includes body 802 containing upper portion 806 and lower portion 804, centralized channel 816 extending through upper portion 806 and lower portion 804 of body 802, between inner surfaces 809 of body 802, and parallel to central axis 801 extending through body 802, upper tube plate 840 containing a plurality of gas holes 832 and disposed within centralized channel 816 below diffusion plate 830, lower tube plate 850 containing a plurality of gas holes 842 and disposed within centralized channel 816 below upper tube plate 840, and plurality of exhaust tubes 880 extending from upper tube plate 840 to lower tube plate 850, wherein each tube is coupled to and in fluid communication with an individual hole from plurality of gas holes 832 and an individual hole from plurality of gas holes 842.

In some embodiments, exhaust assembly 800 is a modular showerhead assembly. Upper portion 806 and lower portion 804 of body 802 may independently contain a material such as steel, stainless steel, 300 series stainless steel, iron, nickel, chromium, molybdenum, aluminum, alloys thereof, or combinations thereof. In one example, upper portion 806 and lower portion 804 of body 802 each independently contains stainless steel or alloys thereof.

In one embodiment, exhaust assembly 800 contains exhaust outlet 860 disposed on upper portion 806 of body 802. Upper plate 820 may be disposed on an upper surface of upper portion 806 of body 802 and exhaust outlet 860 may be disposed on the plate. The plate may contain a material such as steel, stainless steel, 300 series stainless steel, iron, nickel, chromium, molybdenum, aluminum, alloys thereof, or combinations thereof. In some examples, the plate has exhaust port 822 extending therethrough. Exhaust outlet 860 has exhaust outlet tube 864 extending through exhaust port 822. Exhaust nozzle 862 may be coupled to one end of exhaust outlet tube 864 and disposed above the plate. In another example, the upper surface of upper portion 806 of the showerhead body has groove 808 which encompasses centralized channel 816. An O-ring may be disposed within groove 808. Diffusion plate 830 may be disposed on a ledge or a flange protruding from side surfaces of body 802 within centralized channel 816.

In one embodiment, plurality of exhaust tubes 880 may have tubes numbering within a range from about 5 tubes to about 50 tubes, preferably, from about 7 tubes to about 30 tubes, and more preferably, from about 10 tubes to about 20 tubes, for example, about 14 tubes. In some examples, each tube may have a length within a range from about 0.5 cm to about 2 cm, preferably, from about 0.8 cm to about 1.2 cm, for example, about 1 cm. In other examples, each tube may have a diameter within a range from about 0.1 inches to about 0.4 inches, preferably, from about 0.2 inches to about 0.3 inches, for example, about 0.23 inches. In one example, exhaust assembly 800 contains a single row of tubes and holes.

In another embodiment, plurality of exhaust tubes 880 may have tubes numbering within a range from about 500 tubes to about 1,500 tubes, preferably, from about 700 tubes to about 1,200 tubes, and more preferably, from about 800 tubes to about 1,000 tubes, for example, about 900 tubes. In some examples, each tube may have a length within a range from about 0.5 cm to about 2 cm, preferably, from about 0.8 cm to about 1.2 cm, for example, about 1 cm. In other examples, each tube may have a diameter within a range from about 0.005 inches to about 0.05 inches, preferably, from about 0.01 inches to about 0.03 inches.

In some examples, the tubes are hypodermic needles. The tubes may contain or be made from a material such as steel, stainless steel, 300 series stainless steel, iron, nickel, chromium, molybdenum, aluminum, alloys thereof, or combinations thereof.

In one embodiment, each hole of plurality of gas holes 832 on diffusion plate 830 has a larger diameter than each hole of plurality of gas holes 842 on upper tube plate 840. Further, each hole of plurality of gas holes 832 on diffusion plate 830 has a larger diameter than each hole of plurality of gas holes 854 on the lower diffusion plate. Also, each hole of plurality of gas holes 842 on upper tube plate 840 has the same diameter or substantially the same diameter as each hole of plurality of gas holes 854 on lower tube plate 850.

In one embodiment, diffusion plate 830 may contain or be made from a material such as steel, stainless steel, 300 series stainless steel, iron, nickel, chromium, molybdenum, aluminum, alloys thereof, or combinations thereof. In another embodiment, diffusion plate 830 may contain holes numbering within a range from about 5 holes to about 50 holes, preferably, from about 7 holes to about 30 holes, and more preferably, from about 10 holes to about 20 holes, for example, about 14 holes. Each hole of diffusion plate 830 may have a diameter within a range from about 0.1 inches to about 0.4 inches, preferably, from about 0.2 inches to about 0.3 inches, for example, about 0.23 inches. In one example, diffusion plate 830 contains a single row of holes. In another embodiment, diffusion plate 830 may contain holes numbering within a range from about 20 holes to about 200 holes, preferably, from about 25 holes to about 55 holes, and more preferably, from about 40 holes to about 60 holes. Each hole of diffusion plate 830 may have a diameter within a range from about 0.005 inches to about 0.05 inches, preferably, from about 0.01 inches to about 0.03 inches.

In another embodiment, upper tube plate 840 and/or lower tube plate 850 may independently contain or be independently made from a material such as steel, stainless steel, 300 series stainless steel, iron, nickel, chromium, molybdenum, aluminum, alloys thereof, or combinations thereof. In one embodiment, upper tube plate 840 and/or lower tube plate 850 may independently have holes numbering within a range from about 5 holes to about 50 holes, preferably, from about 7 holes to about 30 holes, and more preferably, from about 10 holes to about 20 holes, for example, about 14 holes. Each hole of upper tube plate 840 and/or lower tube plate 850 may independently have a diameter within a range from about 0.1 inches to about 0.4 inches, preferably, from about 0.2 inches to about 0.3 inches, for example, about 0.23 inches. In another embodiment, exhaust assembly 800 may have a gaseous hole density and/or number of tubes within a range from about 5 holes/in$^2$ (holes per square inch) to about 30 holes/in$^2$, preferably, from about 8 holes/in$^2$ to about 25 holes/in$^2$, and more preferably, from about 10 holes/in$^2$ to about 20 holes/in$^2$.

In another embodiment, upper tube plate 840 and/or lower tube plate 850 may independently have from about 500 holes to about 1,500 holes, preferably, from about 700 holes to about 1,200 holes, and more preferably, from about 800 holes to about 1,000 holes. Each hole of upper tube plate 840 and/or lower tube plate 850 may independently have a diameter within a range from about 0.005 inches to about 0.05 inches, preferably, from about 0.01 inches to about 0.03 inches.

In one example, the upper surface of upper portion 806 of body 802 of exhaust assembly 800 is a metallic plate. In other examples, exhaust assembly 800 may have a rectangular geometry or a square geometry. In another embodiment, body 802 of exhaust assembly 800 further contains a temperature regulation system. The temperature regulation system, such as temperature regulation system 190, may contain liquid or fluid passageway 818 extending within body 802, and may have inlet 814a and outlet 814b coupled to and in fluid communication with fluid passageway 818. Inlet 814a and outlet 814b may be independently coupled to and in fluid communication with a liquid reservoir or at least one heat exchanger, such as heat exchangers 180a, 180b, or 180c within temperature regulation system 190, as depicted in FIG. 1F.

In other embodiments, exhaust assembly 800, which may be utilized in a vapor deposition chamber, has body 802 containing upper portion 806 disposed on lower portion 804, centralized channel 816 extending through upper portion 806 and lower portion 804 of body 802, between inner surfaces 809 of body 802, and parallel to central axis 801 extending through body 802, exhaust outlet 860 disposed on upper portion 806 of body 802, diffusion plate 830 containing a plurality of gas holes 832 and disposed within centralized channel 816, upper tube plate 840 containing a plurality of gas holes 842 and disposed within centralized channel 816 below diffusion plate 830, lower tube plate 850 containing a plurality of gas holes 852 and disposed within centralized channel 816 below upper tube plate 840, and plurality of exhaust tubes 880 extending from upper tube plate 840 to lower tube plate 850, wherein each tube is coupled to and in fluid communication with an individual hole from plurality of gas holes 842 and an individual hole from plurality of gas holes 852.

Exhaust assembly 800 may further contain upper plate 820 disposed on an upper surface of upper portion 806 of body 802. Exhaust outlet 860 may be disposed on upper plate 820. Upper plate 820 may contain or be made from a material such as steel, stainless steel, 300 series stainless steel, iron, nickel, chromium, molybdenum, aluminum, alloys thereof, or combinations thereof. Upper plate 820 usually has an exhaust port extending therethrough. Exhaust outlet 860 may have exhaust outlet tube 864 extending through exhaust port 822. In one example, exhaust nozzle 862 may be coupled to one end of exhaust outlet tube 864 and disposed above upper plate 820. In another example, the upper surface of upper portion 806 of the exhaust assembly body has groove 808 which encompasses centralized channel 816. An O-ring may be disposed within groove 808. Diffusion plate 830 may be disposed on a ledge or a flange protruding from side surfaces of body 802 within centralized channel 816.

Figure 9B:
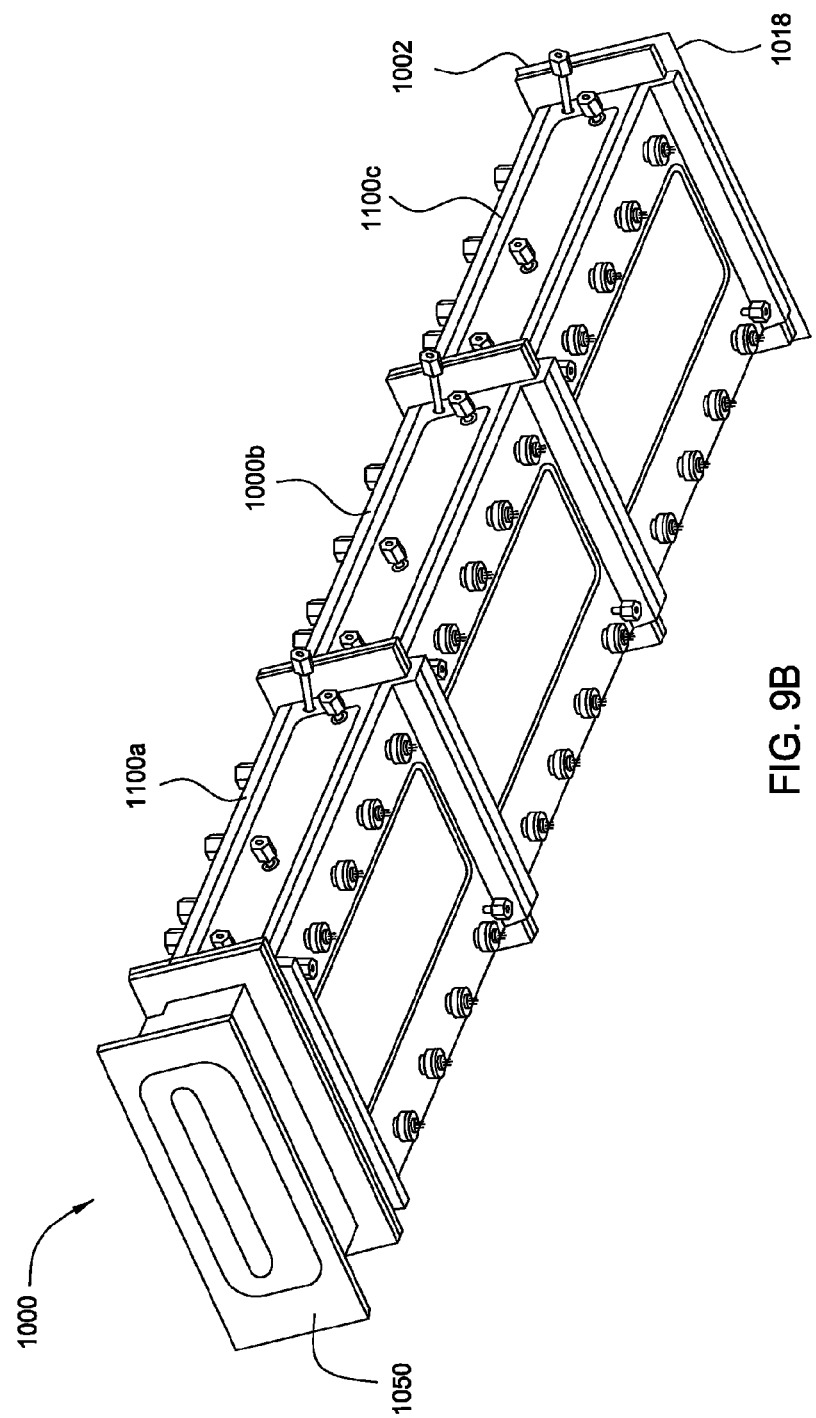
Figure 9C:
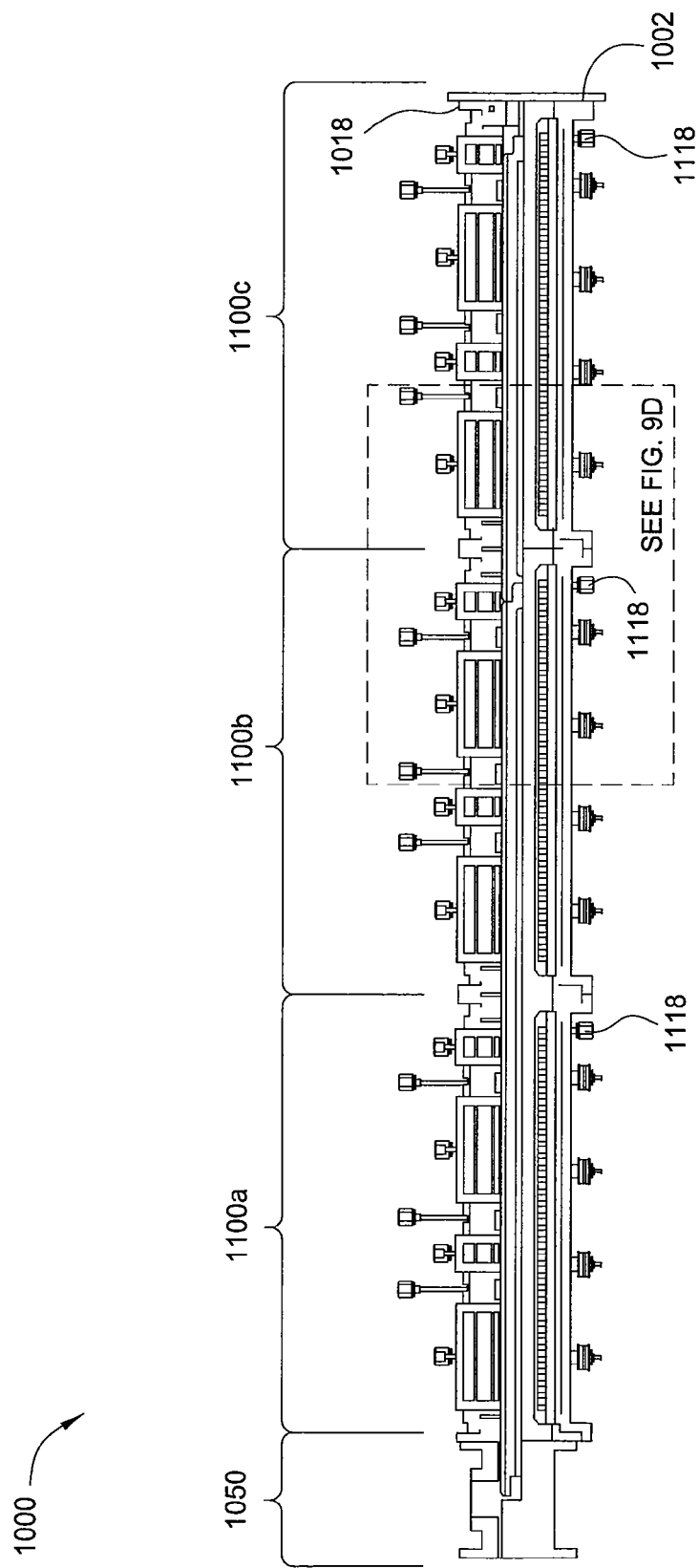

FIGS. 9A-9F depict reactor system 1000, a CVD system, containing multiple reactors 1100a, 1100b, and 1100c, as described by embodiments herein. Reactors 1100a, 1100b, and 1100c may be the same reactors as reactor 100 or may be a modified derivative of reactor 100. In one embodiment, reactor 1100a is coupled to reactor 1100b, which is coupled to reactor 1100c, as illustrated in FIGS. 9A-9C. One end of reactor 1100a is coupled to end cap 1050 at interface 1012, while the other end of reactor 1100a is coupled to one end of reactor 1100b at interface 1014. The other end of reactor 1100b is coupled to one end of reactor 1100c at interface 1016, while the other end of reactor 1100c is coupled to end plate 1002 at interface 1016.

Figure 9D:
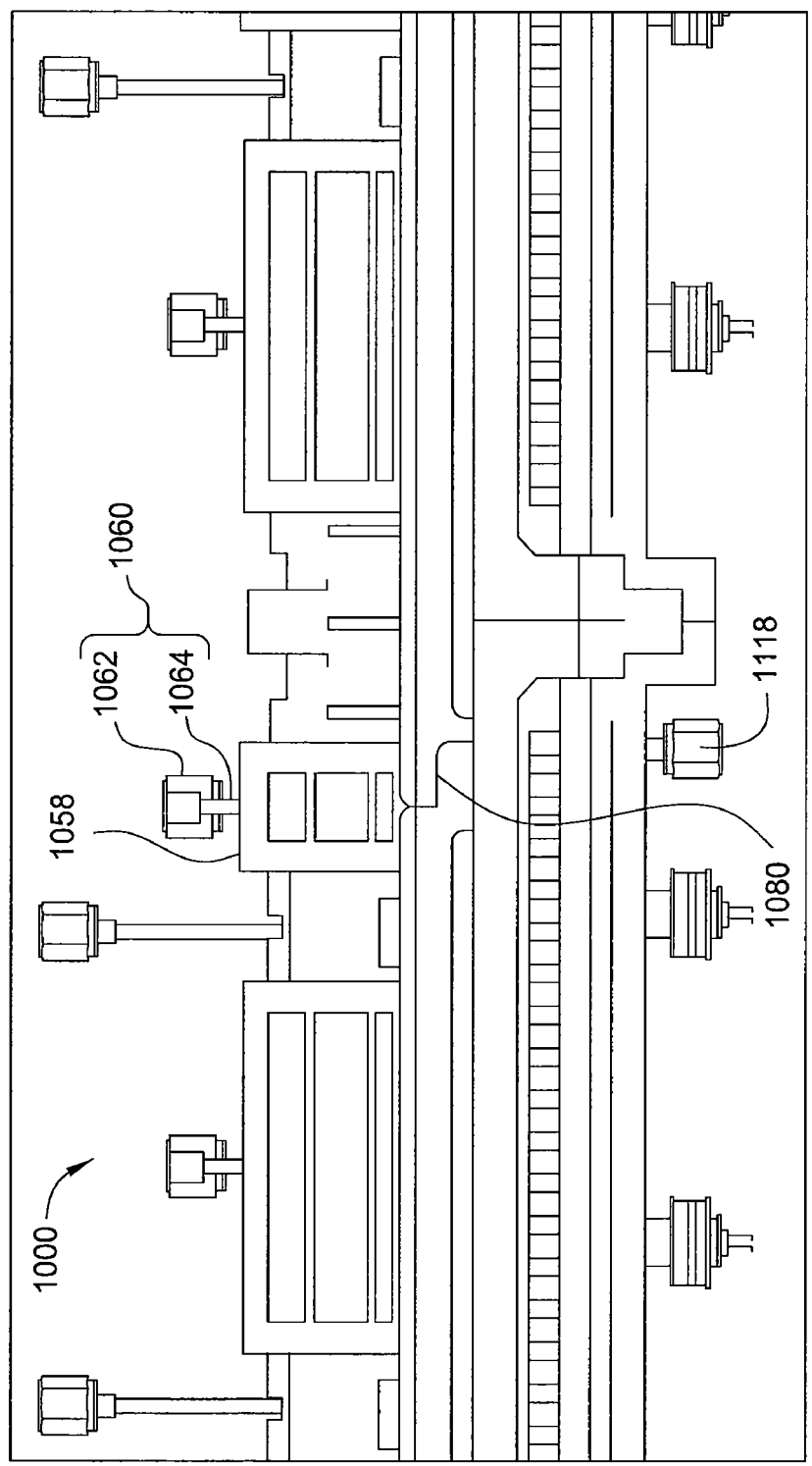
Figure 9E:
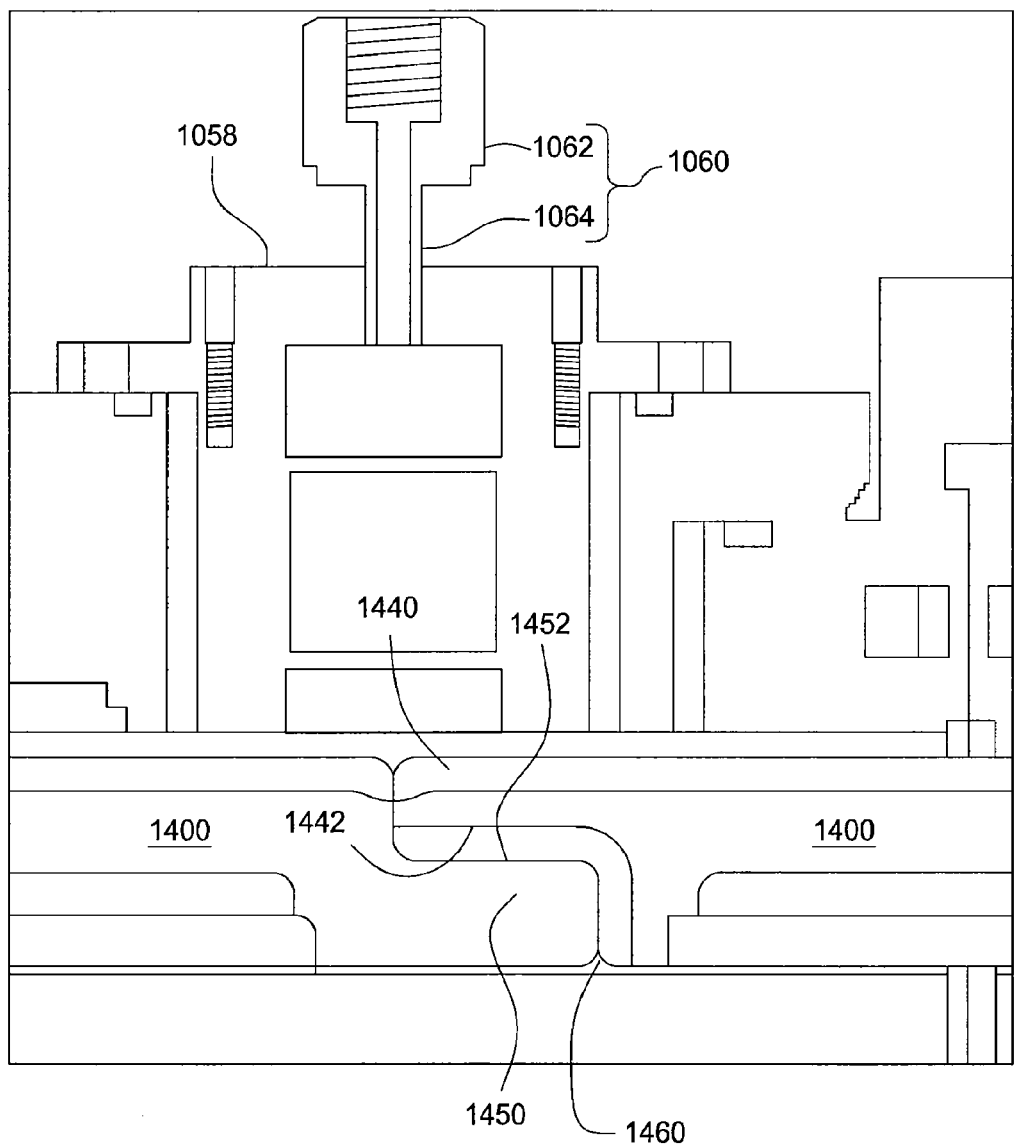
Figure 9F:
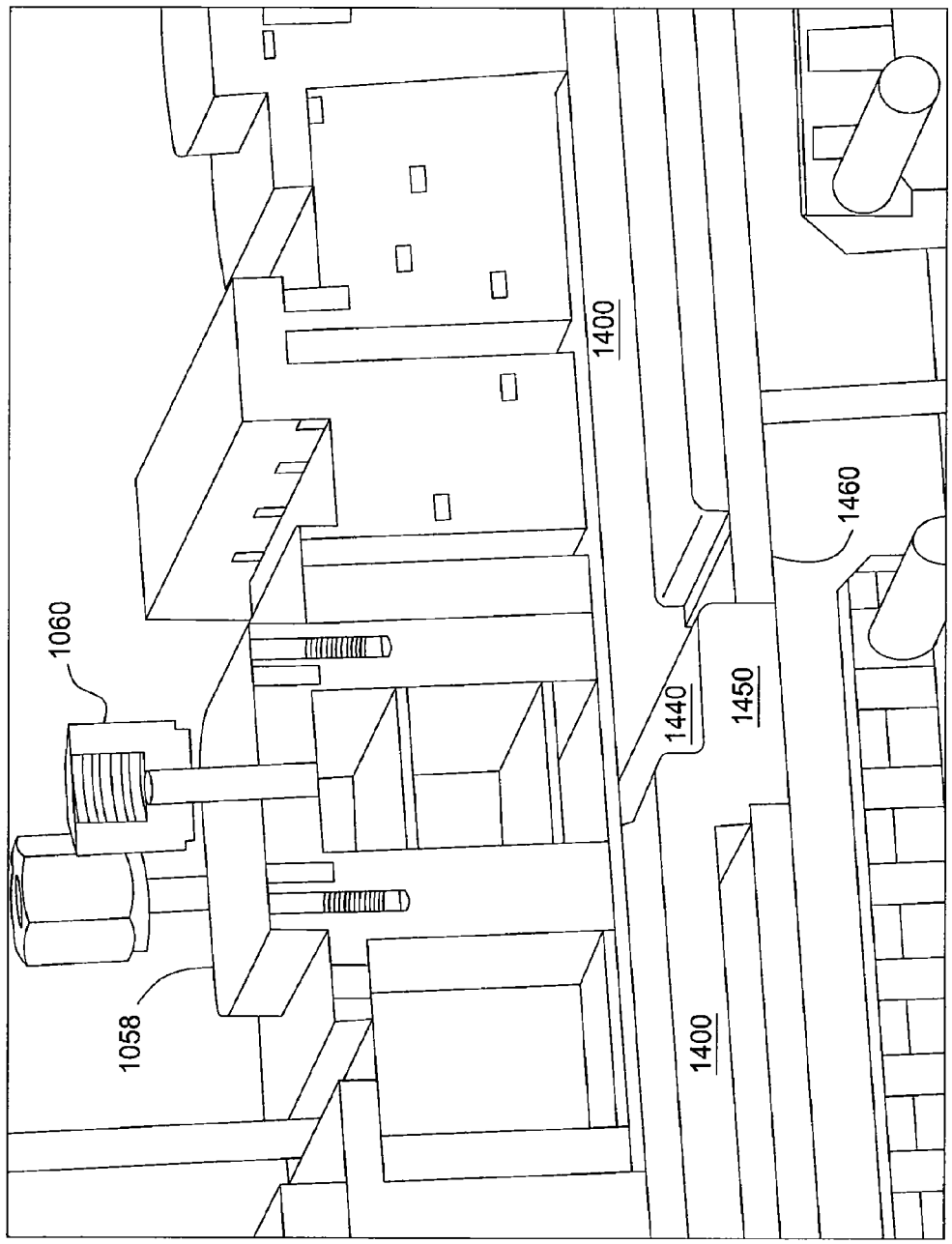

FIGS. 9D-9F depicts a close-up view of portions of interface 1018 between reactors 1100b and 1100c. In another embodiment, reactor 1100b contains wafer carrier track 1400 which has lower lap joint 1450 and reactor 1100c contains wafer carrier track 1400 which has upper lap joint 1440.

Exhaust purge port 1080 may be disposed between wafer carrier track 1400 within reactor 1100b and wafer carrier track 1400 within reactor 1100c. Exhaust purge port 1080 is in fluid communication with passageway 1460, which extends from exhaust purge port 1080 to below wafer carrier tracks 1400. Exhaust assembly 1058, similar to exhaust assembly 800, is disposed on the reactor lid assembly of reactor 1100b. Exhaust assembly 1058 may be used to remove gases from exhaust purge port 1080. Exhaust assembly 1058 contains exhaust outlet 1060, exhaust nozzle 1062, and exhaust tube 1064.

In another embodiment, reactor system 1000 may contain additional reactors (not shown) besides reactors 1100a, 1100b, and 1100c. In one example, a fourth reactor is included in reactor system 1000. In another example, a fifth reactor is included in reactor system 1000. In different configurations and embodiments, reactor system 1000 may have 1, 2, 3, 4, 5, 6, 7, 8, 9, 10, or more reactors. In other embodiments, reactors 1100a, 1100b, and 1100c or other reactors which are not shown, may contain 1, 2, 3, 4, or more showerhead assemblies in each reactor (not shown).

In alternative embodiments described herein, other configurations of reactors 1100a, 1100b, and 1100c are provided, but not illustrated in the drawings. In one embodiment, each of the reactors 1100a, 1100b, or 1100c may contain three exhaust assemblies separated by two showerhead assemblies so that any of the reactor lid assemblies may sequentially contain a first exhaust assembly, a first showerhead assembly, a second exhaust assembly, a second showerhead assembly, and a third exhaust assembly. In another embodiment, each of the reactors 1100a, 1100b, or 1100c may contain three isolator assemblies separated by two showerhead assemblies so that the reactor lid assembly sequentially contain a first isolator assembly, a first showerhead assembly, a second isolator assembly, a second showerhead assembly, and a third isolator assembly.

In another embodiment, each of the reactors 1100a, 1100b, or 1100c may contain two isolator assemblies and one exhaust assembly separated by two showerhead assemblies so that any of the reactor lid assemblies may sequentially contain a first isolator assembly, a first showerhead assembly, a second isolator assembly, a second showerhead assembly, and a first exhaust assembly. In another example, any of the reactor lid assemblies may sequentially contain a first isolator assembly, a first showerhead assembly, a first exhaust assembly, a second showerhead assembly, and a second isolator assembly. In another example, any of the reactor lid assemblies may sequentially contain a first exhaust assembly, a first showerhead assembly, a first isolator assembly, a second showerhead assembly, and a second isolator assembly.

In another embodiment, each of the reactors 1100a, 1100b, or 1100c may contain two exhaust assemblies and one isolator assembly separated by two showerhead assemblies so that any of the reactor lid assemblies may sequentially contain a first exhaust assembly, a first showerhead assembly, a second exhaust assembly, a second showerhead assembly, and a first isolator assembly. In another example, any of the reactor lid assemblies may sequentially contain a first exhaust assembly, a first showerhead assembly, a first isolator assembly, a second showerhead assembly, and a second exhaust assembly. In another example, any of the reactor lid assemblies may sequentially contain a first isolator assembly, a first showerhead assembly, a first exhaust assembly, a second showerhead assembly, and a second exhaust assembly.

Reactor 100, reactor system 1000, and derivatives of these reactors may be used for a variety of CVD, MOCVD, and/or epitaxial deposition processes to form an assortment of materials on wafers or substrates, as described in embodiments herein. In one embodiment, a Group III/V material—which contains at least one element of Group III (e.g., boron, aluminum, gallium, or indium) and at least one element of Group V (e.g., nitrogen, phosphorous, arsenic, or antimony) may be formed or deposited on a wafer. Examples of deposited materials may contain gallium nitride, indium phosphide, gallium indium phosphide, gallium arsenide, aluminum gallium arsenide, derivatives thereof, alloys thereof, multi-layers thereof, or combinations thereof. In some embodiments herein, the deposited materials may be epitaxial materials. The deposited material or epitaxial material may contain one layer, but usually contains multiple layers. In some examples, the epitaxial material contains a layer having gallium arsenide and another layer having aluminum gallium arsenide. In another example, the epitaxial material contains a gallium arsenide buffer layer, an aluminum gallium arsenide passivation layer, and a gallium arsenide active layer. The gallium arsenide buffer layer may have a thickness within a range from about 100 nm to about 500 nm, such as about 300 nm, the aluminum gallium arsenide passivation layer has a thickness within a range from about 10 nm to about 50 nm, such as about 30 nm, and the gallium arsenide active layer has a thickness within a range from about 500 nm to about 2,000 nm, such as about 1,000 nm. In some examples, the epitaxial material further contains a second aluminum gallium arsenide passivation layer.

In one embodiment, the process gas used in reactor 100 or reactor system 1000 may contain arsine, argon, helium, nitrogen, hydrogen, or mixtures thereof. In one example, the process gas contains an arsenic precursor, such as arsine. In other embodiments, the first precursor may contain an aluminum precursor, a gallium precursor, an indium precursor, or combinations thereof, and the second precursor may contain a nitrogen precursor, a phosphorus precursor, an arsenic precursor, an antimony precursor or combinations thereof.

In one embodiment, the CVD reactor may be configured to supply nitrogen to the reactor to float the substrate along the track of the reactor at the entrance and the exit. A hydrogen/arsine mixture may also be used to float the substrate along the track of the CVD reactor between the exit and entrance. The stages along the track may include an entrance nitrogen isolation zone, a preheat exhaust, a hydrogen/arsine mixture preheat isolation zone, a gallium arsenide deposition zone, a gallium arsenide exhaust, an aluminum gallium arsenide deposition zone, a gallium arsenide N-layer deposition zone, a gallium arsenide P-layer deposition zone, a phosphorous hydrogen arsine isolation zone, a first phosphorous aluminum gallium arsenide deposition zone, a phosphorous aluminum gallium arsenide exhaust, a second phosphorous aluminum gallium arsenide deposition zone, a hydrogen/arsine mixture cool down isolation zone, a cool down exhaust, and an exit nitrogen isolation zone. The temperature of the substrate traveling through the reactor may be increased while passing the entrance isolation zone, or may be maintained while traveling through the zones, or may be decreased while nearing the arsine cool down isolation zone.

In another embodiment, the CVD reactor may be configured to supply nitrogen to the reactor to float the substrate along the track of the reactor at the entrance and the exit. A hydrogen/arsine mixture may also be used to float the substrate along the track of the CVD reactor between the exit and entrance. The stages along the track may include an entrance nitrogen isolation zone, a preheat exhaust, a hydrogen/arsine mixture preheat isolation zone, an exhaust, a deposition zone, an exhaust, a hydrogen/arsine mixture cool down isolation zone, a cool down exhaust, and an exit nitrogen isolation zone. The temperature of the substrate traveling through the reactor system may be increased as is passes the entrance isolation zone, may be maintained as it travels through the deposition zone, and may be decreased as it nears the arsine cool down isolation zone.

In another embodiment, the CVD reactor may be configured to supply nitrogen to the reactor to float the substrate along the track of the reactor at the entrance and the exit. A hydrogen/arsine mixture may also be used to float the substrate along the track of the CVD reactor between the exit and entrance. The stages along the track may include an entrance nitrogen isolation zone, a preheat exhaust with flow balance restrictor, an active hydrogen/arsine mixture isolation zone, a gallium arsenide deposition zone, an aluminum gallium arsenide deposition zone, a gallium arsenide N-layer deposition zone, a gallium arsenide P-layer deposition zone, a phosphorous aluminum gallium arsenide deposition zone, a cool down exhaust, and an exit nitrogen isolation zone. The temperature of the substrate traveling through the reactor may increase while passing the entrance isolation zone, or may be maintained while traveling through the deposition zones, or may be decreased while nearing the cool down exhaust.

In another embodiment, the CVD reactor may be configured to supply nitrogen to the reactor to float the substrate along the track of the reactor at the entrance and the exit. A hydrogen/arsine mixture may also be used to float the substrate along the track of the CVD reactor between the exit and entrance. The stages along the track may include an entrance nitrogen isolation zone, a preheat exhaust with flow balance restrictor, a gallium arsenide deposition zone, an aluminum gallium arsenide deposition zone, a gallium arsenide N-layer deposition zone, a gallium arsenide P-layer deposition zone, a phosphorous aluminum gallium arsenide deposition zone, a cool down exhaust with flow balance restrictor, and an exit nitrogen isolation zone. The temperature of the substrate traveling through the reactor may be increased while passing the entrance isolation zone, or may be maintained while traveling through the deposition zones, or may be decreased while nearing the cool down exhaust.

FIG. 17 illustrates a seventh configuration 800. The CVD reactor may be configured to supply nitrogen to the reactor to float the substrate along the track of the reactor at the entrance and the exit. A hydrogen/arsine mixture may also be used to float the substrate along the track of the CVD reactor between the exit and entrance. The stages along the track may include an entrance nitrogen isolation zone, a preheat exhaust, a deposition zone, a cool down exhaust, and an exit nitrogen isolation zone. The temperature of the substrate traveling through the reactor may be increased while passing the entrance isolation zone, or may be maintained while traveling through the deposition zone, or may be decreased while nearing the cool down exhaust.

In one embodiment, the CVD reactor may be configured to epitaxially grow a double hetero-structure containing gallium arsenide materials and aluminum gallium arsenide materials, as well as to epitaxially grow a lateral overgrowth sacrificial layer containing aluminum arsenide materials. In some examples, the gallium arsenide, aluminum gallium arsenide, and aluminum arsenide materials may be deposited at a rate of about 1 μm/min. In some embodiments, the CVD reactor may have a throughput of about 6 wafers per minute to about 10 wafers per minute.

In an embodiment, the CVD reactor may be configured to provide a deposition rate of one 10 cm by 10 cm substrate per minute. In one embodiment the CVD reactor may be configured to provide a 300 nm gallium arsenide buffer layer. In one embodiment the CVD reactor may be configured to provide a 30 nm aluminum gallium arsenide passivation layer. In one embodiment the CVD reactor may be configured to provide a 1,000 nm gallium arsenide active layer. In one embodiment the CVD reactor may be configured to provide a 30 nm aluminum gallium arsenide passivation layer. In one embodiment the CVD reactor may be configured to provide a dislocation density of less than $1 \times 10^4$ per centimeter squared, a photoluminescence efficiency of 99%; and a photoluminescence lifetime of 250 nanoseconds.

In one embodiment the CVD reactor may be configured to provide an epitaxial lateral overgrowth layer having a 5 nm deposition +−0.5 nm; a etch selectivity greater than $1 \times 10^6$; zero pinholes; and an aluminum arsenide etch rate greater than 0.2 mm per hour.

In one embodiment the CVD reactor may be configured to provide a center to edge temperature non-uniformity of no greater than 10° C. for temperatures above 300° C.; a V-III ratio of no more than 5; and a maximum temperature of 700° C.

In one embodiment the CVD reactor may be configured to provide a deposition layers having a 300 nm gallium arsenide buffer layer; a 5 nm aluminum arsenide sacrificial layer; a 10 nm aluminum gallium arsenide window layer; a 700 nm gallium arsenide $1 \times 10^{17}$ Si active layer; a 300 nm aluminum gallium arsenide $1 \times 10^{19}$ C P+ layer; and a 300 nm gallium arsenide $1 \times 10^{19}$ C P+ layer.

In one embodiment the CVD reactor may be configured to provide a deposition layers having a 300 nm gallium arsenide buffer layer; a 5 nm aluminum arsenide sacrificial layer; a 10 nm gallium indium phosphide window layer; a 700 nm gallium arsenide $1 \times 10^{17}$ Si active layer; a 100 nm gallium arsenide C P layer; a 300 nm gallium indium phosphide P window layer; a 20 nm gallium indium phosphide $1 \times 10^{20}$ P+ tunnel junction layer; a 20 nm gallium indium phosphide $1 \times 10^{20}$ N+ tunnel junction layer; a 30 nm aluminum gallium arsenide window; a 400 nm gallium indium phosphide N active layer; a 100 nm gallium indium phosphide P active layer; a 30 nm aluminum gallium arsenide P window; and a 300 nm gallium arsenide P+ contact layer.

While the foregoing is directed to embodiments of the invention, other and further embodiments of the invention may be devised without departing from the basic scope thereof, and the scope thereof is determined by the claims that follow.

The invention claimed is:

1. A method for processing a wafer within a vapor deposition reactor, comprising:

heating at least one wafer disposed on a wafer carrier by exposing a lower surface of a wafer carrier track to radiation emitted from a lamp assembly, wherein the wafer carrier is disposed on the wafer carrier track within a vapor deposition reactor;

flowing at least one liquid from at least one heat exchanger to a liquid supply through passageways extending throughout a reactor lid assembly and a reactor body assembly of the vapor deposition reactor and to at least one liquid return to maintain the reactor lid assembly at a first temperature and the reactor body assembly at a second temperature, wherein the liquids and the passageways are in fluid communication with a temperature regulation system, the temperature regulation system including the at least one heat exchanger, the at least one liquid supply and the at least one liquid return all in fluid communication;

traversing the wafer carrier along the wafer carrier track through a first chamber comprising a first showerhead assembly and an isolator assembly;

exposing the wafer to a first mixture of gaseous precursors flowing from the first showerhead while depositing a first material;

exposing the wafer to a process gas flowing from the isolator assembly;

traversing the wafer carrier along the wafer carrier track through a second chamber comprising a second showerhead assembly and an exhaust assembly;

exposing the wafer to a second mixture of gaseous precursors flowing from the second showerhead while depositing a second material; and removing gases from the vapor deposition reactor through the exhaust assembly.

2. The method of claim 1, wherein each of the first temperature and the second temperature is independently within a range from about 275° C. to about 325° C.

3. The method of claim 2, wherein each of the first temperature and the second temperature is independently within a range from about 290° C. to about 310° C.

4. The method of claim 3, wherein each of the first temperature and the second temperature is independently about 300° C.

5. The method of claim 1, wherein a reflector is disposed below the lamp assembly.

6. The method of claim 5, wherein the lower surface of the wafer carrier track is exposed to radiation emitted from the lamp assembly and reflected from the reflector.

7. The method of claim 5, wherein the reflector comprises gold or a gold alloy.

8. The method of claim 1, further comprising levitating the wafer carrier from the wafer carrier track and traversing the wafer carrier along the wafer carrier track.

9. The method of claim 8, further comprising levitating the wafer carrier by exposing a lower surface of the wafer carrier to a levitating gas flowing from a plurality of holes disposed on an upper surface of the wafer carrier track.

10. The method of claim 1, wherein the process gas comprises a gas selected from the group consisting of arsine, argon, helium, nitrogen, hydrogen, and mixtures thereof.

11. The method of claim 10, wherein the process gas comprises arsine.

12. The method of claim 1, wherein the first precursor comprises an aluminum precursor, a gallium precursor, an indium precursor, or mixtures thereof.

13. The method of claim 12, wherein the second precursor comprises a nitrogen precursor, a phosphorus precursor, an arsenic precursor, an antimony precursor, or mixtures thereof.

14. A method for processing a wafer within a vapor deposition reactor, comprising:

heating at least one wafer disposed on a wafer carrier by exposing a lower surface of a wafer carrier track to radiation emitted from a lamp assembly, wherein the wafer carrier is disposed on the wafer carrier track within a vapor deposition reactor;

flowing a liquid from a heat exchanger to a liquid supply through a passageway extending throughout a reactor lid assembly or a reactor body assembly of the vapor deposition reactor and to at least one liquid return to maintain the reactor lid assembly or the reactor body assembly at a predetermined temperature, wherein the liquid and the passageway are in fluid communication with a temperature regulation system, the temperature regulation system including the heat exchanger, the liquid supply and the liquid return all in fluid communication;

traversing the wafer carrier along the wafer carrier track through at least two chambers, wherein a first chamber comprises a first showerhead assembly and an isolator assembly and a second chamber comprises a second showerhead assembly and an exhaust assembly; and removing gases from the vapor deposition reactor through the exhaust assembly.

15. The method of claim 14, wherein the predetermined temperature of the reactor lid assembly is within a range from about 275° C. to about 325° C.

16. The method of claim 15, wherein the predetermined temperature of the reactor lid assembly is within a range from about 290° C. to about 310° C.

17. The method of claim 16, wherein the predetermined temperature of the reactor lid assembly is about 300° C.

18. The method of claim 14, wherein the predetermined temperature of the reactor body assembly is within a range from about 275° C. to about 325° C.

19. The method of claim 18, wherein the predetermined temperature of the reactor body assembly is within a range from about 290° C. to about 310° C.

20. The method of claim 19, wherein the predetermined temperature of the reactor body assembly is about 300° C.

* * * * *